(12) United States Patent
Takahashi

(10) Patent No.: US 9,893,101 B2
(45) Date of Patent: Feb. 13, 2018

(54) SOLID-STATE IMAGE PICKUP UNIT, METHOD OF MANUFACTURING SOLID-STATE IMAGE PICKUP UNIT, AND ELECTRONIC APPARATUS

(71) Applicant: Sony Corporation, Tokyo (JP)

(72) Inventor: Hirotsugu Takahashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 14 days.

(21) Appl. No.: 14/368,736

(22) PCT Filed: Jan. 15, 2013

(86) PCT No.: PCT/JP2013/050553
§ 371 (c)(1),
(2) Date: Jun. 25, 2014

(87) PCT Pub. No.: WO2013/111637
PCT Pub. Date: Aug. 1, 2013

(65) Prior Publication Data
US 2014/0327799 A1    Nov. 6, 2014

(30) Foreign Application Priority Data

Jan. 23, 2012  (JP) .................................. 2012-011404

(51) Int. Cl.
| H04N 5/335 | (2011.01) |
| H04N 3/14 | (2006.01) |
| H01L 27/146 | (2006.01) |
| H01L 31/109 | (2006.01) |

(52) U.S. Cl.
CPC ...... H01L 27/146 (2013.01); H01L 27/14601 (2013.01); H01L 27/14665 (2013.01); H01L 27/14689 (2013.01); H01L 27/14692 (2013.01); H01L 31/109 (2013.01)

(58) Field of Classification Search
CPC ............. H01L 27/146; H01L 27/14665; H01L 27/14692; H01L 27/14689; H01L 31/109; H01L 27/14601
See application file for complete search history.

(56) References Cited

U.S. PATENT DOCUMENTS

| 2011/0227091 A1* | 9/2011 | Toda ................... H01L 27/1463 257/76 |
| 2012/0188397 A1* | 7/2012 | Ohta ................. H01L 27/14641 348/222.1 |

FOREIGN PATENT DOCUMENTS

| JP | 07-245385 | 9/1995 |
| JP | 2004-015000 A | 1/2004 |
| JP | 2004-172377 A | 6/2004 |
| JP | 2007-123721 | 5/2007 |
| JP | 2012-004443 A | 1/2012 |
| WO | WO-2008/093834 A1 | 8/2008 |
| WO | WO-2009/078299 A1 | 6/2009 |

* cited by examiner

*Primary Examiner* — Twyler Haskins
*Assistant Examiner* — Carramah J Quiett
(74) *Attorney, Agent, or Firm* — Chip Law Group

(57) ABSTRACT

A solid-state image pickup unit includes: a p-type compound semiconductor layer of a chalcopyrite structure; an electrode formed on the p-type compound semiconductor layer; and an n-type layer formed separately for each pixel, on a surface opposite to a light incident side of the p-type compound semiconductor layer.

11 Claims, 29 Drawing Sheets

[ FIG. 1 ]
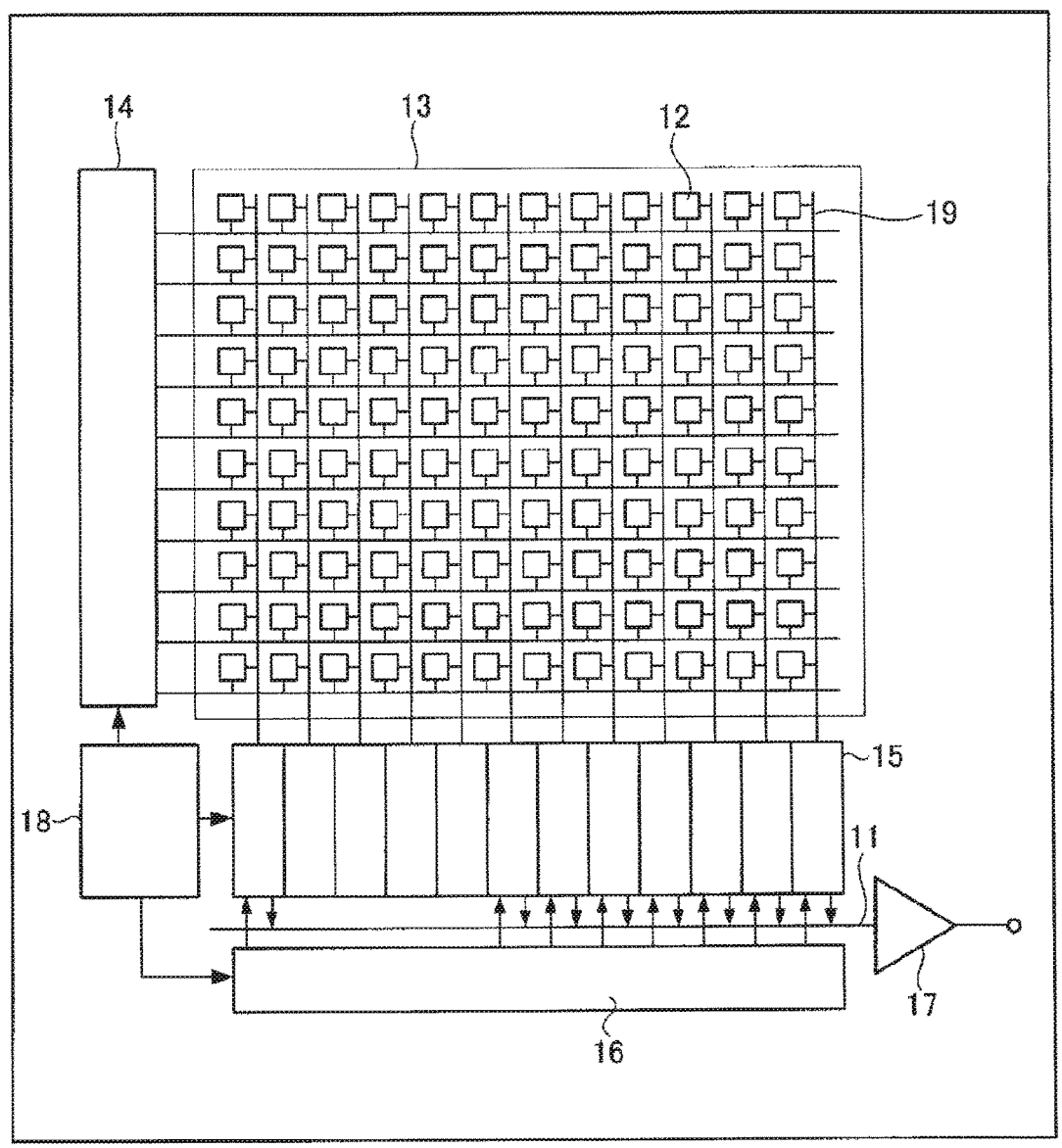

[FIG.2]
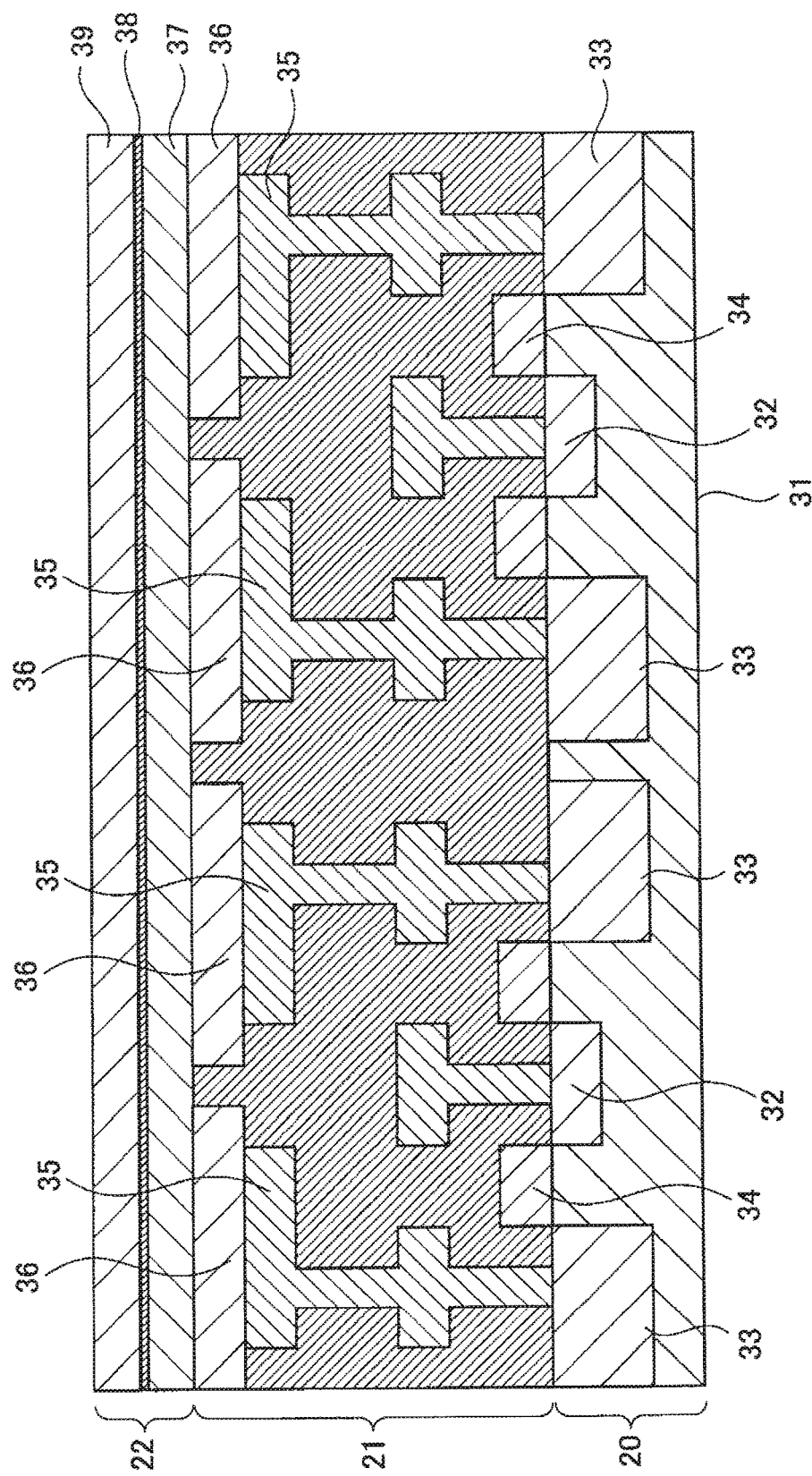

[ FIG. 3 ]
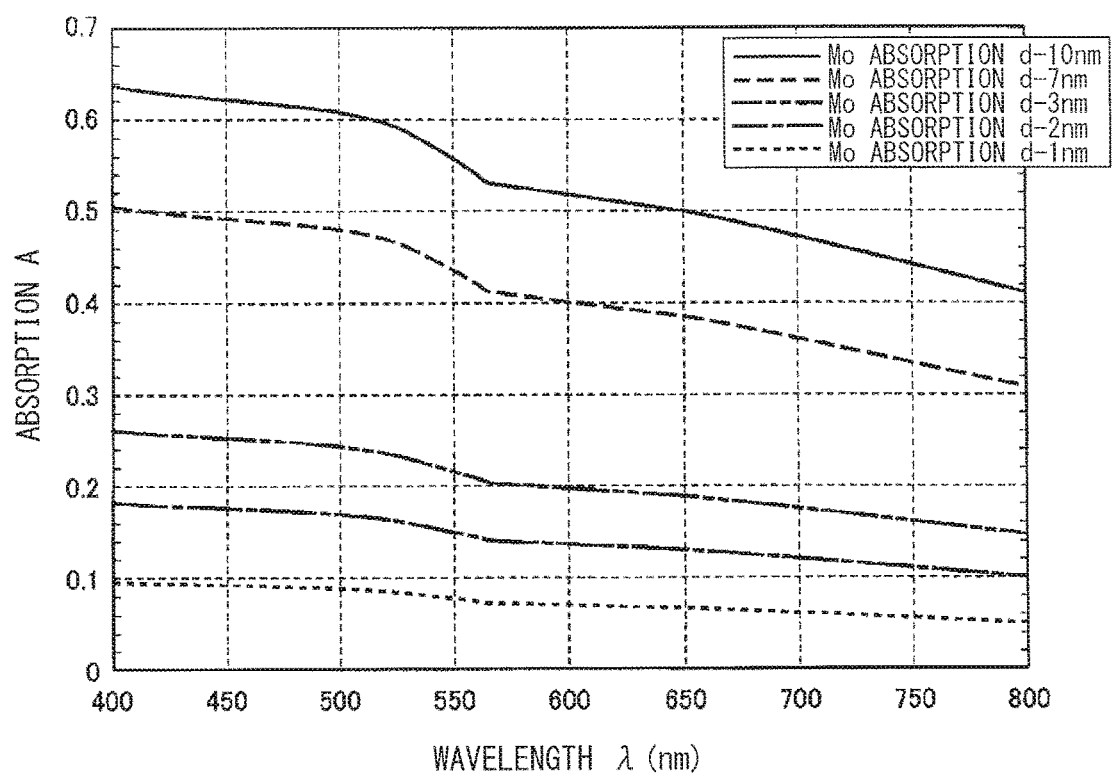

[ FIG. 4A ]
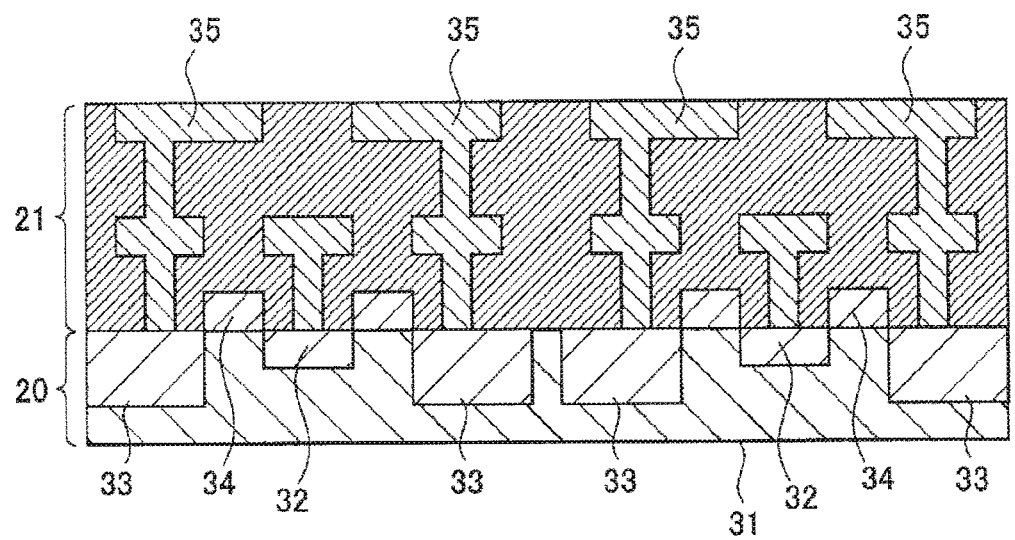
[ FIG. 4B ]
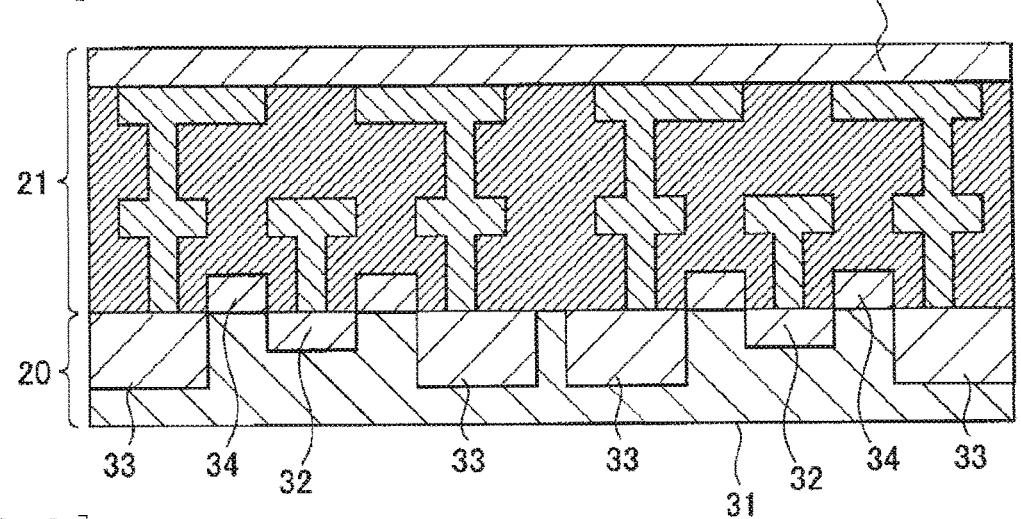
[ FIG. 4C ]
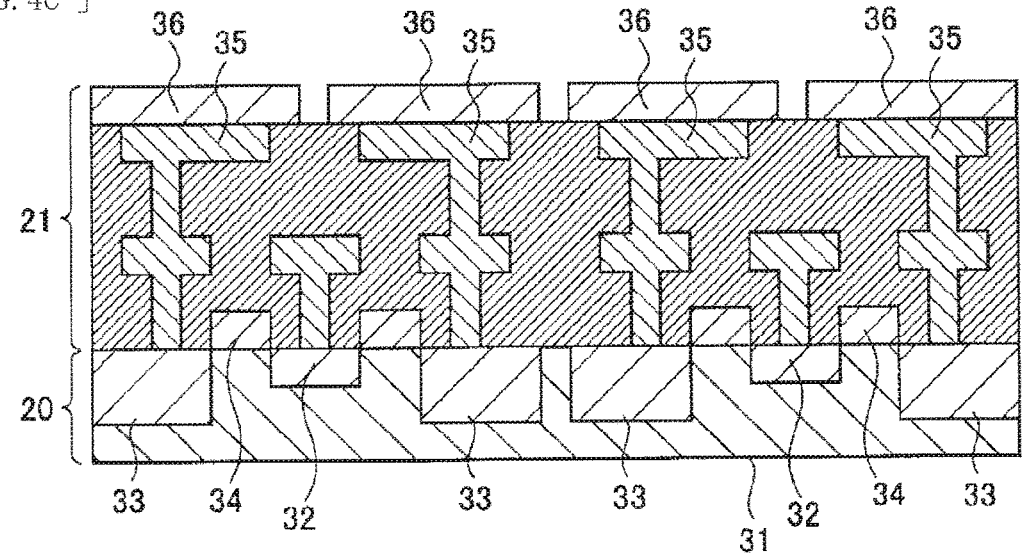

[ FIG. 4D ]
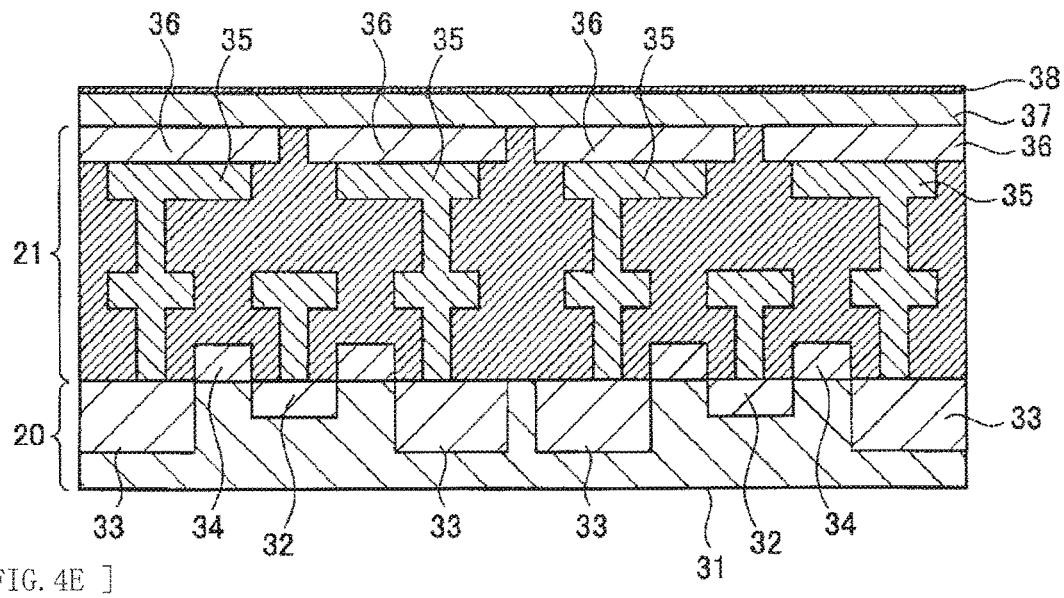
[ FIG. 4E ]
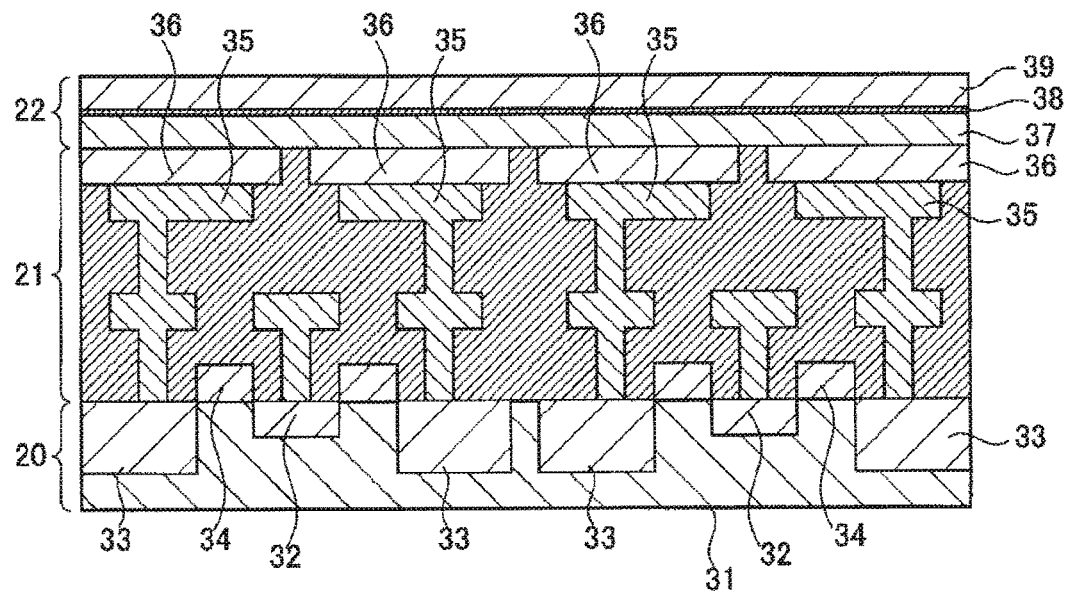

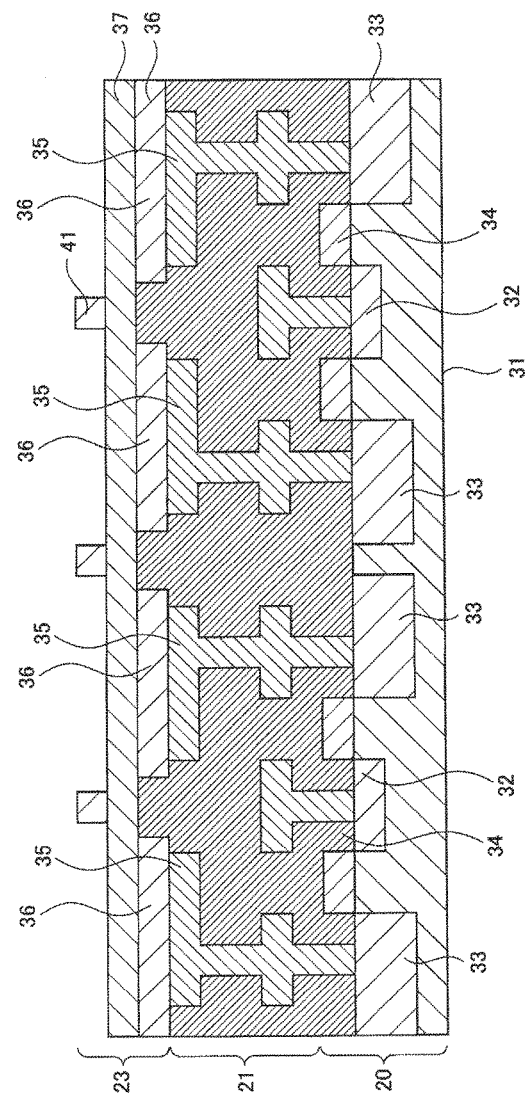
[FIG.5]

[ FIG. 6 ]
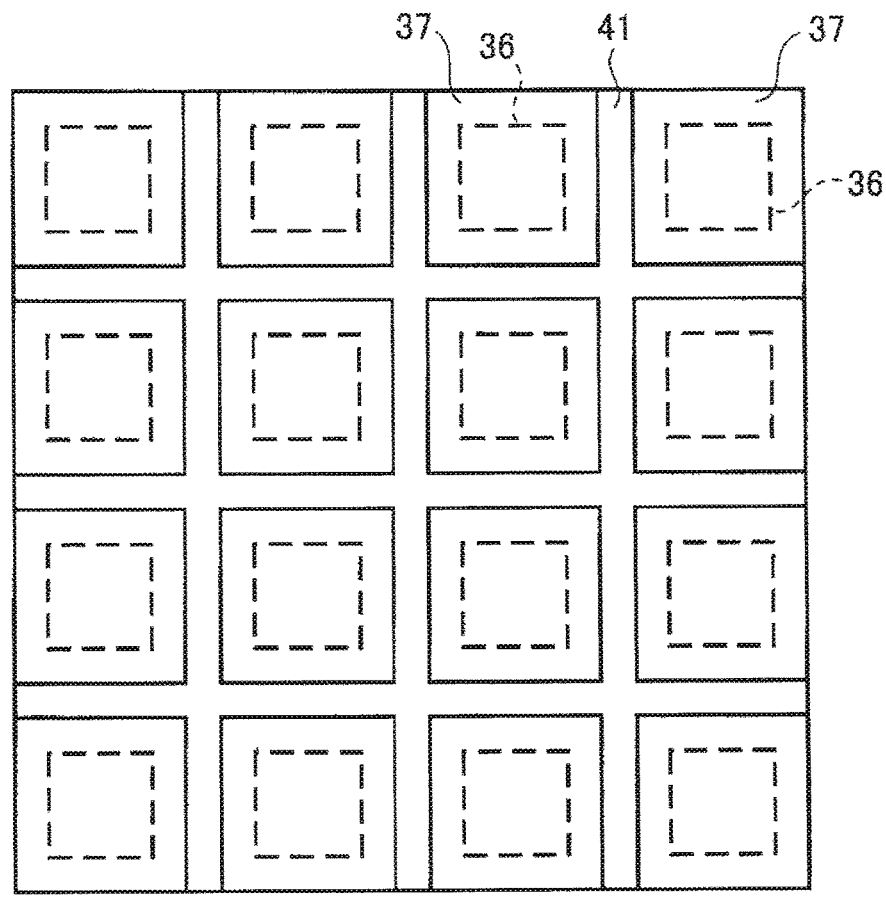
[ FIG. 7 ]
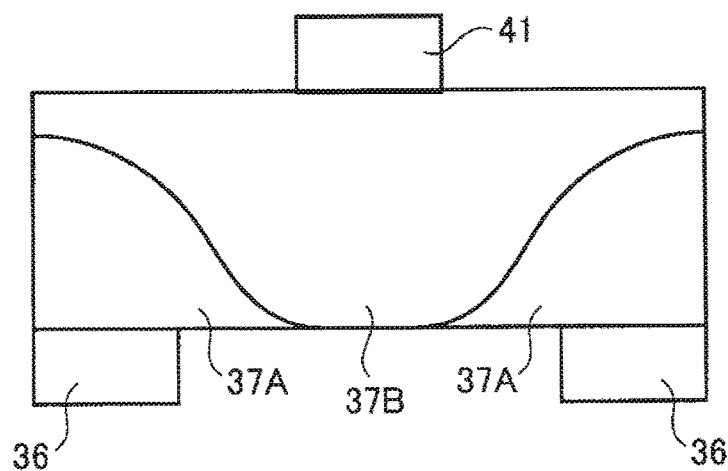

[ FIG. 8A ]
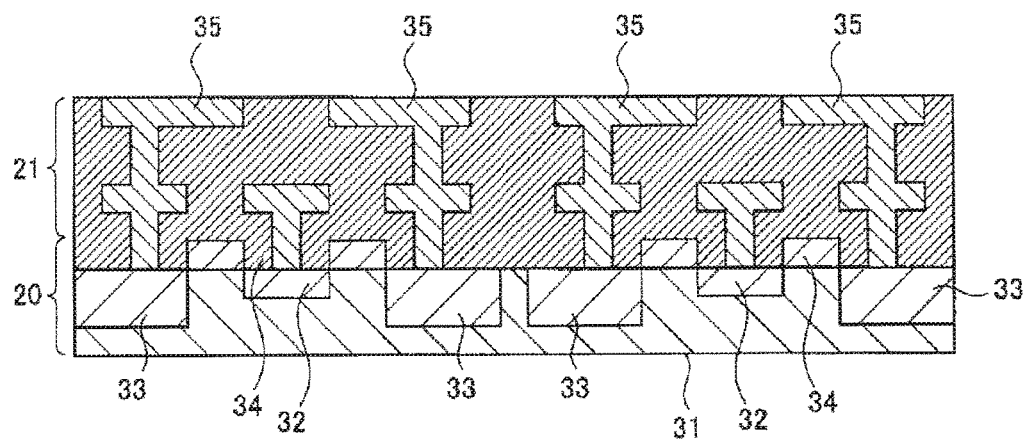
[ FIG. 8B ]
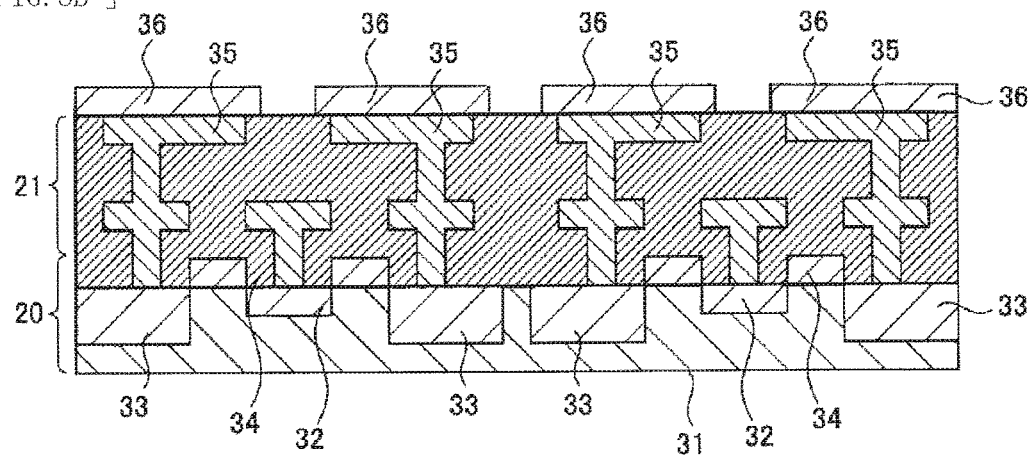
[ FIG. 8C ]
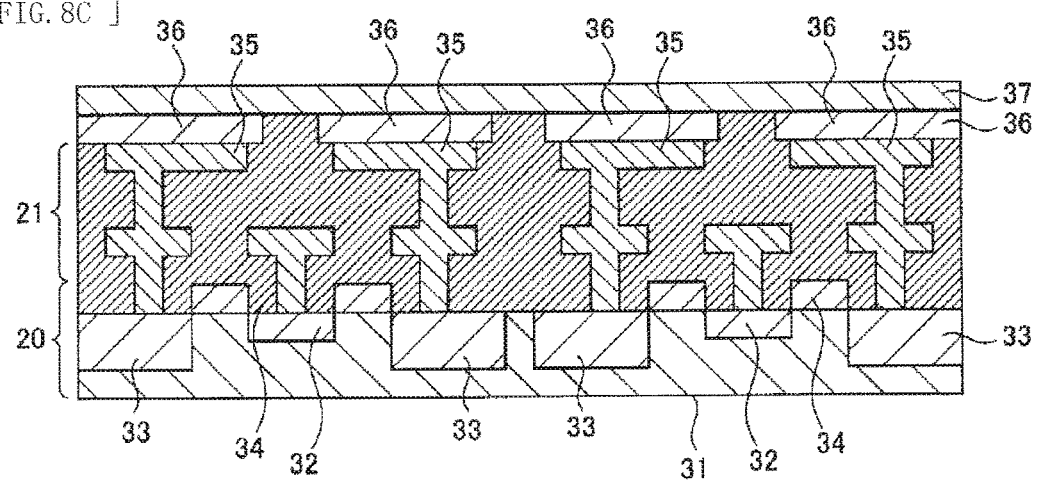

[ FIG. 8D ]
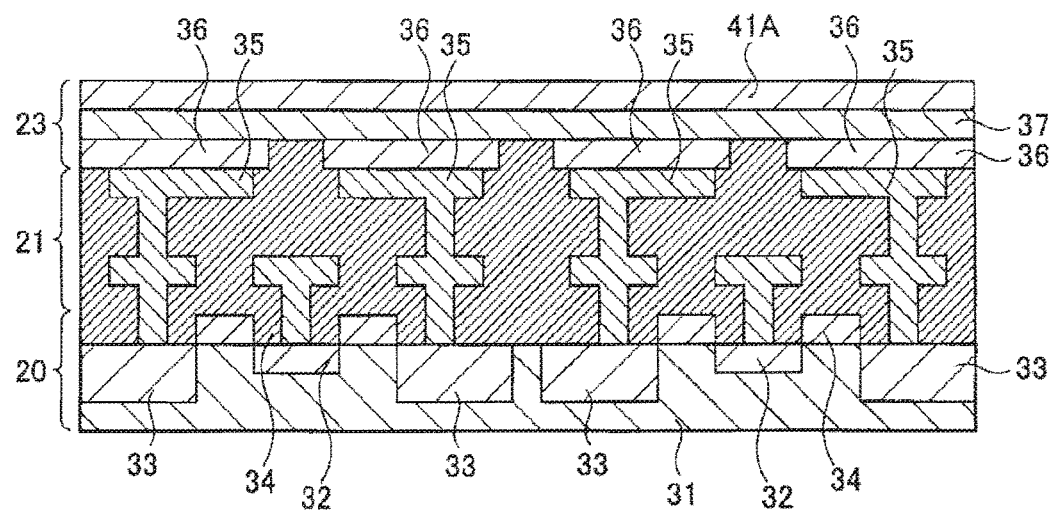
[ FIG. 8E ]
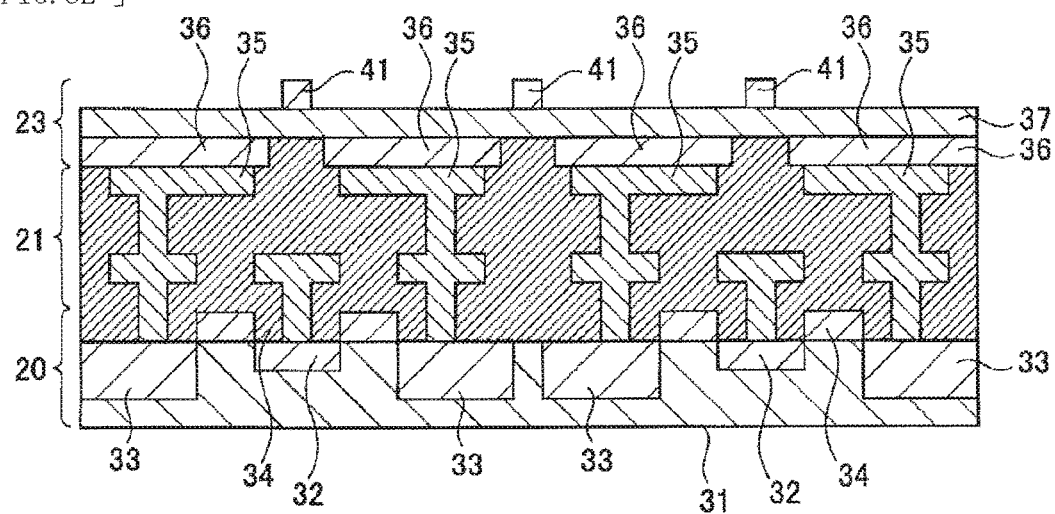

[FIG.9]
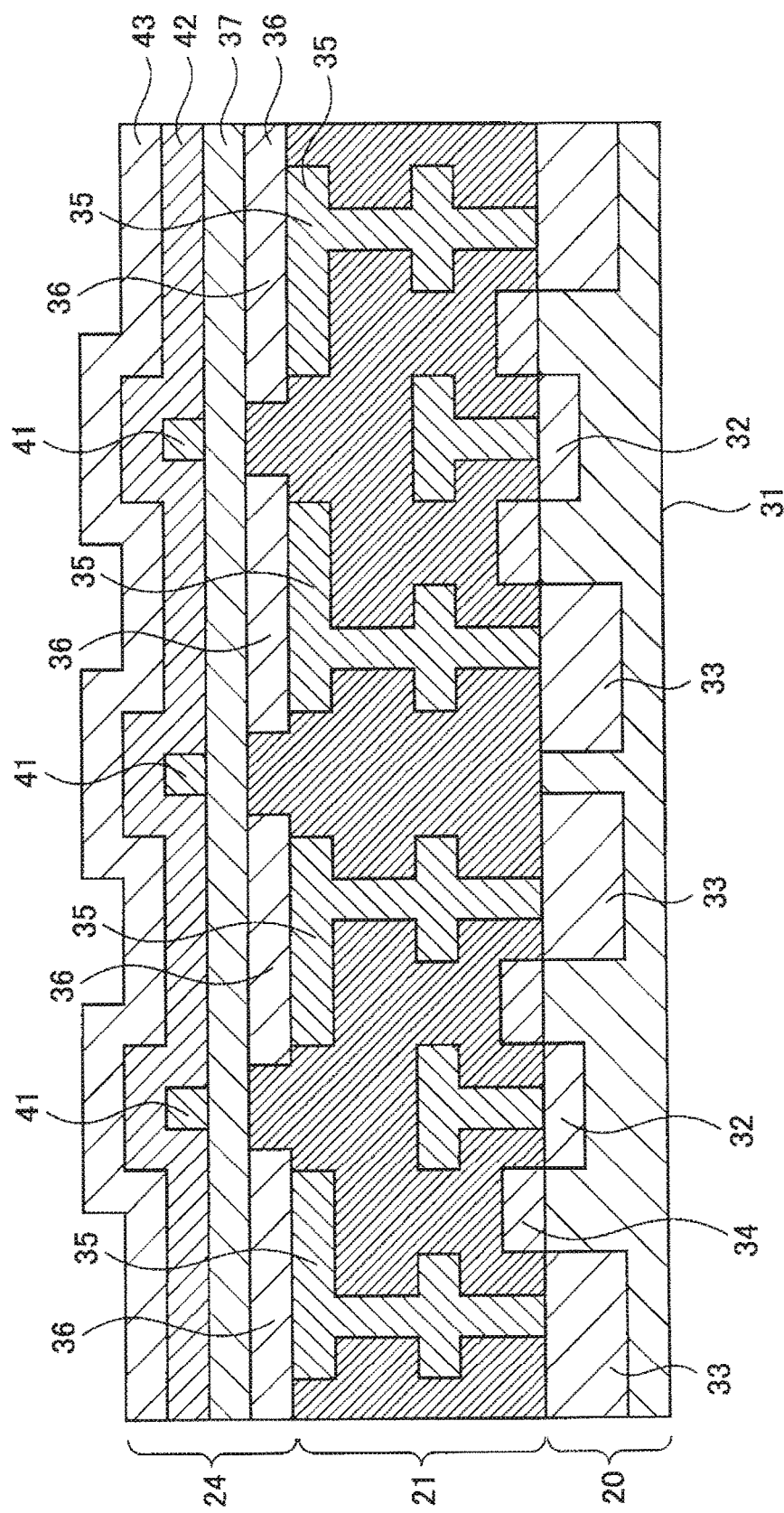

[ FIG. 10 ]
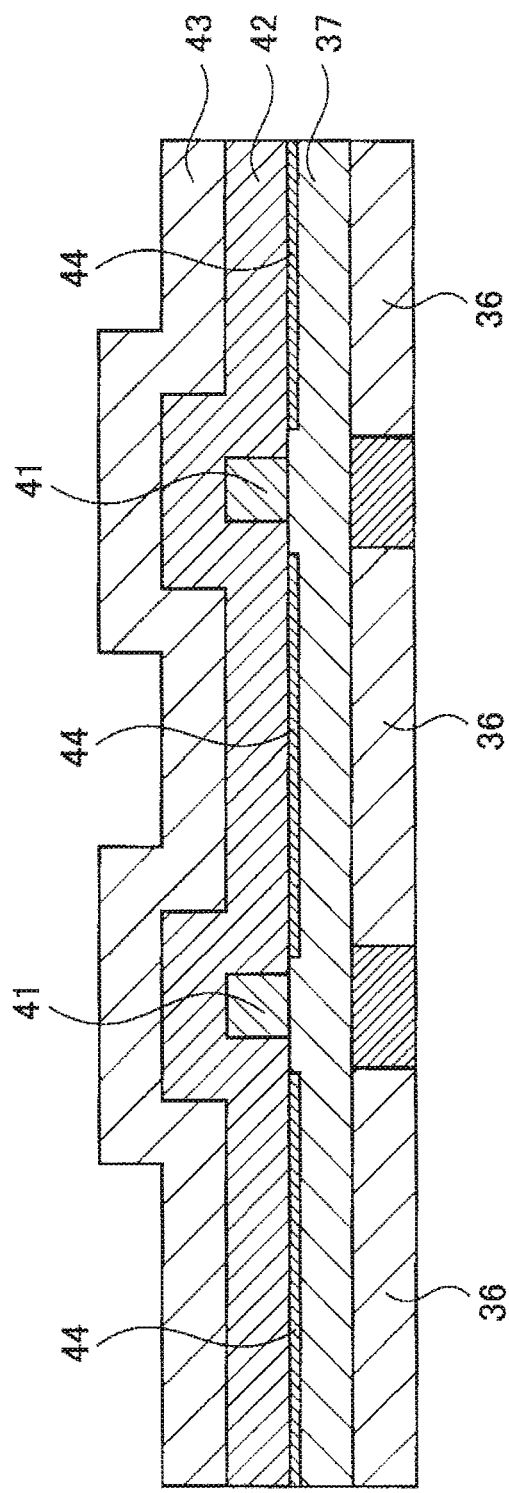

[ FIG. 11A ]
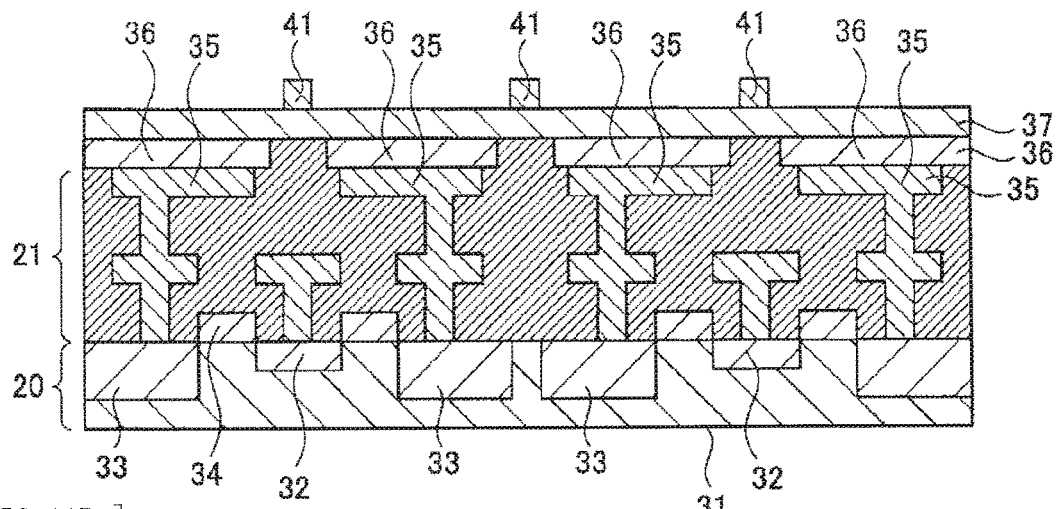
[ FIG. 11B ]
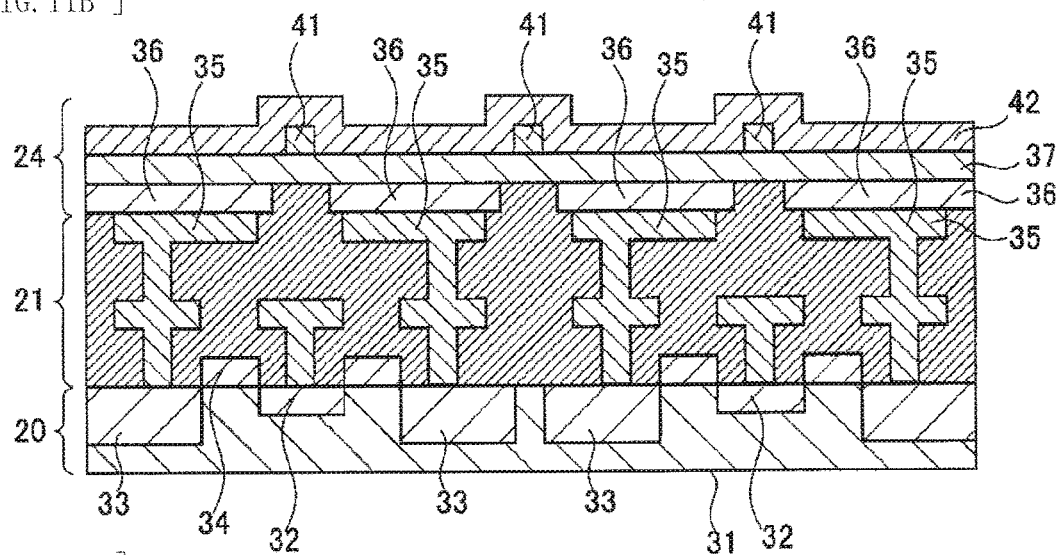
[ FIG. 11C ]
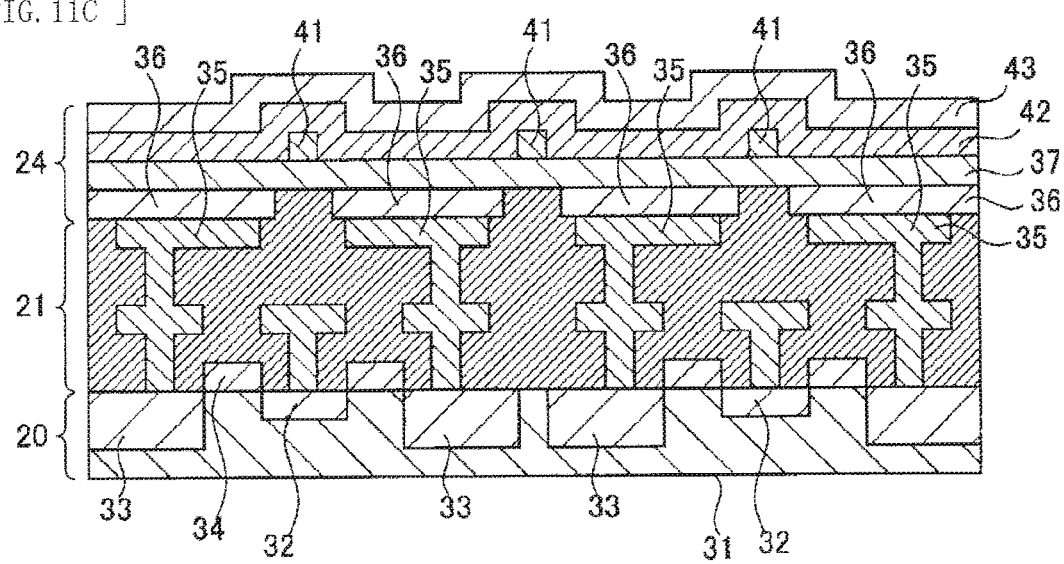

[ FIG. 12 ]
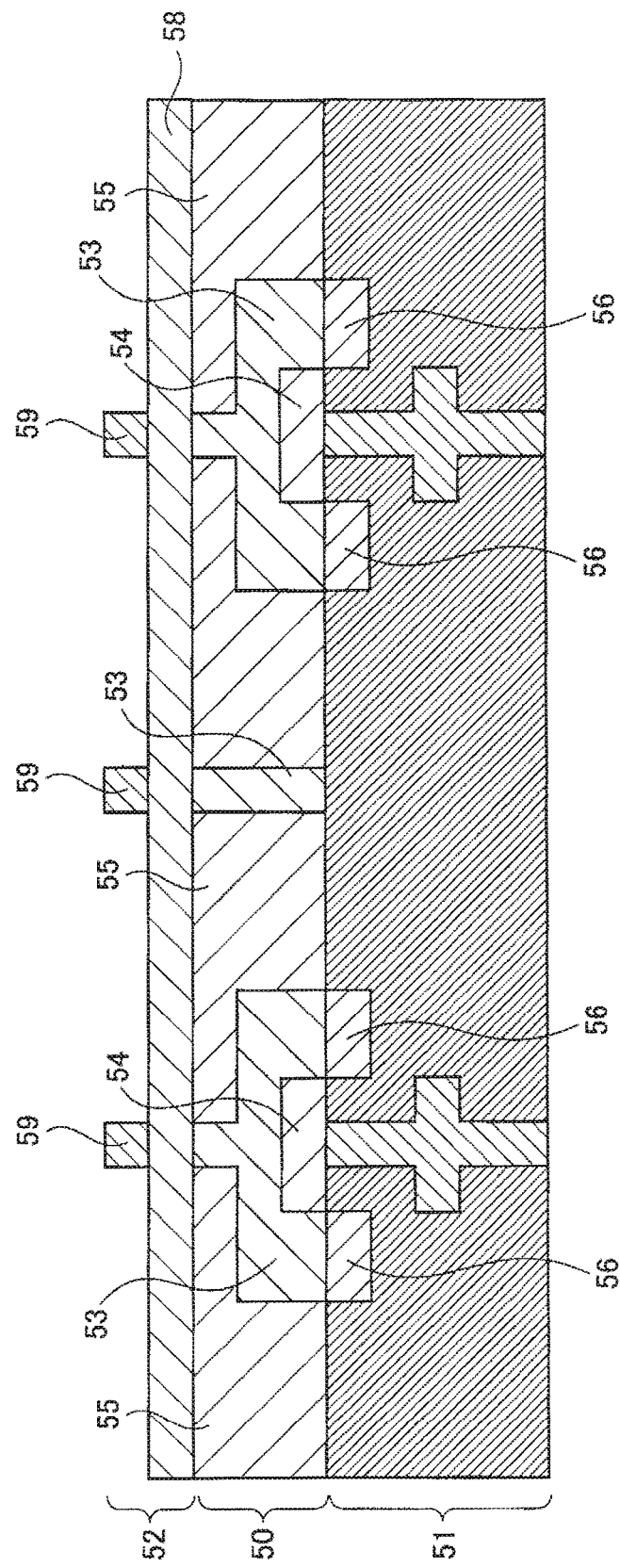

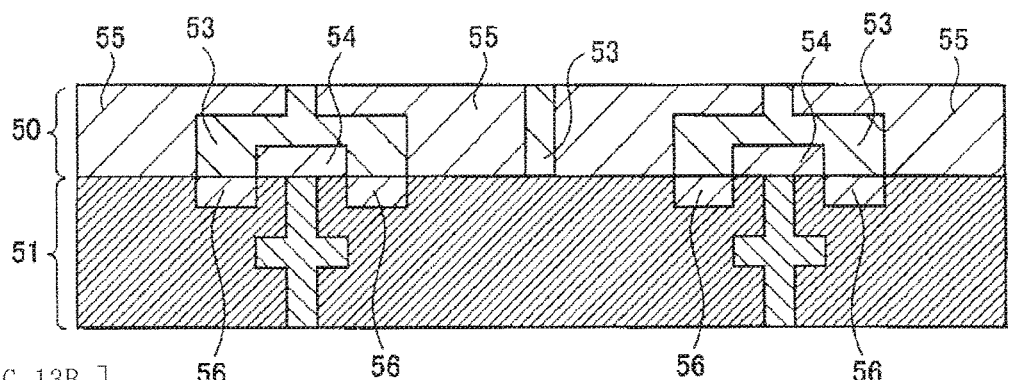
[ FIG. 13A ]
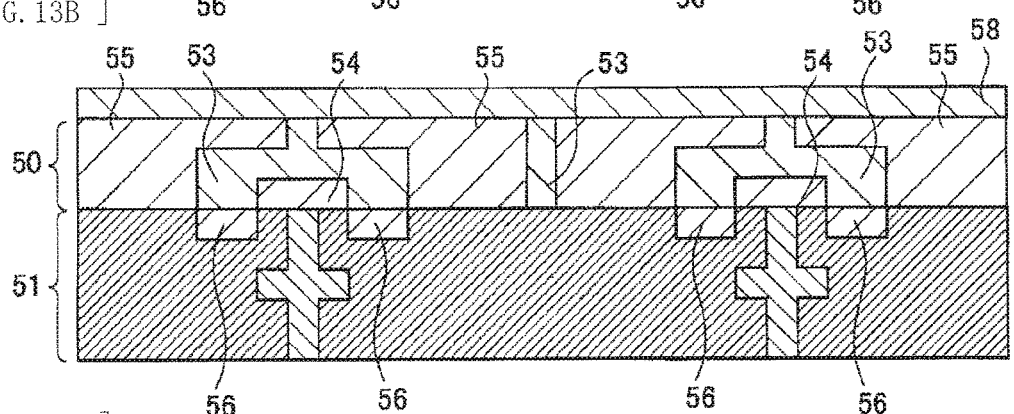
[ FIG. 13B ]
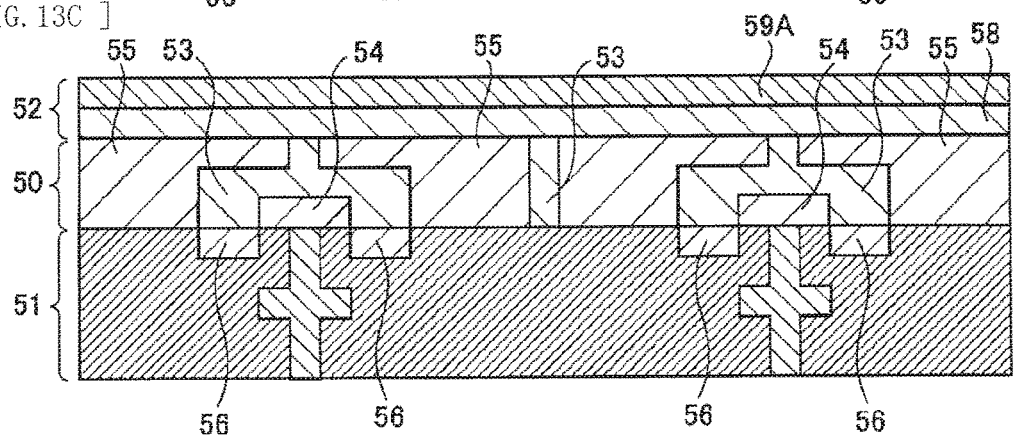
[ FIG. 13C ]
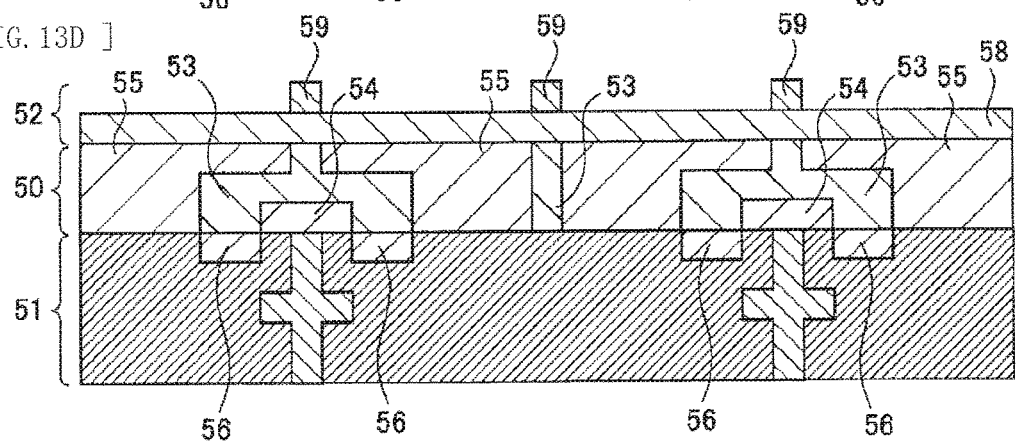
[ FIG. 13D ]

[ FIG. 14 ]
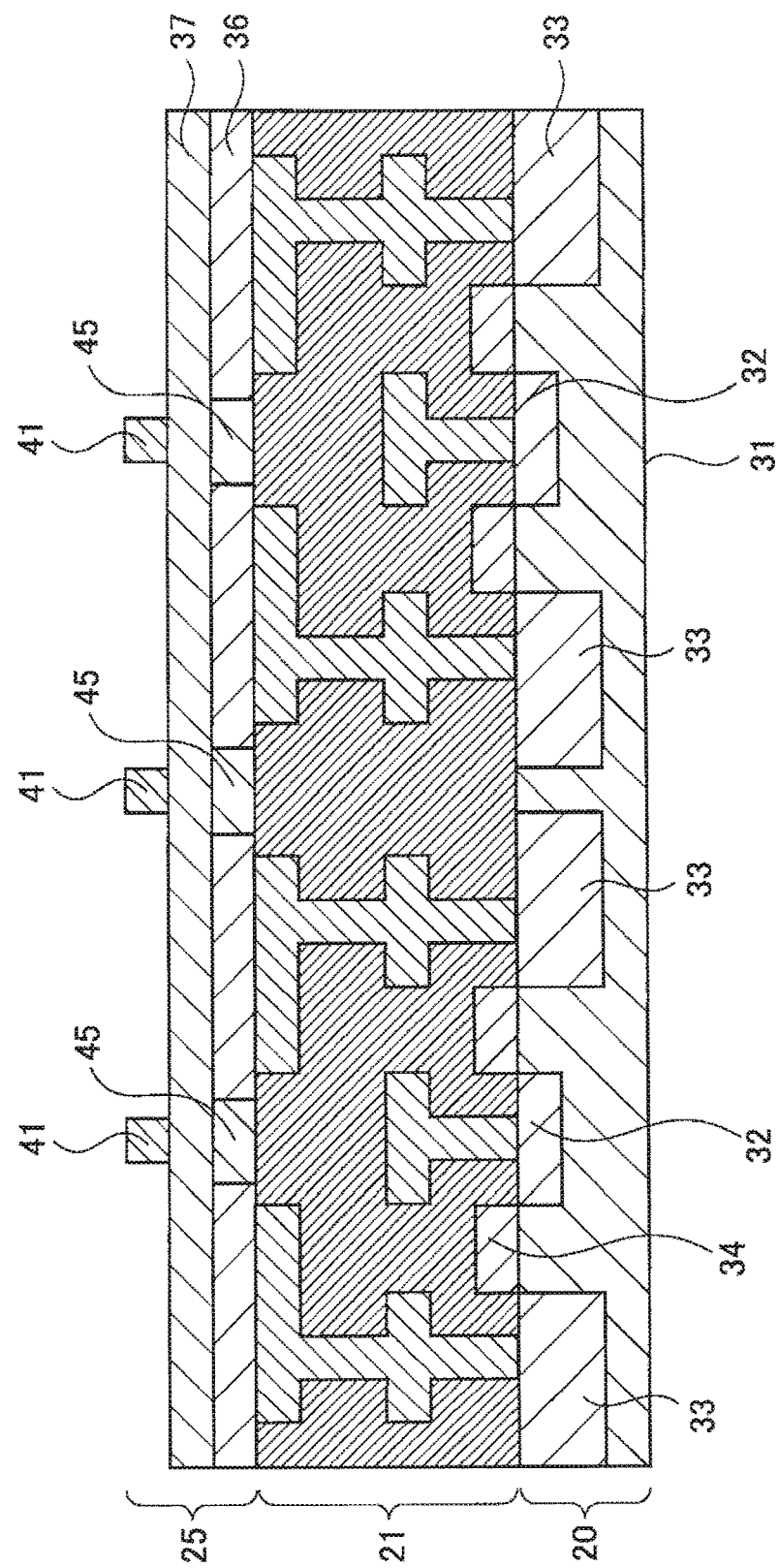

[ FIG. 15A ]
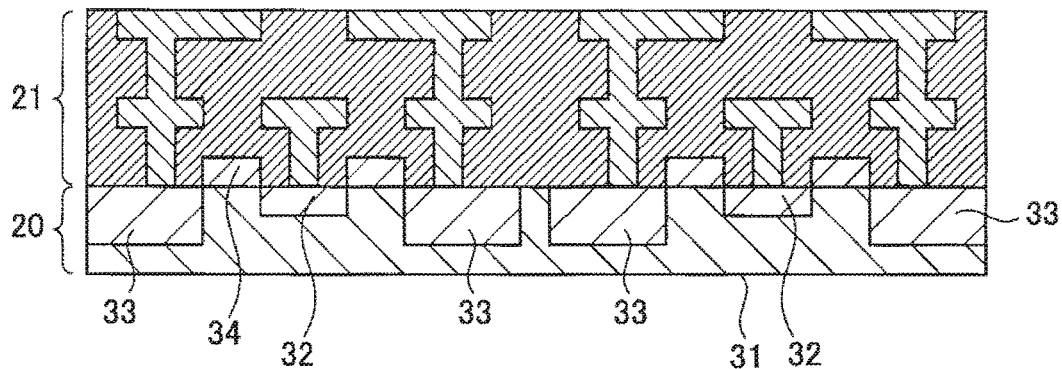
[ FIG. 15B ]
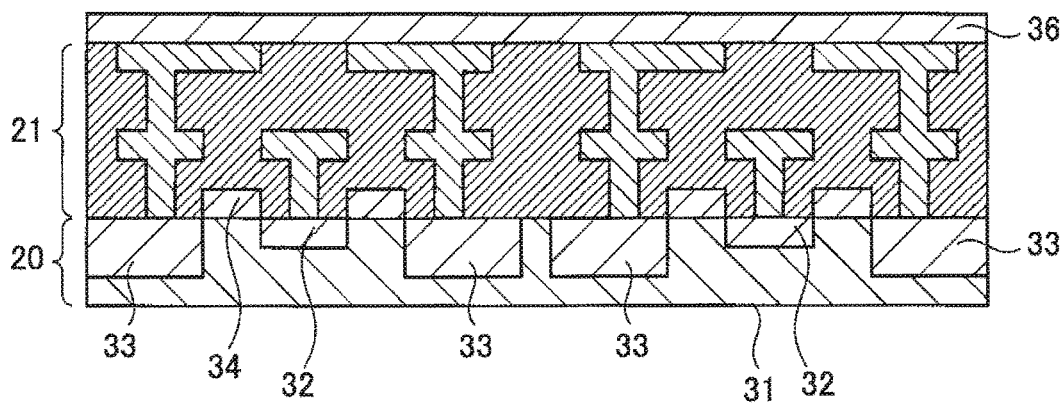
[ FIG. 15C ]
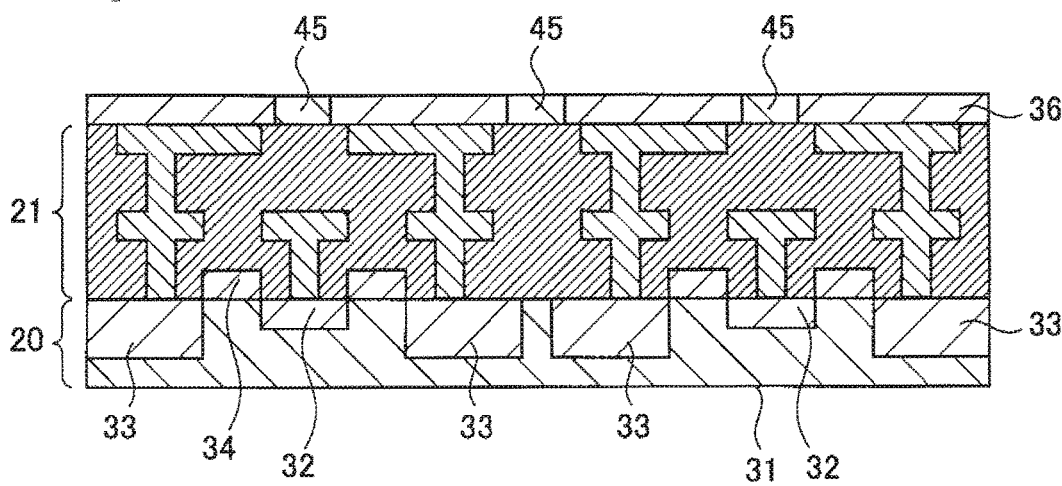

[FIG. 15D]
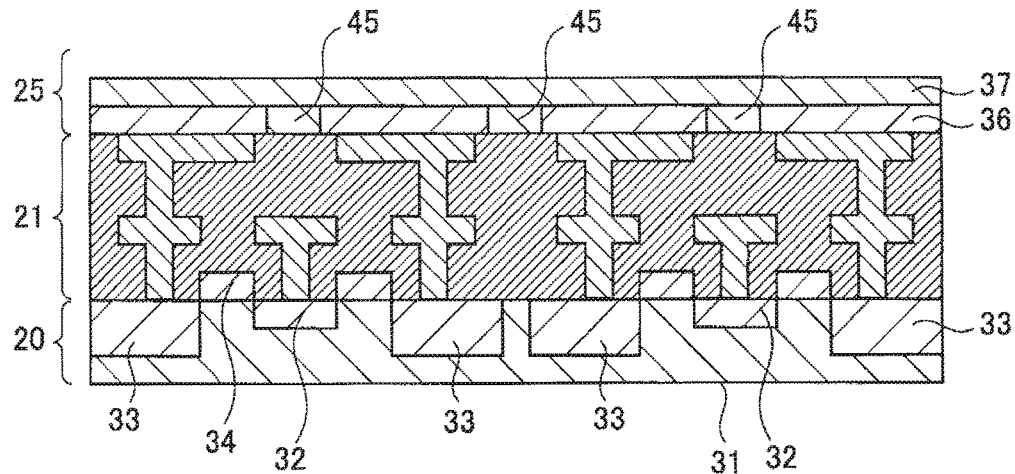
[FIG. 15E]
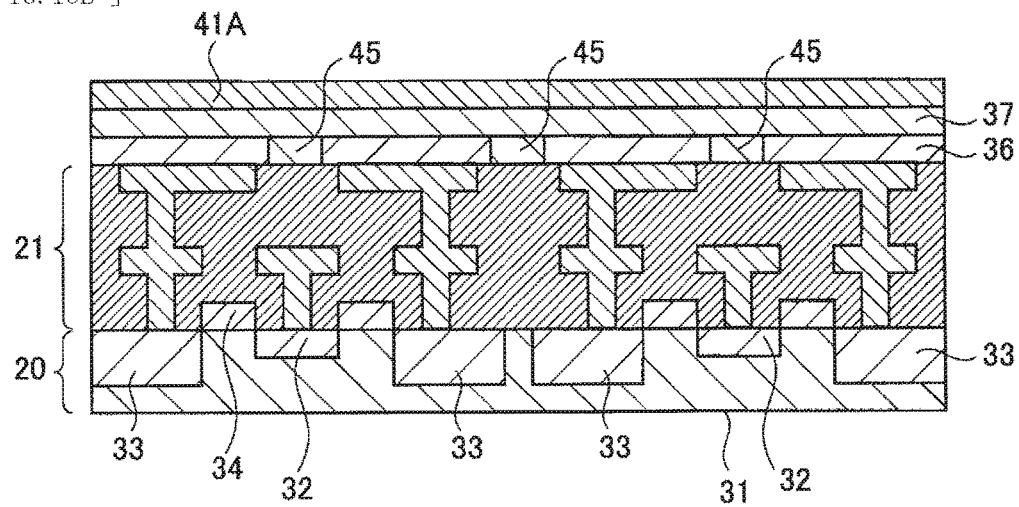
[FIG. 15F]
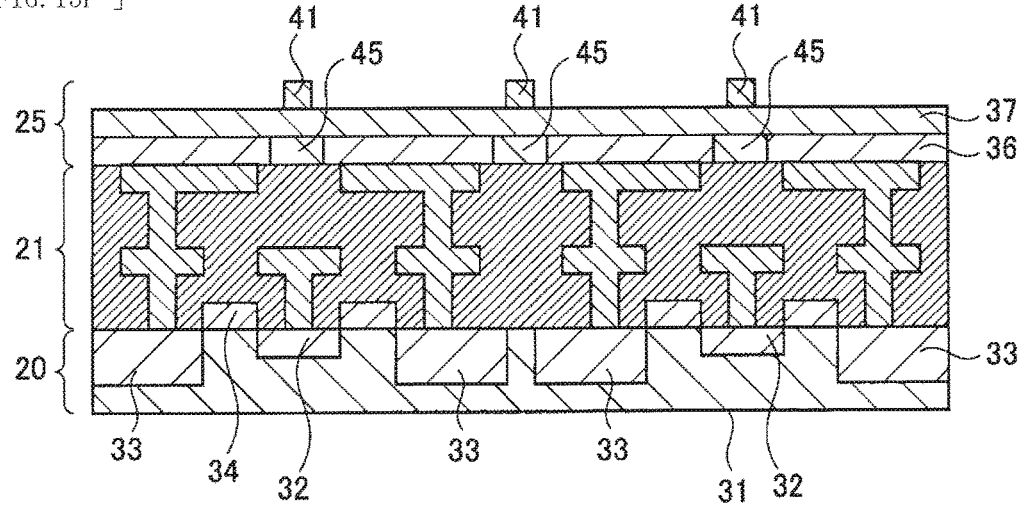

[FIG. 16]
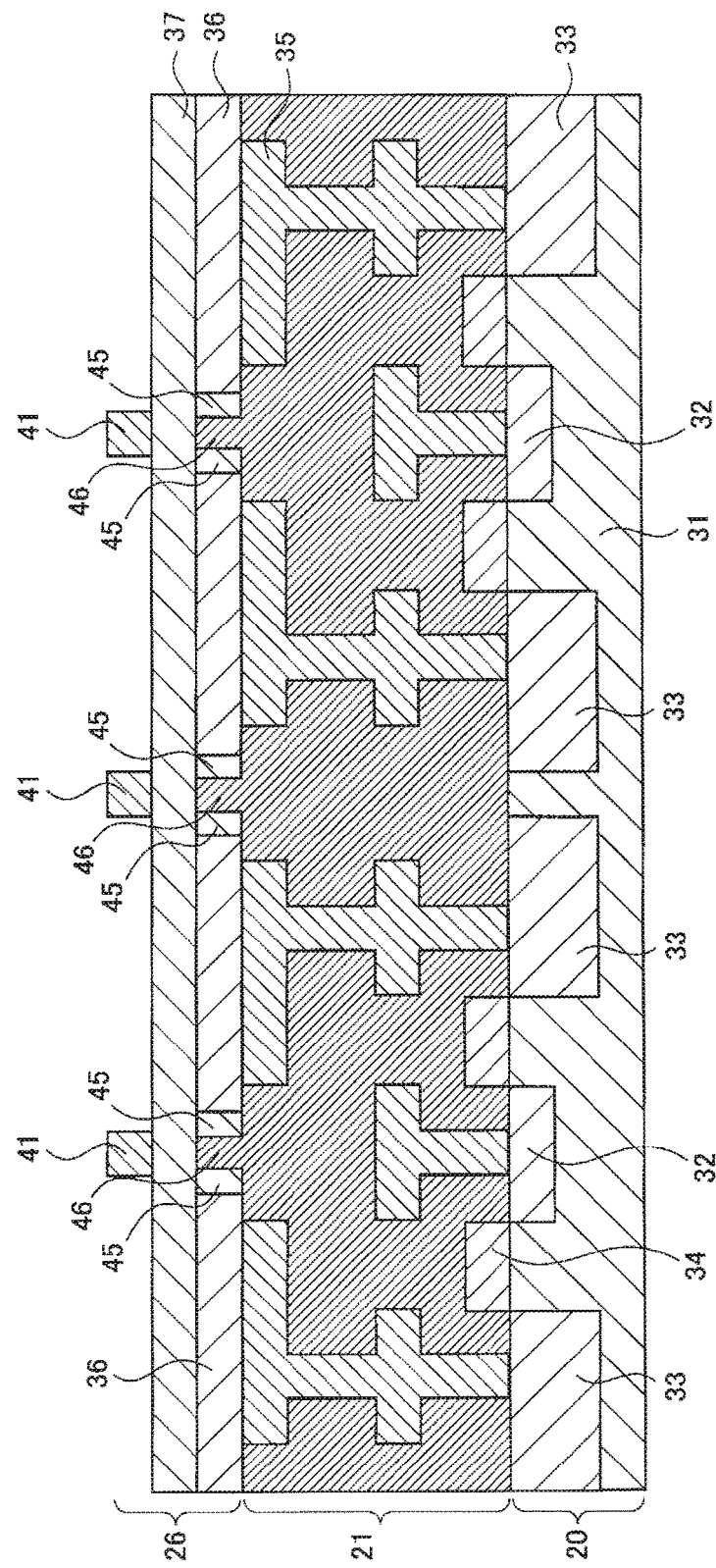

[ FIG. 17A ]
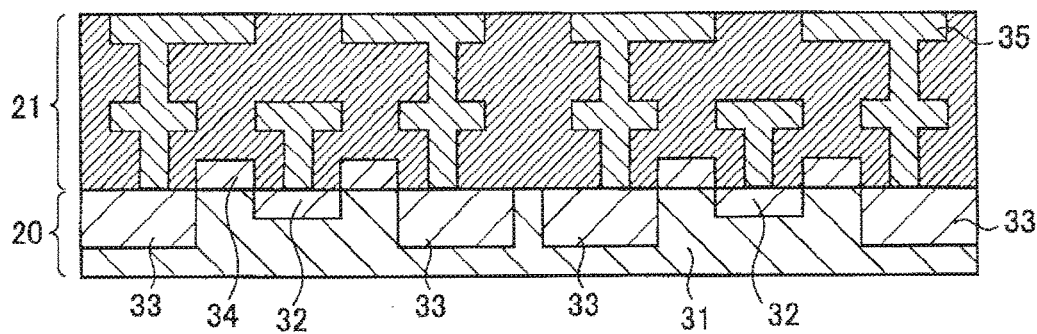
[ FIG. 17B ]
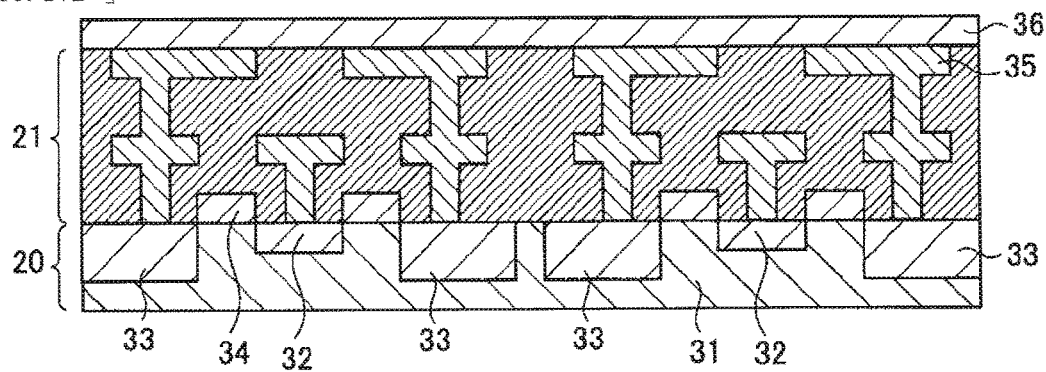
[ FIG. 17C ]
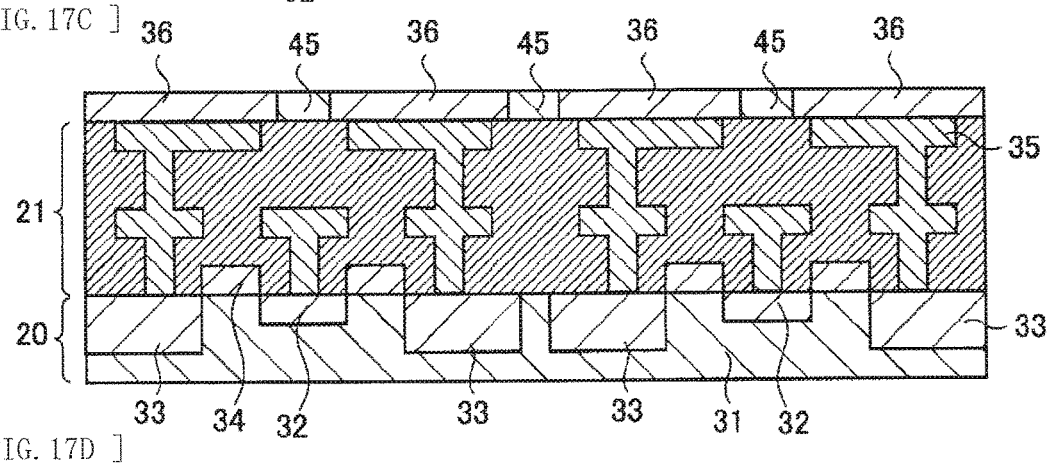
[ FIG. 17D ]
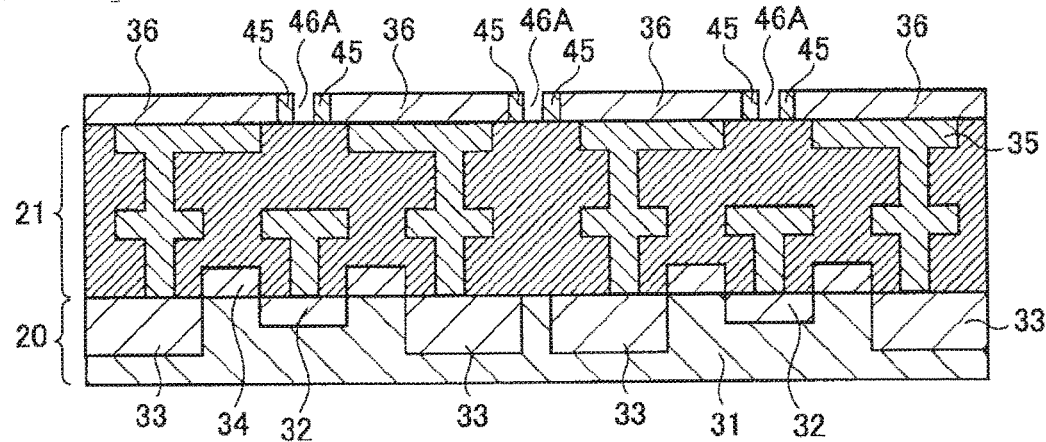

[FIG. 17E]
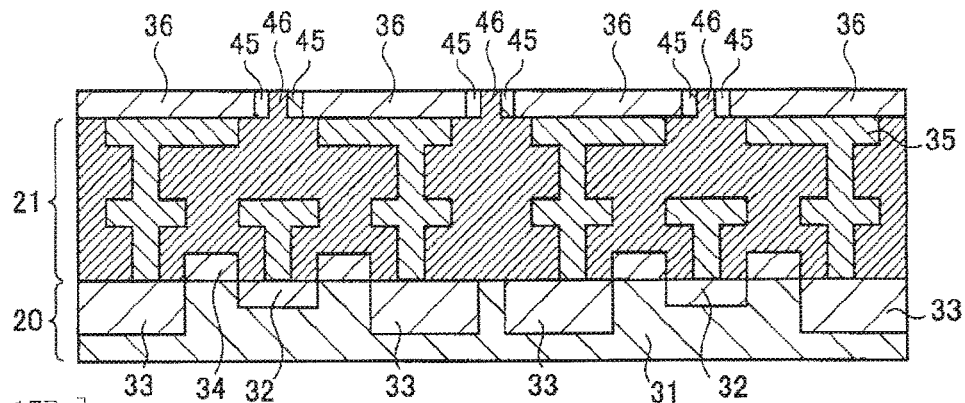
[FIG. 17F]
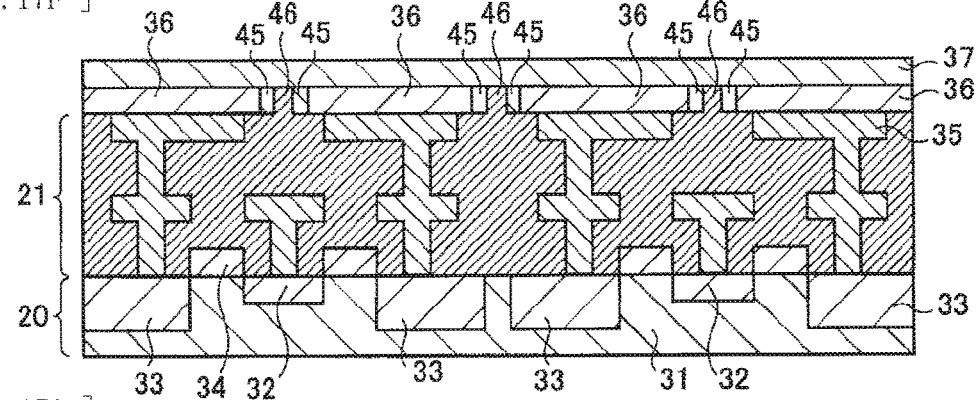
[FIG. 17G]
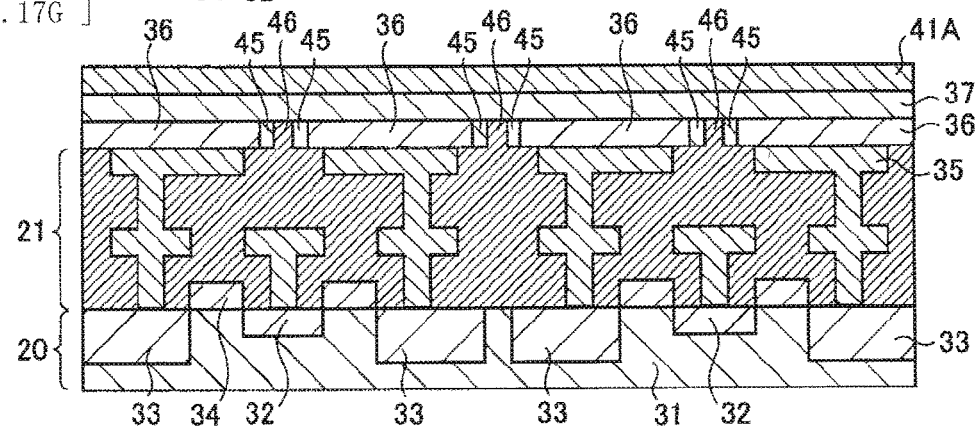
[FIG. 17H]
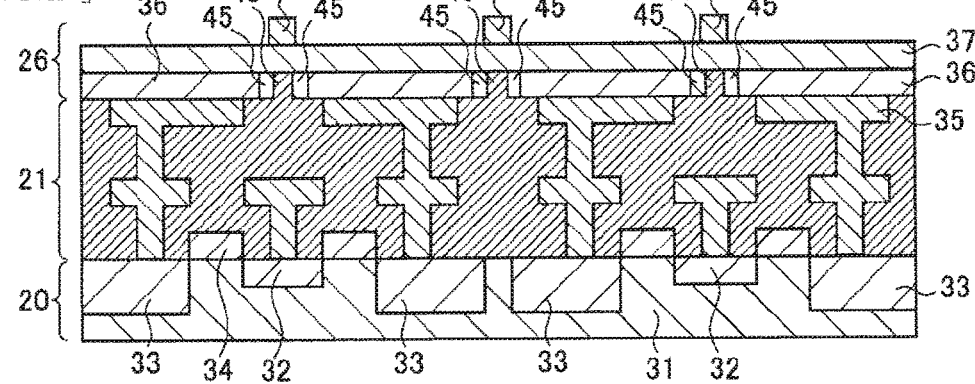

[FIG. 18]
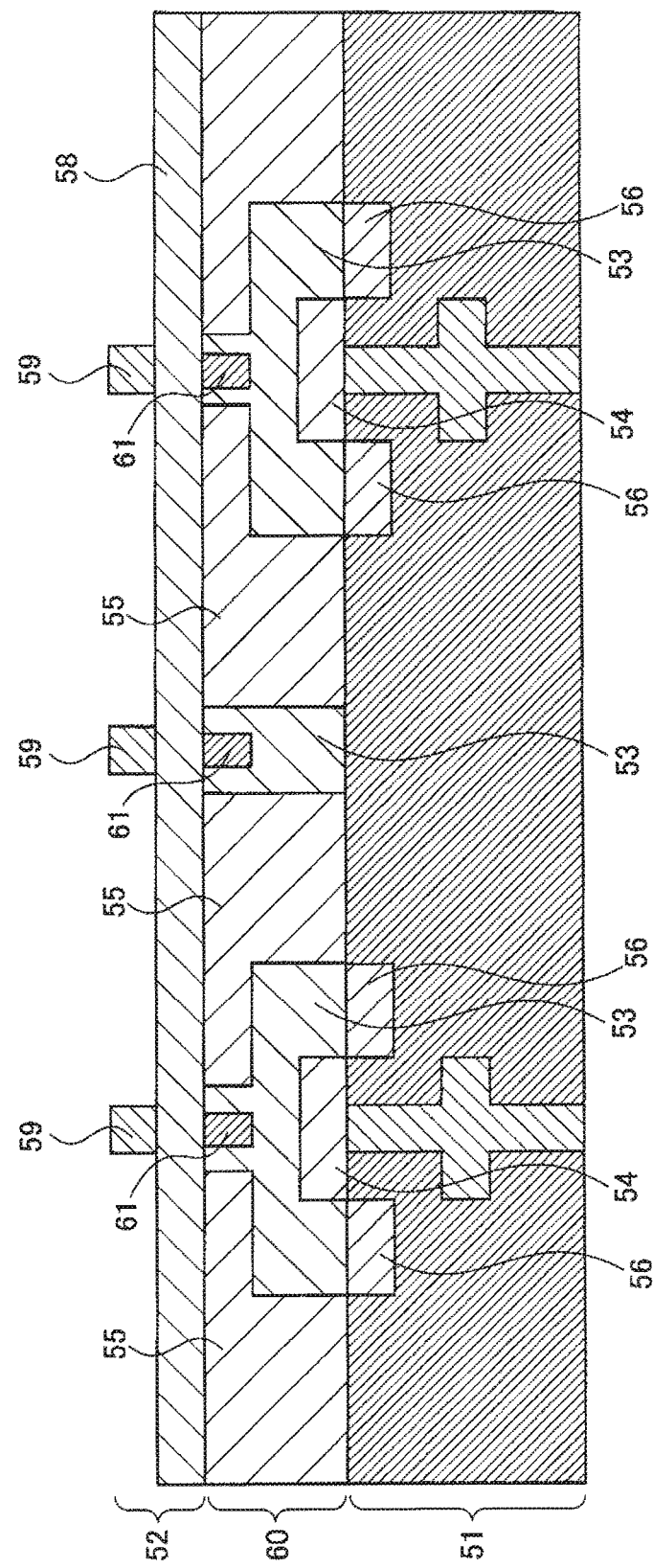

[ FIG. 19A ]
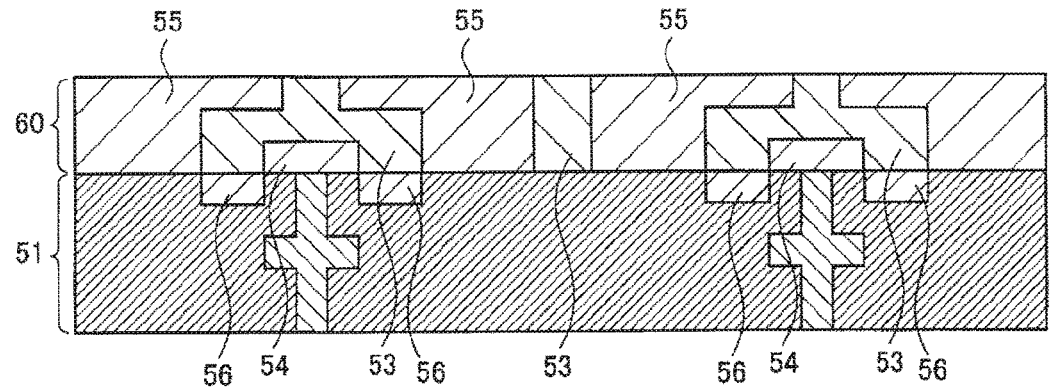
[ FIG. 19B ]
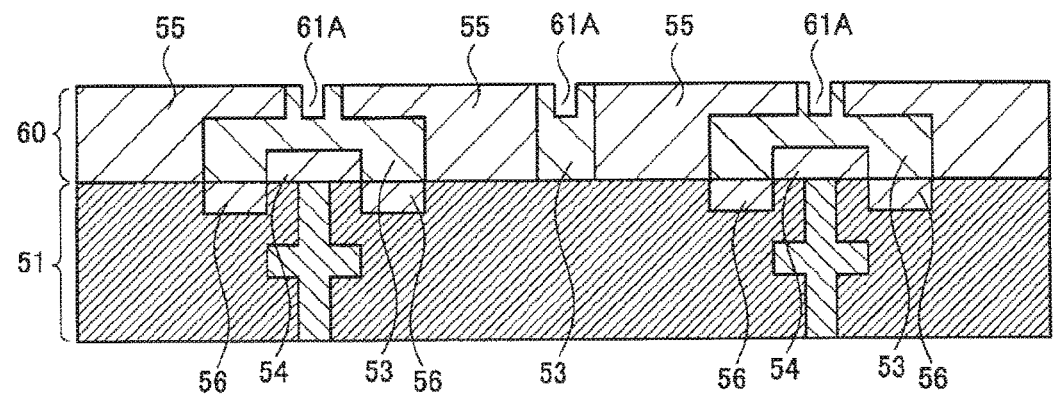
[ FIG. 19C ]
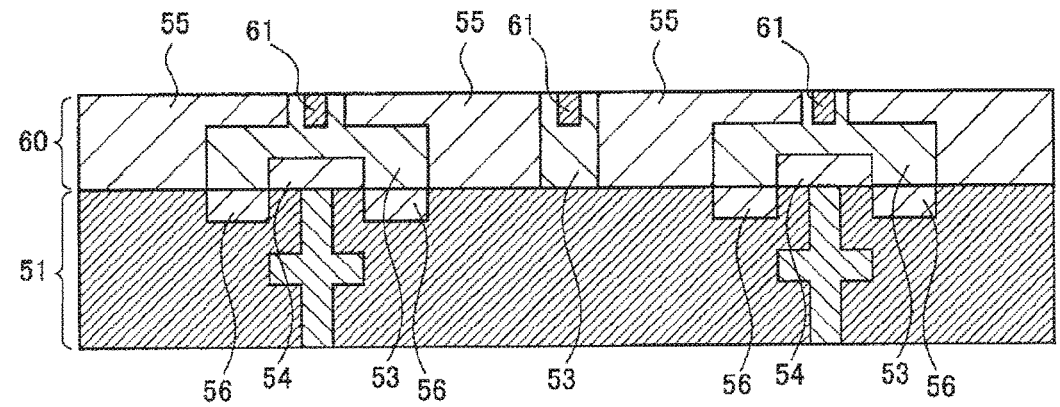

[ FIG. 19D ]
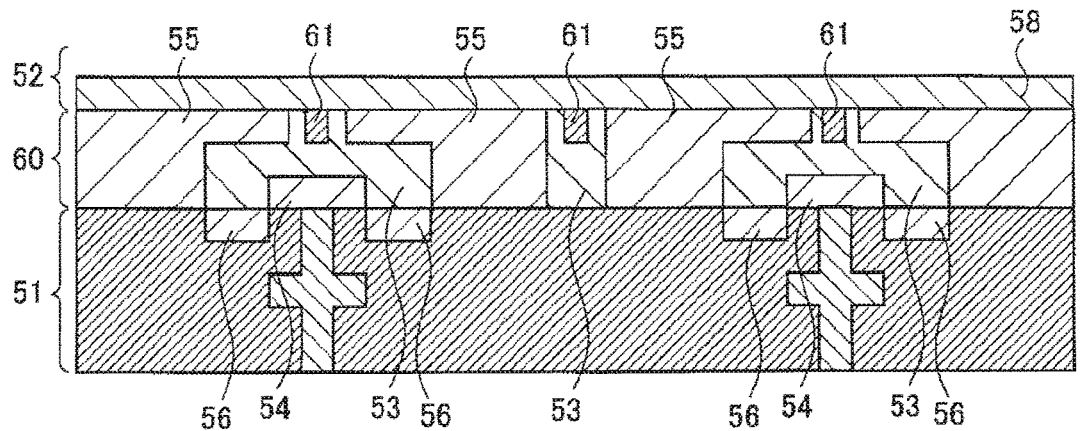
[ FIG. 19E ]
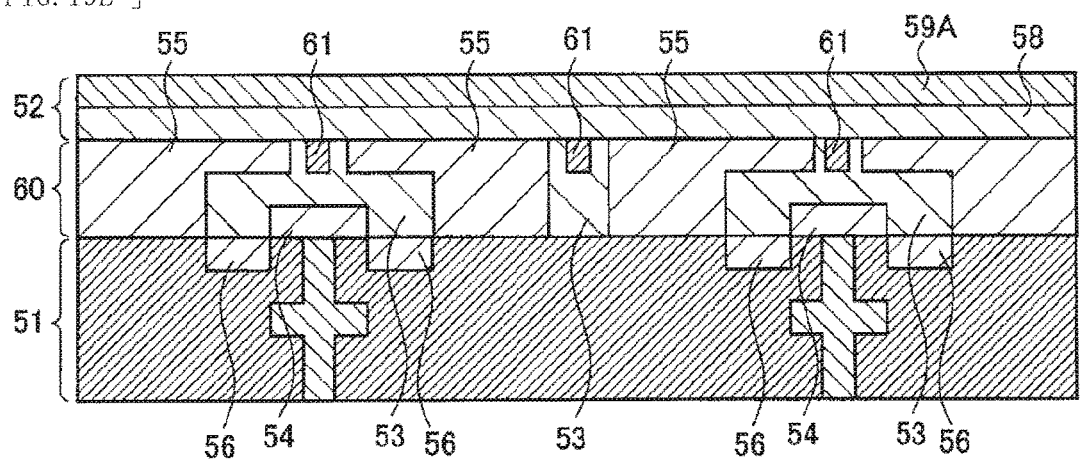
[ FIG. 19F ]
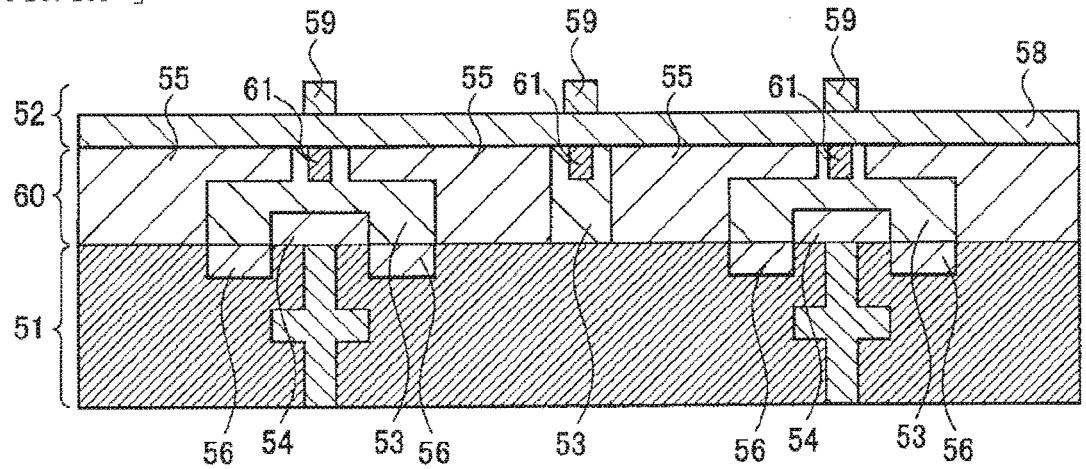

[FIG. 20]
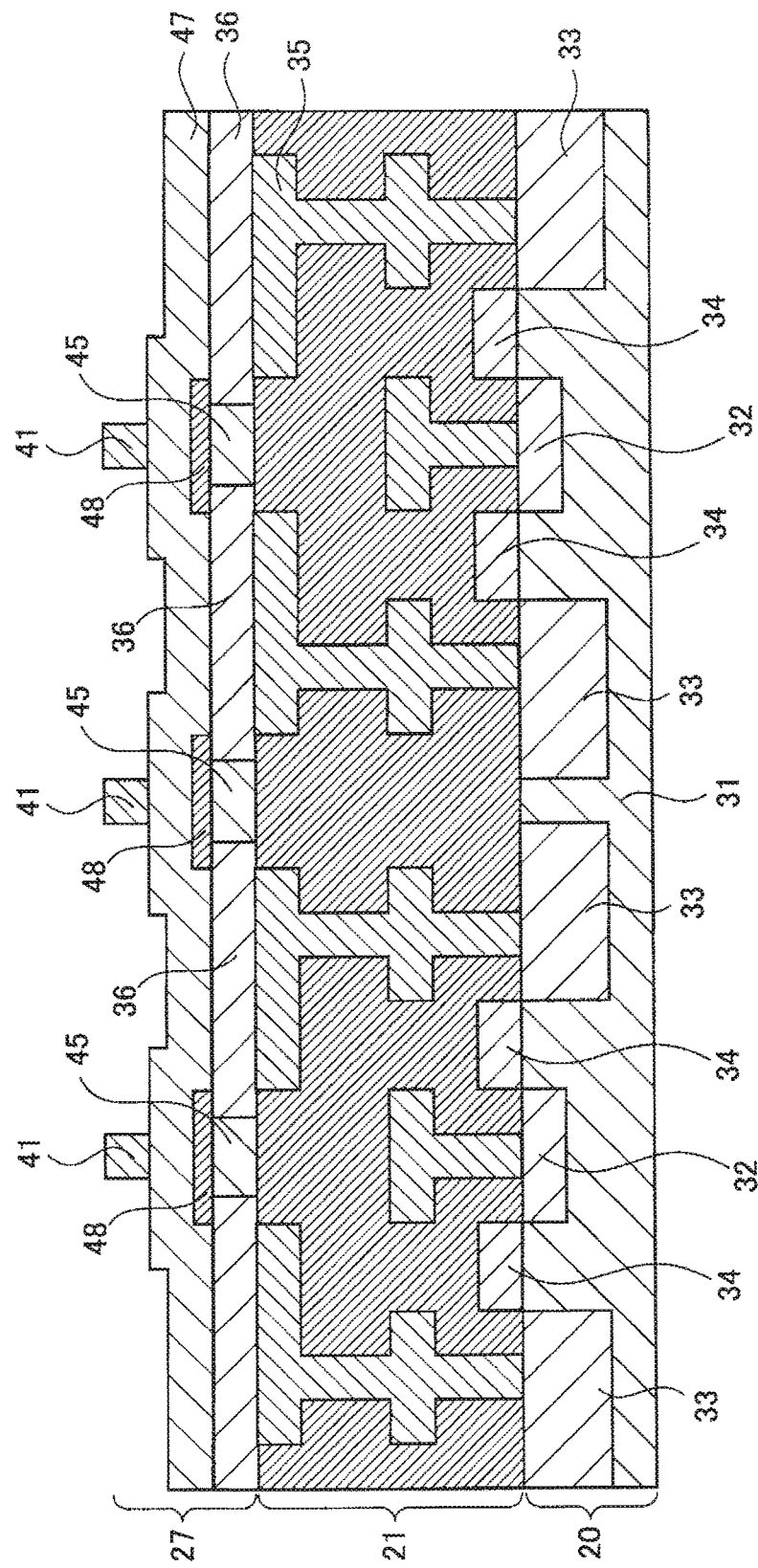

[ FIG. 21A ]
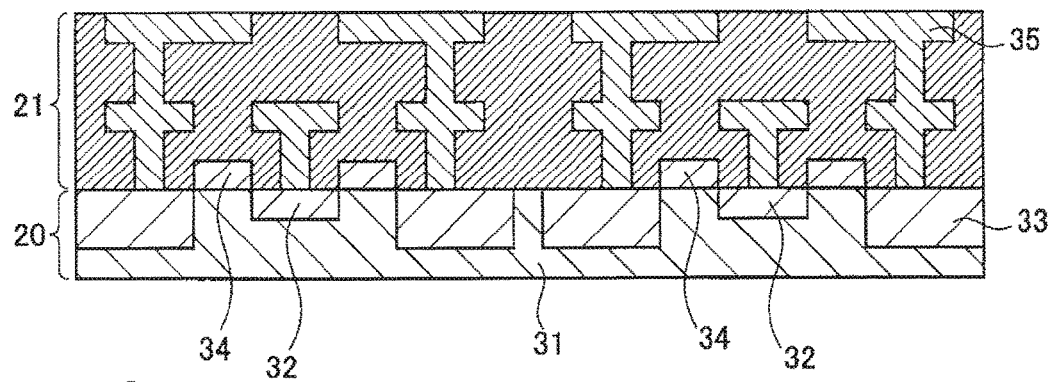
[ FIG. 21B ]
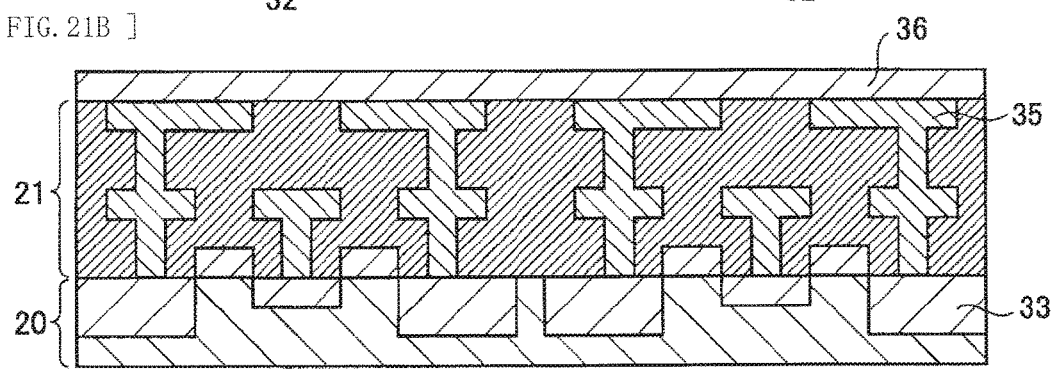
[ FIG. 21C ]
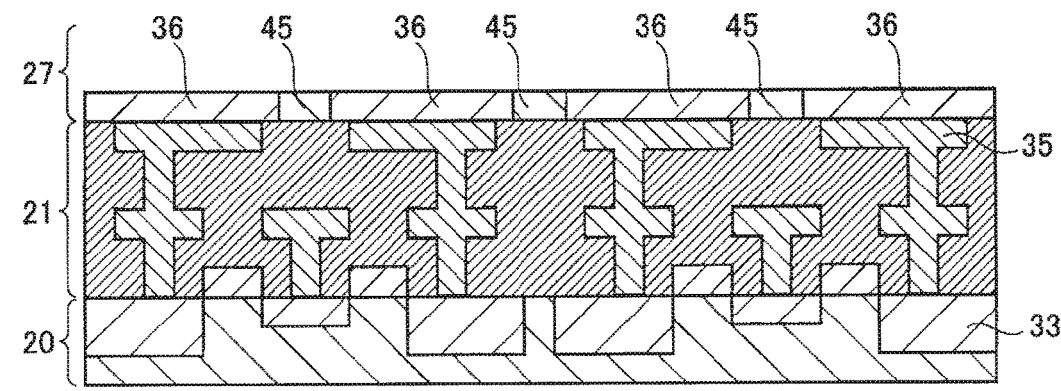

[ FIG. 21D ]
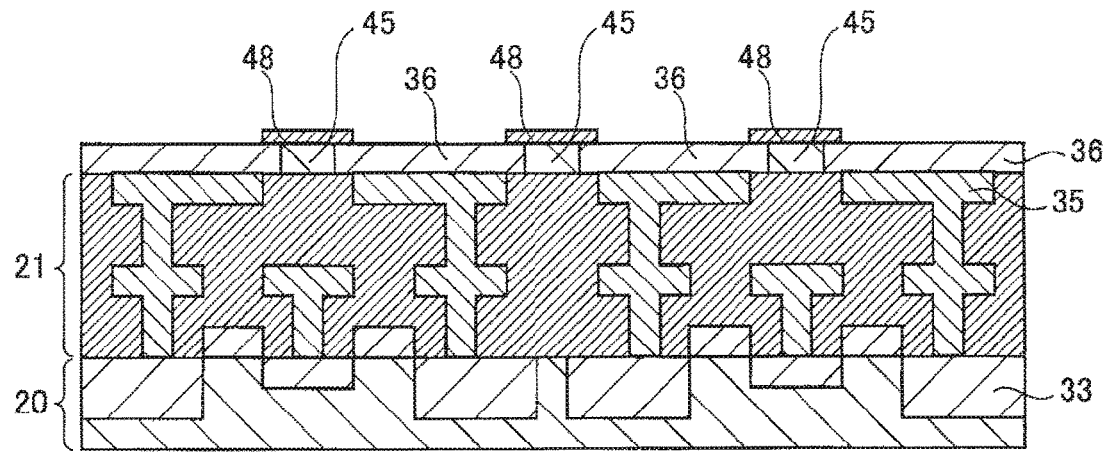
[ FIG. 21E ]
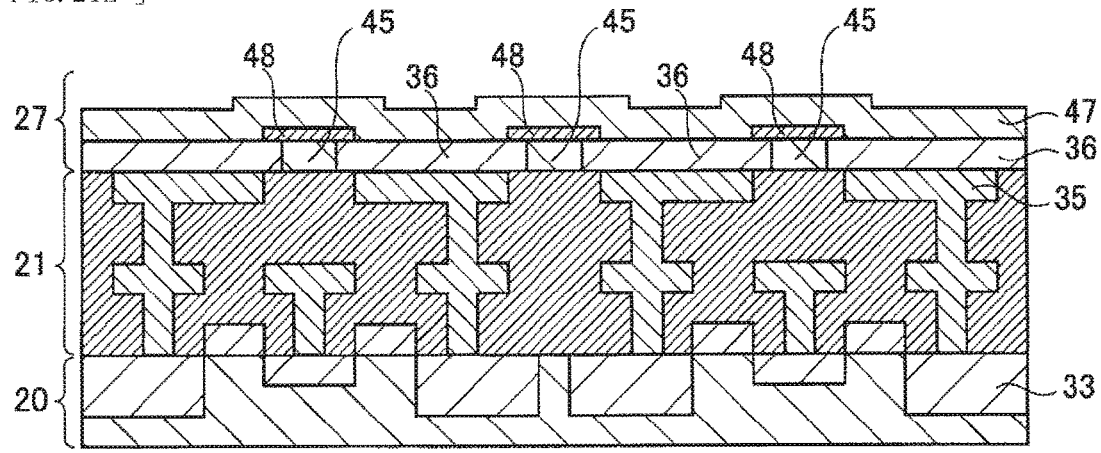
[ FIG. 21F ]
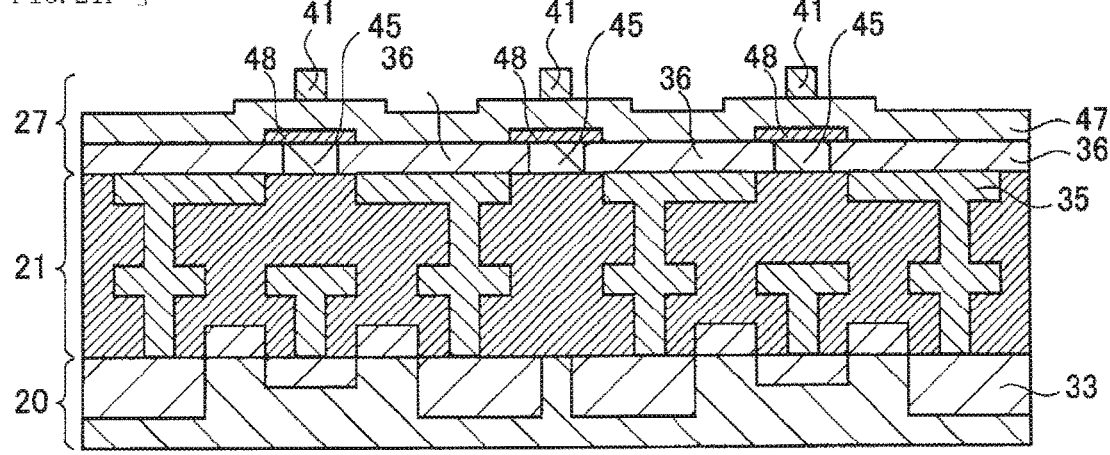

[ FIG. 22 ]
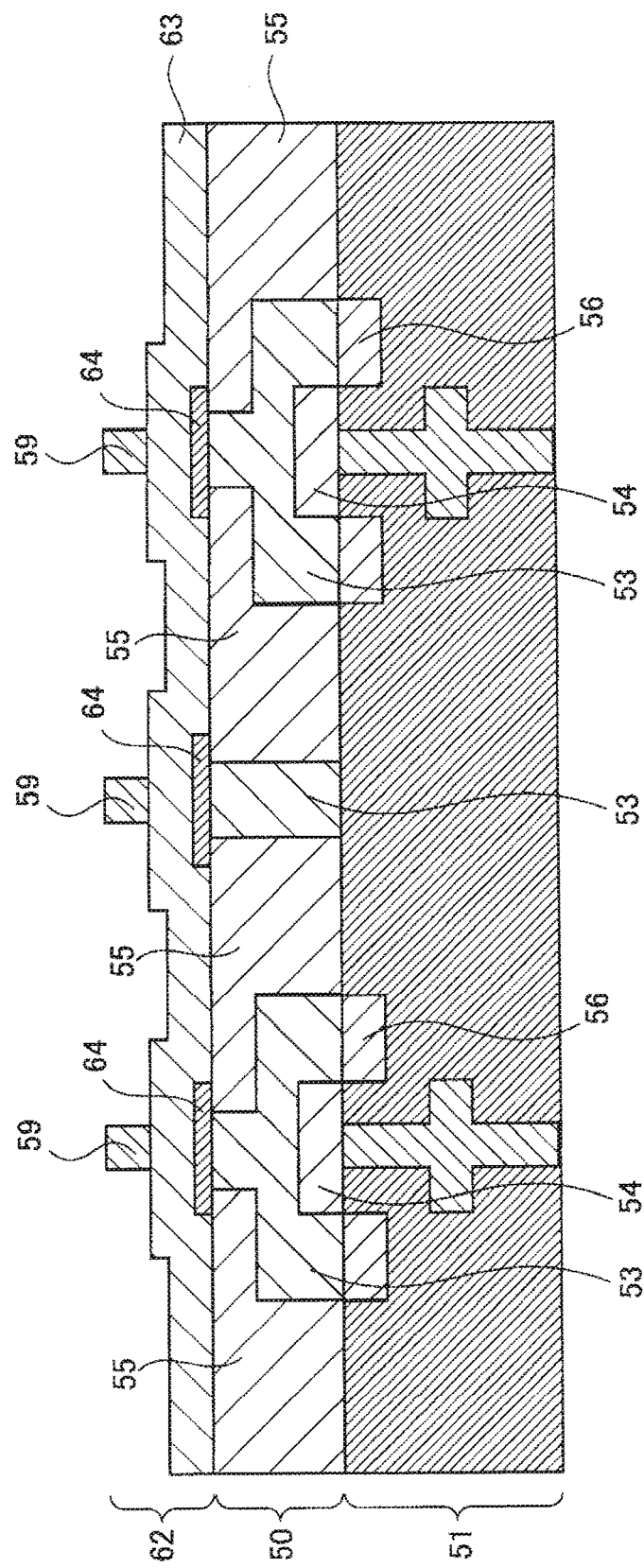

[FIG. 23A]
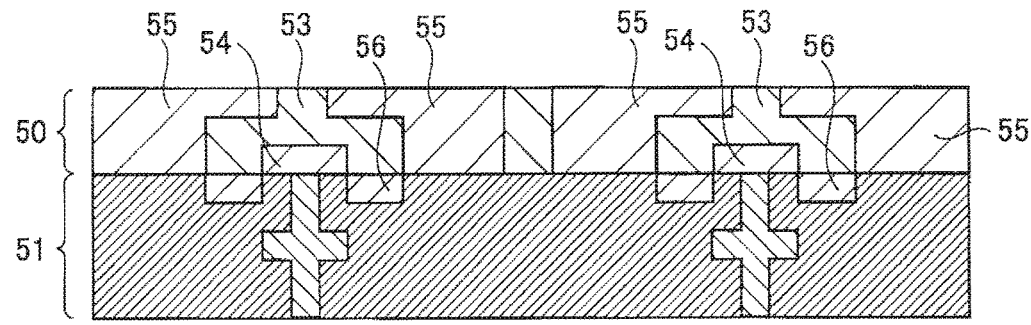
[FIG. 23B]
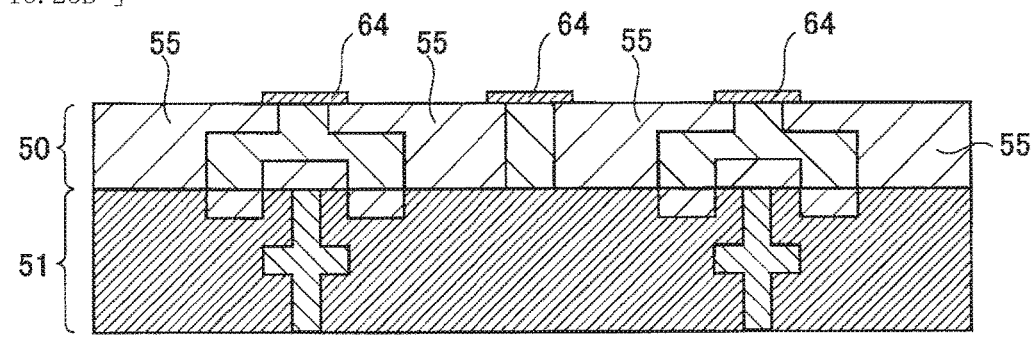
[FIG. 23C]
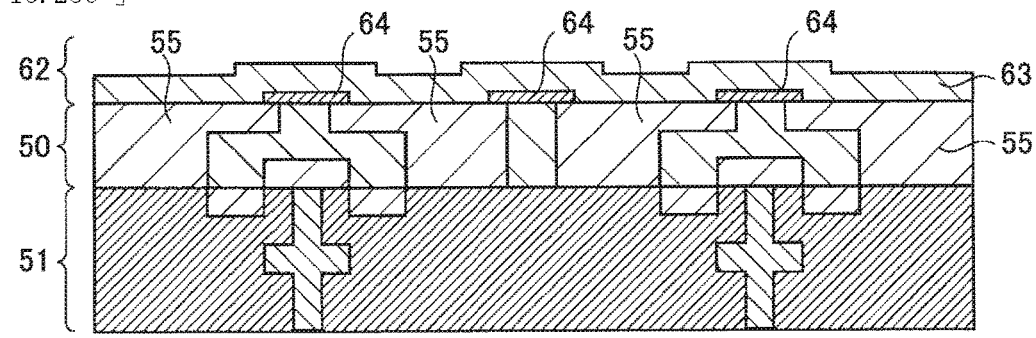
[FIG. 23D]
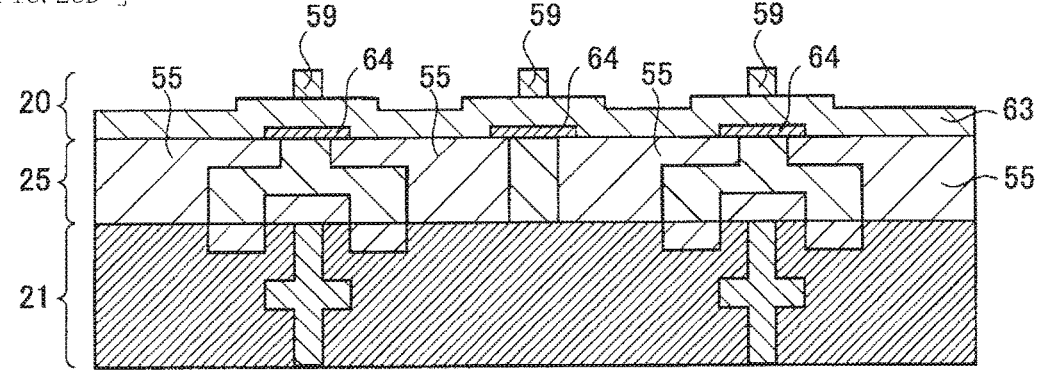

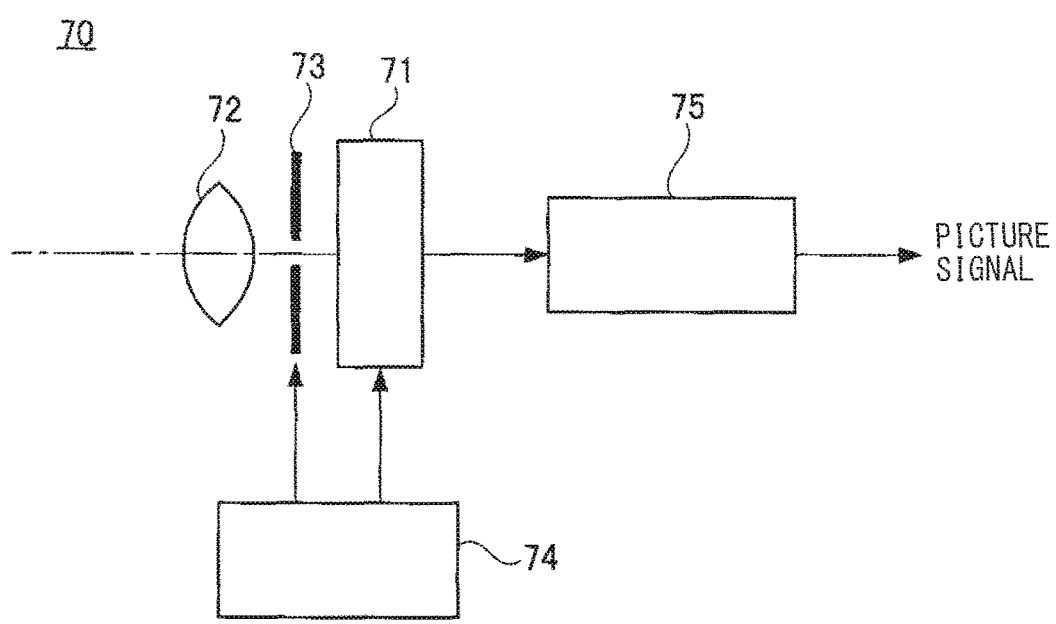
[ FIG. 24 ]

SOLID-STATE IMAGE PICKUP UNIT, METHOD OF MANUFACTURING SOLID-STATE IMAGE PICKUP UNIT, AND ELECTRONIC APPARATUS

TECHNICAL FIELD

The present technology relates to a solid-state image pickup unit having a compound semiconductor film of a chalcopyrite structure, a method of manufacturing the solid-state image pickup unit, and an electronic apparatus.

BACKGROUND ART

An image sensor is being developed to reduce a pixel size in association with increase in the number of pixels. On the other hand, development to shoot images at high speed and to improve moving picture characteristics is also being promoted. In this way, when pixels are reduced in size or shooting is performed at high speed, the number of photons entering one pixel is reduced, which lowers sensitivity.

Further, in a field of a monitoring camera, a camera capable of shooting pictures in a dark place is desired. In other words, a highly sensitive sensor is necessary.

With respect to such demands, there is reported that a compound semiconductor of a p-type chalcopyrite structure is applied, as a photoelectric conversion film high in optical absorption coefficient, to an image sensor to achieve high sensitivity (for example, refer to PTL1, PTL2, and PTL3).

CITATION LIST

Patent Literature

PTL 1: Japanese Unexamined Patent Application Publication No. 2007-123721
PTL 2: International Publication No. WO 2008/093834
PTL 3: International Publication No. WO 2009/078299

SUMMARY OF INVENTION

In the above-described solid-state image pickup unit having the compound semiconductor of the chalcopyrite structure, achievement of both micro-fabrication of pixels and improvement in sensitivity is demanded.

Therefore, it is desirable to provide a solid-state image pickup unit, a method of manufacturing the solid-state image pickup unit, and an electronic apparatus that each have the compound semiconductor of the chalcopyrite structure, and are capable of achieving both micro-fabrication of pixels and improvement in sensitivity.

According to an embodiment of the technology, there is provided a solid-state image pickup unit including: a p-type compound semiconductor layer of a chalcopyrite structure; an electrode formed on the p-type compound semiconductor layer; and an n-type layer formed separately for each pixel, on a surface opposite to a light incident side of the p-type compound semiconductor layer.

Moreover, according to an embodiment of the technology, there is provided an electronic apparatus including the above-described solid-state image pickup unit and a signal processing circuit processing a signal output from the solid-state image pickup unit.

According to an embodiment of the technology, there is provided a method of manufacturing a solid-state image pickup unit. The method includes: forming an n-type layer separated for each pixel; forming a p-type compound semiconductor layer of a chalcopyrite structure on the n-type layer; and forming an electrode on the p-type compound semiconductor layer.

In the solid-state image pickup unit according to the embodiment of the technology, the n-type layer is separated for each pixel, and therefore the p-type compound semiconductor layer of the chalcopyrite structure is electrically separated for each pixel. Therefore, physical pixel separation of the p-type compound semiconductor layer of the chalcopyrite structure is not necessarily performed. Consequently, sensitivity improvement and micro-fabrication of pixels in the solid-state image pickup unit and the electronic apparatus are achieved.

In the method of manufacturing the solid-state image pickup unit according to the embodiment of the technology, only the n-type layer is separated for each pixel without separating the p-type compound semiconductor layer of the chalcopyrite structure. Therefore, micro-fabrication of pixels is achieved while defect in manufacturing steps caused by processing of the p-type compound semiconductor layer of the chalcopyrite structure is prevented.

According to the respective embodiments of the technology, there are provided the solid-state image pickup unit, the method of manufacturing the solid-state image pickup unit, and the electronic apparatus that each have the compound semiconductor of the chalcopyrite structure, and are capable of achieving both micro-fabrication of pixels and improvement in sensitivity.

BRIEF DESCRIPTION OF DRAWINGS

FIG. 1 is a plan view illustrating a configuration of a solid-state image pickup unit according to an embodiment.

FIG. 2 is a sectional view illustrating a structure of a pixel section of a solid-state image pickup unit according to a first embodiment.

FIG. 3 is a graph illustrating a film thickness of Mo and absorptance in each wavelength range.

FIG. 4A is a manufacturing process diagram illustrating a method of manufacturing the solid-state image pickup unit according to the first embodiment.

FIG. 4B is a manufacturing process diagram illustrating the method of manufacturing the solid-state image pickup unit according to the first embodiment.

FIG. 4C is a manufacturing process diagram illustrating the method of manufacturing the solid-state image pickup unit according to the first embodiment.

FIG. 4D is a manufacturing process diagram illustrating the method of manufacturing the solid-state image pickup unit according to the first embodiment.

FIG. 4E is a manufacturing process diagram illustrating the method of manufacturing the solid-state image pickup unit according to the first embodiment.

FIG. 5 is a sectional view illustrating a structure of a pixel section of a solid-state image pickup unit according to a second embodiment.

FIG. 6 is a diagram illustrating planar arrangement of a photoelectric conversion section of the solid-state image pickup unit according to the second embodiment.

FIG. 7 is a diagram illustrating a state of an accumulation layer that is formed in CIGSSe by an ohmic electrode.

FIG. 8A is a manufacturing process diagram illustrating a method of manufacturing the solid-state image pickup unit according to the second embodiment.

FIG. 8B is a manufacturing process diagram illustrating the method of manufacturing the solid-state image pickup unit according to the second embodiment.

FIG. 8C is a manufacturing process diagram illustrating the method of manufacturing the solid-state image pickup unit according to the second embodiment.

FIG. 8D is a manufacturing process diagram illustrating the method of manufacturing the solid-state image pickup unit according to the second embodiment.

FIG. 8E is a manufacturing process diagram illustrating the method of manufacturing the solid-state image pickup unit according to the second embodiment.

FIG. 9 is a sectional view illustrating a structure of a pixel section of a solid-state image pickup unit according to a third embodiment.

FIG. 10 is a diagram illustrating a state of holes accumulated on a surface of CIGSSe.

FIG. 11A is a manufacturing process diagram illustrating a method of manufacturing the solid-state image pickup unit according to the third embodiment.

FIG. 11B is a manufacturing process diagram illustrating the method of manufacturing the solid-state image pickup unit according to the third embodiment.

FIG. 11C is a manufacturing process diagram illustrating the method of manufacturing the solid-state image pickup unit according to the third embodiment.

FIG. 12 is a sectional view illustrating a structure of a pixel section of a solid-state image pickup unit according to a fourth embodiment.

FIG. 13A is a manufacturing process diagram illustrating a method of manufacturing the solid-state image pickup unit according to the fourth embodiment.

FIG. 13B is a manufacturing process diagram illustrating the method of manufacturing the solid-state image pickup unit according to the fourth embodiment.

FIG. 13C is a manufacturing process diagram illustrating the method of manufacturing the solid-state image pickup unit according to the fourth embodiment.

FIG. 13D is a manufacturing process diagram illustrating the method of manufacturing the solid-state image pickup unit according to the fourth embodiment.

FIG. 14 is a sectional view illustrating a structure of a pixel section of a solid-state image pickup unit according to a fifth embodiment.

FIG. 15A is a manufacturing process diagram illustrating a method of manufacturing the solid-state image pickup unit according to the fifth embodiment.

FIG. 15B is a manufacturing process diagram illustrating the method of manufacturing the solid-state image pickup unit according to the fifth embodiment.

FIG. 15C is a manufacturing process diagram illustrating the method of manufacturing the solid-state image pickup unit according to the fifth embodiment.

FIG. 15D is a manufacturing process diagram illustrating the method of manufacturing the solid-state image pickup unit according to the fifth embodiment.

FIG. 15E is a manufacturing process diagram illustrating the method of manufacturing the solid-state image pickup unit according to the fifth embodiment.

FIG. 15F is a manufacturing process diagram illustrating the method of manufacturing the solid-state image pickup unit according to the fifth embodiment.

FIG. 16 is a sectional view illustrating a structure of a pixel section of a solid-state image pickup unit according to a sixth embodiment.

FIG. 17A is a manufacturing process diagram illustrating a method of manufacturing the solid-state image pickup unit according to the sixth embodiment.

FIG. 17B is a manufacturing process diagram illustrating the method of manufacturing the solid-state image pickup unit according to the sixth embodiment.

FIG. 17C is a manufacturing process diagram illustrating the method of manufacturing the solid-state image pickup unit according to the sixth embodiment.

FIG. 17D is a manufacturing process diagram illustrating the method of manufacturing the solid-state image pickup unit according to the sixth embodiment.

FIG. 17E is a manufacturing process diagram illustrating the method of manufacturing the solid-state image pickup unit according to the sixth embodiment.

FIG. 17F is a manufacturing process diagram illustrating the method of manufacturing the solid-state image pickup unit according to the sixth embodiment.

FIG. 17G is a manufacturing process diagram illustrating the method of manufacturing the solid-state image pickup unit according to the sixth embodiment.

FIG. 17H is a manufacturing process diagram illustrating the method of manufacturing the solid-state image pickup unit according to the sixth embodiment.

FIG. 18 is a sectional view illustrating a structure of a pixel section of a solid-state image pickup unit according to a seventh embodiment.

FIG. 19A is a manufacturing process diagram illustrating a method of manufacturing the solid-state image pickup unit according to the seventh embodiment.

FIG. 19B is a manufacturing process diagram illustrating the method of manufacturing the solid-state image pickup unit according to the seventh embodiment.

FIG. 19C is a manufacturing process diagram illustrating the method of manufacturing the solid-state image pickup unit according to the seventh embodiment.

FIG. 19D is a manufacturing process diagram illustrating the method of manufacturing the solid-state image pickup unit according to the seventh embodiment.

FIG. 19E is a manufacturing process diagram illustrating the method of manufacturing the solid-state image pickup unit according to the seventh embodiment.

FIG. 19F is a manufacturing process diagram illustrating the method of manufacturing the solid-state image pickup unit according to the seventh embodiment.

FIG. 20 is a sectional view illustrating a structure of a pixel section of a solid-state image pickup unit according to an eighth embodiment.

FIG. 21A is a manufacturing process diagram illustrating a method of manufacturing the solid-state image pickup unit according to the eighth embodiment.

FIG. 21B is a manufacturing process diagram illustrating the method of manufacturing the solid-state image pickup unit according to the eighth embodiment.

FIG. 21C is a manufacturing process diagram illustrating the method of manufacturing the solid-state image pickup unit according to the eighth embodiment.

FIG. 21D is a manufacturing process diagram illustrating the method of manufacturing the solid-state image pickup unit according to the eighth embodiment.

FIG. 21E is a manufacturing process diagram illustrating the method of manufacturing the solid-state image pickup unit according to the eighth embodiment.

FIG. 21F is a manufacturing process diagram illustrating the method of manufacturing the solid-state image pickup unit according to the eighth embodiment.

FIG. 22 is a sectional view illustrating a structure of a pixel section of a solid-state image pickup unit according to a ninth embodiment.

FIG. 23A is a manufacturing process diagram illustrating a method of manufacturing the solid-state image pickup unit according to the ninth embodiment.

FIG. 23B is a manufacturing process diagram illustrating the method of manufacturing the solid-state image pickup unit according to the ninth embodiment.

FIG. 23C is a manufacturing process diagram illustrating the method of manufacturing the solid-state image pickup unit according to the ninth embodiment.

FIG. 23D is a manufacturing process diagram illustrating the method of manufacturing the solid-state image pickup unit according to the ninth embodiment.

FIG. 24 is a diagram illustrating a configuration of an electronic apparatus.

DESCRIPTION OF EMBODIMENTS

Although some embodiments for carrying out the present technology will be described below, the present technology is not limited to the following embodiments.

Note that description will be given in the following order.
1. Outline of solid-state image pickup unit
2. First embodiment of solid-state image pickup unit
3. Method of manufacturing solid-state image pickup unit according to first embodiment
4. Second embodiment of solid-state image pickup unit
5. Method of manufacturing solid-state image pickup unit according to second embodiment
6. Third embodiment of solid-state image pickup unit
7. Method of manufacturing solid-state image pickup unit according to third embodiment
8. Fourth embodiment of solid-state image pickup unit
9. Method of manufacturing solid-state image pickup unit according to fourth embodiment
10. Fifth embodiment of solid-state image pickup unit
11. Method of manufacturing solid-state image pickup unit according to fifth embodiment
12. Sixth embodiment of solid-state image pickup unit
13. Method of manufacturing solid-state image pickup unit according to sixth embodiment
14. Seventh embodiment of solid-state image pickup unit
15. Method of manufacturing solid-state image pickup unit according to seventh embodiment
16. Eighth embodiment of solid-state image pickup unit
17. Method of manufacturing solid-state image pickup unit according to eighth embodiment
18. Ninth embodiment of solid-state image pickup unit
19. Method of manufacturing solid-state image pickup unit according to ninth embodiment
20. Electronic apparatus <1. Outline of Solid-State Image Pickup Unit>

Hereinafter, outline of a solid-state image pickup unit will be described.

In technologies described in the above-described PTLs 1 to 3, a configuration used as a typical solar cell is applied to a solid-state image pickup unit. Specifically, the solid-state image pickup unit includes a circuit section including transistors that are formed on a semiconductor substrate, and a photoelectric conversion section provided on the circuit section. Further, the photoelectric conversion section is formed of a translucent electrode, a p-type compound semiconductor film of a chalcopyrite structure, and a lower electrode layer in order from a light incident surface side.

As the p-type compound semiconductor of the chalcopyrite structure, CuInGaSe$_2$ film (CIGSe film) and the like are described. In addition, the translucent electrode is formed of an n-type layer such as an ITO film, a tin oxide (SnO$_2$) film, and an indium oxide (In$_2$O$_3$) film. The lower electrode is formed of a metallic film of Mo or the like.

In the solid-state image pickup unit with this configuration, carriers that are generated by allowing light to enter from a side provided with the n-type layer configuring the translucent electrode and performing photoelectric conversion, are extracted from a p-type CIGSe film side. The translucent electrode is typically formed of an n-type semiconductor, and thus is stacked as the n-type layer on the CIGSe film. Moreover, the metallic film formed of Mo or the like that is easily ohmically contacted with the CIGSe film hardly transmits light, and thus is provided below the CIGSe film.

Incidentally, to use the above-described structure as an image pickup device, device separation of the CIGSe film, namely, device separation of the photoelectric conversion film is necessary.

As a method of the device separation of the CIGSe film, in the above-described PTLs 1 and 2, it is reported that the CIGSe film is subject to dry etching with use of chlorine gas and bromine gas as etchants, and wet etching is used together to allow dark current to be reduced. Moreover, since the wet etching allows removal of residue of the dry etching, dark current is allowed to be reduced.

However, the boiling point of a reactant of Cu as a main component of the CIGSe film and the etchants is 933° C. by CuCl$_2$ and 900° C. by CuBr$_2$, that are extremely high. Therefore, the reactant is deposited in an etching apparatus, which may cause dust and rate variation. Therefore, the above-described device separation method is difficult to be applied to mass production of the solid-state image pickup unit.

Further, since charging by the dry etching and damage such as defect are applied to the photoelectric conversion film, an occurrence amount of the dark current is increased even when the residue of the dry etching is removed by the wet etching.

Moreover, in the above-described PTL 3, as another device separation method, it is reported that a group II element, a group VII element, or the like is ion-injected into the CIGSe film to achieve the device separation. By the method, however, charging by the ion injection and damage such as defect are applied to the photoelectric conversion film, which may cause increase in occurrence amount of the dark current.

As described above, by the device separation method in which the p-type compound semiconductor of the chalcopyrite structure is directly processed, it is difficult to configure the solid-state image pickup unit provided with the photoelectric conversion section that has sufficient characteristics.

Accordingly, there is proposed a method of performing pixel separation of the photoelectric conversion section without processing the p-type compound semiconductor of the chalcopyrite structure. Specifically, the pixel separation of the photoelectric conversion section is allowed to be achieved by forming the n-type layer below the above-described p-type compound semiconductor layer and performing the pixel separation on the n-type layer. In this method, since processing for device separation is not performed on the compound semiconductor layer of the chalcopyrite stricter, increase in dark current caused by damage does not occur. In addition, etching of the n-type layer is easily performed by an existing well-known method that is applied in manufacturing semiconductor apparatuses. Accordingly, it is possible to improve sensitivity by providing the p-type compound semiconductor of the chalcopyrite structure, and to configure a solid-state image pickup unit in which micro-fabrication of the devices is achievable without increasing dark current.

<2. First Embodiment of Solid-State Image Pickup Unit>
(Configuration Example of Solid-State Image Pickup Unit: Schematic Configuration Diagram)

Hereinafter, a specific embodiment of the solid-state image pickup unit according to the present embodiment will be described.

FIG. 1 illustrates a schematic configuration diagram of a metal oxide semiconductor (MOS) solid-state image pickup unit as an example of the solid-state image pickup unit.

A solid-state image pickup unit 10 illustrated in FIG. 1 is configured of a pixel section (a so-called image pickup region) 13 in which pixels 12 are regularly two-dimensionally arranged and a peripheral circuit section. Each of the pixels 12 includes a photodiode and a plurality of pixel transistors (so-called MOS transistors).

The plurality of pixel transistors may be configured of, for example, three transistors of a transfer transistor, a reset transistor, and an amplification transistor. In addition, the plurality of pixel transistors may be configured of four transistors added with a selection transistor.

The peripheral circuit section is configured of a vertical drive circuit 14, column signal processing circuits 15, a horizontal drive circuit 16, an output circuit 17, a control circuit 18, and the like.

The control circuit 18 generates, based on a vertical synchronization signal, a horizontal synchronization signal, and a master clock, a clock signal and control signals that are reference of operation of the vertical drive circuit 14, the column signal processing circuits 15, the horizontal drive circuit 16, and the like. The control circuit 18 inputs these signals to the vertical drive circuit 14, the column signal processing circuits 15, the horizontal drive circuit 16, and the like.

The vertical drive circuit 14 may be configured of, for example, a shift resistor. The vertical drive circuit 14 selects and scans the pixels 12 of the pixel section 13 on a row basis sequentially in a vertical direction, and supplies a pixel signal that is based on a signal charge generated in response to a received light amount by a photoelectric conversion device in each pixel 12, to the column signal processing circuits 15 through vertical signal lines 19.

The column signal processing circuits 15 may be arranged corresponding to the respective columns of the pixels 12, for example, and each perform signal processing such as noise removal of a signal output from the pixels 12 of one low for each pixel columns, with use of signals from black reference pixels (that are formed in the periphery of an effective pixel region). In other words, the column signal processing circuits 15 each perform signal processing such as correlate double sampling (CDS) for removing fixed pattern noise inherent in the pixels 12 and signal amplification. Horizontal selection switches (not illustrated) are provided at output stages of the respective column signal processing circuits 15 so as to be connected between the column signal processing circuits 15 and a horizontal signal line 11.

The horizontal drive circuit 16 may be configured of, for example, a shift resistor, and sequentially outputs horizontal scan pulses to select each of the column signal processing circuits 15 in order, and outputs a pixel signal from each of the column signal processing circuits 15 to the horizontal signal line 11.

The output circuit 17 performs signal processing on the signals that are sequentially supplied from the respective column signal processing circuits 15 through the horizontal signal line 11, and then outputs the processed signals.

(Structure Example of Solid-State Image Pickup Unit: Pixel Section)

Next, FIG. 2 illustrates a schematic structure of the solid-state image pickup unit according to a first embodiment. FIG. 2 is a sectional view of a main part configuring pixels of the solid-state image pickup unit.

As illustrated in FIG. 2, the sectional surface structure of the solid-state image pickup unit includes a semiconductor substrate 20, a wiring section 21 disposed on the semiconductor substrate 20, and a photoelectric conversion section 22 disposed on the wiring section 21.

The semiconductor substrate 20 includes a p-type well 31, n-type floating diffusions (FD sections) 32 formed in the p-type well 31, and n-type accumulation sections 33 disposed similarly in the p-type well 31. Further, the semiconductor substrate 20 includes thereon gate electrodes 34 of n-channel MOS transistors. A source and a drain of each of the n-channel MOS transistors are formed by the FD section 32 and the n-type accumulation section 33.

In this structure, one n-type accumulation section 33 corresponds to one pixel. Further, electrons transferred from the photoelectric conversion section 22 to the n-type accumulation sections 33 are transferred to the FD sections 32 by the gate electrodes 34, and are read out as an image of each pixel.

The photoelectric conversion section 22 includes an n-type layer 36, $Cu(In,Ga)(S,Se)_2$ (CIGSSe) 37 that is the p-type compound semiconductor of the chalcopyrite structure, an ohmic metallic film 38, and a translucent electrode 39 in order from the above-described semiconductor substrate 20 side.

The n-type layer 36 is separated for each pixel. The CIGSSe 37 is formed over the entire surface of a forming region of the photoelectric conversion section 22 so as to be continuously on all of the n-type layers 36 that are separated for each pixel. The ohmic metallic film 38 is formed over the entire surface on the CIGSSe 37. Moreover, the translucent electrode 39 is formed over the entire surface on the ohmic metallic film 38.

The wiring section 21 is configured of a wiring that connects various kinds of circuits formed on the semiconductor substrate 20 with the photoelectric conversion section 22, other wirings, and an interlayer insulating layer. The wiring section 21 includes lower electrodes 35 that are independently connected to the n-type layer 36 that is separated for each pixel. The lower electrodes 35 are connected to the respective n-type accumulation sections 33 of the semiconductor substrate 20 through the wiring of the wiring section 21. Each of the lower electrodes 35 is formed of Al, TiN, W, TaN, or the like of CMOS wiring.

The n-type layer 36 configuring the photoelectric conversion section 22 is formed of a stacked body including an n-type low-resistance layer and an n-type high-resistance layer that is disposed on the n-type low-resistance layer. Examples of a material forming the n-type low-resistance layer may include Al-doped ZnO, group III element-doped ZnO, an ITO, and group 15 element-doped Si. In addition, the n-type high-resistance layer is formed of ZnO, CdS, Si, ZnS, ZnSe, $In_2S_3$, $In_2Se_3$, $TiO_2$, or the like.

For example, the n-type layer 36 may be divided for each pixel by dry etching with methane gas as an etchant.

Moreover, p-n junctions are formed by contact of the n-type layers 36 and the CIGSSe 37. Depletion layers are formed in the CIGSSe 37 by application of reverse bias to the p-n junctions.

In this way, in the photoelectric conversion section 22 with the above-described structure, even if the processing of the device separation is not performed on the CIGSSe 37, the depletion layer is formed in the CIGSSe 37 for each pixel by the separated n-type layer 36. The depletion layer formed for each pixel electrically separates the CIGSSe 37 for each pixel in the layer even if the CIGSSe 37 is continuously formed. Therefore, when light enters the CIGSSe 37 in a state where the reverse bias is applied to the p-n junctions, electrons generated by the photoelectric conversion are transferred for each pixel from the n-type layer 36 to the n-type accumulation section 33 through the lower electrode 35 and the wiring section 21.

The translucent electrode 39 is formed on an upper side (a light incident surface side) of the CIGSSe 37. Typically, the translucent electrode is formed of an n-type material, and is poor in ohmic property with a p-type material of a chalcopyrite structure.

Accordingly, the ohmic metallic film 38 that is easily ohmically contacted with the CIGSSe 37 is formed between the CIGSSe 37 and the translucent electrode 39.

The ohmic metallic material 38 is formed of a material that is easily ohmically contacted with the p-type compound semiconductor of the chalcopyrite structure, such as Ni, Au, carbon, and Mo.

Positive holes that are generated by light irradiation to the CIGSSe 37 are discharged to the translucent electrode 39 through the ohmic metallic film 38. Accordingly, the positive holes generated by the photoelectric conversion may not be transferred for each pixel.

The ohmic metallic film 38 is necessary to transmit light because the ohmic metallic film 38 is formed on the upper side of the CIGSSe 37.

FIG. 3 illustrates a film thickness of Mo and absorptance in each wavelength range as an example of the ohmic metallic film 38. In FIG. 3, the horizontal axis indicates an incident wavelength λ (nm), the vertical axis indicates the absorptance of Mo, and the absorptance of the Mo films different in film thickness (1 nm, 2 nm, 3 nm, 7 nm, and 10 nm) at each wavelength are illustrated by a graph.

As illustrated in FIG. 3, when the film thickness of Mo is 1 nm or lower, light absorption thereof is about 10% as illustrated in FIG. 3, which is low. In addition, when the film thickness of the Mo is 2 nm, absorptance of each wavelength is about 10% to about 20%.

Accordingly, the ohmic metallic film 38 may be preferably 2 nm or lower, and further may be desirably as thin as possible, as long as the ohmic contact property is not lowered and the solid-state image pickup unit is allowed to be configured with use of the ohmic metallic film.

In the solid-state image pickup unit according to the first embodiment described above, using the CIGSSe 37 as a photoelectric conversion film makes it possible to configure the solid-state image pickup unit with high sensitivity. Further, the n-type layer 36 that is in contact with the CIGSSe 37 is separated for each pixel through etching without performing processing for pixel separation on the CIGSSe 37. The depletion layer is allowed to be formed in the CIGSSe 37 for each pixel by separating the n-type layer 36 even when the CIGSSe 37 is formed over the entire surface of the light receiving surface, and charges generated by the photoelectric conversion are allowed to be extracted for each pixel. Accordingly, it is possible to perform the pixel separation of the photoelectric conversion section 22 without processing the CIGSSe 37. As a result, in the solid-state image pickup unit provided with the CIGSSe 37 as the photoelectric conversion film, dark current caused by processing of the CIGSSe 37 is allowed to be suppressed, and micro-fabrication of pixels is allowed to be achieved.

<3. Method of Manufacturing Solid-State Image Pickup Unit According to First Embodiment>

Next, a method of manufacturing the above-described solid-state image pickup unit according to the first embodiment is described.

First, as illustrated in FIG. 4A, the n-type floating diffusions (FD sections) 32 and the n-type accumulation sections 33 are formed on the p-type well 31 of the semiconductor substrate 20. Then, the gate electrodes 34 of the n-channel MOS transistors are formed on the semiconductor substrate 20.

Further, the wiring section 21 is formed on the semiconductor substrate 20. Then, wirings on an uppermost layer of the wiring section 21 are separated for each pixel by lithography and dry etching to form the lower electrodes 35.

The semiconductor substrate 20 and the wiring section 21 are formed by normal CMOS process steps.

Next, an insulating layer formed of $SiO_2$ or the like that is not illustrated is formed on the wiring section 21 so as to have a thickness of, for example, 100 nm. Then, in the pixel section, holes to connect the lower electrodes 35 and the n-type layers 36 are patterned by lithography and dry etching. Then, as illustrated in FIG. 4B, the n-type layer 36 is formed by sputtering or the like so as to have a thickness of, for example, 100 nm. Further, as illustrated in FIG. 4C, the n-type layer 36 is separated for each pixel by performing lithography and dry etching.

Next, an insulating layer formed of $SiO_2$ or the like is formed on the n-type layer 36 so as to have a thickness of, for example, 1000 nm, and holes to connect the n-type layer 36 and the CIGSSe 37 are patterned by lithography and dry etching.

Then, as illustrated in FIG. 4D, the CIGSSe 37 is formed by vacuum evaporation method, sputtering, or the like so as to have a thickness of, for example, 1000 nm. Further, the ohmic metallic film 38 is formed on the CIGSSe 37 so as to have a thickness of, for example, 1 nm.

Next, patterning to remove the CIGSSe 37 and the ohmic metallic film 38 at the parts other than the pixel section is performed by lithography. For example, the CIGSSe 37 and the ohmic metallic film 38 may be etched by wet etching. When the ohmic metallic film 38 is formed of Ni, the wet etching is performed with use of nitric acid or the like. Moreover, for example, the CIGSSe 37 may be subjected to the wet etching with use of Br methanol or the like.

Next, holes to connect the translucent electrode 39 and the wiring section 21 are formed on not-illustrated parts outside the pixel section by using lithography and dry etching.

Next, as illustrated in FIG. 4E, the translucent electrode 39 is formed on the ohmic metallic film 38 so as to have a thickness of, for example, 500 nm. Then, to remove the translucent electrode 39 formed in a region other than the pixel section, patterning is performed by using lithography and dry etching.

Next, optical components and the like that are not illustrated may be formed on the photoelectric conversion section 22. For example, a passivation film formed of SiN or the like may be formed on the translucent electrode 39, and a color filter and an optical lens may be formed as necessary.

Further, a PAD opening to connect the solid-state image pickup unit and external apparatuses is formed at a part other than the pixel section by lithography and dry etching.

The solid-state image pickup unit according to the first embodiment illustrated in FIG. 1 is allowed to be manufactured by the above-described steps, By the above-described manufacturing method, the n-type layer 36 is separated for each pixel to manufacture the solid-state image pickup unit without performing processing of the pixel separation on the CIGGSe 37. Existing manufacturing steps of the semiconductor apparatus is applicable to the pixel separation of the n-type layer, which is suitable for mass production of the solid-state image pickup unit. Further, since the pixel separation is not performed on the CIGSSe 37, charging of the dry etching to the photoelectric conversion section 22 and damage such as defect are not applied to the n-type layer 36. Accordingly, it is possible to suppress occurrence of the dark current.

<4. Second Embodiment of Solid-State Image Pickup Unit>

Next, a second embodiment of the solid-state image pickup unit is described.

A schematic structure of the solid-state image pickup unit according to the second embodiment is illustrated in FIG. 5. The structure illustrated in FIG. 5 is a sectional view of a main part configuring pixels of the solid-state image pickup unit illustrated in FIG. 1. Incidentally, in the second embodiment, like numerals are used to designate substantially like structures of the first embodiment, and description thereof is appropriately omitted.

As illustrated in FIG. 5, the solid-state image pickup unit includes the semiconductor substrate 20, the wiring section 21 disposed on the semiconductor substrate 20, and a photoelectric conversion section 23 disposed on the wiring section 21.

The structures other than the photoelectric conversion section 23 are similar to those in the above-described first embodiment.

The semiconductor substrate 20 includes the p-type well 31, the n-type floating diffusions (FD sections) 32 formed in the p-type well 31, and the n-type accumulation sections 33 disposed similarly in the p-type well 31. Further, the semiconductor substrate 20 includes thereon the gate electrodes 34 of the n-channel MOS transistors. A source and a drain of each of the n-channel MOS transistors are formed by the FD section 32 and the n-type accumulation section 33. Further, one n-type accumulation section 33 corresponds to one pixel.

The lower electrodes 35 are each formed of Al, TiN, W, TaN, or the like of CMOS wiring, and are separated for each pixel to be connected to the n-type accumulation sections 33 through the wiring section 21. Then, electrons transferred from the photoelectric conversion section 22 to the n-type accumulation sections 33 through the wiring section 21 are transferred by the gate electrodes 34 to the FG sections 32, and are read out as an image of each pixel.

The photoelectric conversion section 23 includes the n-type layers 36, the CIGSSe 37 that is the p-type compound semiconductor of the chalcopyrite structure, and an ohmic electrode 41 in order from the above-described semiconductor substrate 20 side.

The n-type layers 36 are each formed of an n-type low-resistance layer, and an n-type high-resistance layer disposed on the n-type low-resistance layer. Further, the n-type layers 36 are separated for each pixel.

The CIGSSe 37 is formed over the entire surface of the forming region of the photoelectric conversion section 22 so as to be continuously on the n-type layers 36 that are separated for each pixel.

The ohmic electrode 41 is formed on the CIGSSe 37. In addition, the ohmic electrode 41 is formed on a pixel separation region. Each part where the n-type layer 36 and the CIGSSe 37 are in contact with each other is a pixel. A part on the CIGSSe 37 that is not in contact with the n-type layer 36 is the separation region, and the ohmic electrode 41 is formed on the separation region.

A planar arrangement of the ohmic electrode 41, the CIGSSe 37, and the n-type layers 36 of the photoelectric conversion section 23 is illustrated in FIG. 6. FIG. 6 is a plan view of the photoelectric conversion section 23 as viewed from a light incident direction. In addition, regions where the n-type layer 36 is formed are illustrated by dashed lines.

As illustrated in FIG. 6, the ohmic electrode 41 is formed in a lattice shape on the CIGSSe 37. In addition, the n-type layers 36 illustrated by dashed lines are formed in the lattice of the ohmic electrode 41. As described above, the ohmic electrode 41 is formed at a position that is not overlapped with the n-type layers 36 in a plane position. A distance between the ohmic electrode 41 and the n-type layers 36 may be, for example, about 10 nm to about 100 nm.

The ohmic electrode 41 formed on the pixel separation functions as a shielding film between adjacent pixels. The ohmic electrode 41 is formed to have a thickness of about 100 nm in order to maintain shielding property.

Moreover, in the solid-state image pickup unit with such a structure, similarly to the above-described first embodiment, the n-type layers 36 are in contact with the CIGSSe 37 to form the p-n junctions, and when reverse bias is applied, depletion layers are formed in the CIGSSe 37. Accordingly, in-layer of the CIGSSe 37 is electrically separated for each pixel.

On the other hand, the ohmic electrode 41 is formed of Ni, Au, carbon, Mo, or the like that is easily ohmically contacted with the CIGSSe 37, and when the reverse bias is applied to the n-type layers 36, an accumulation layer is formed in the CIGSSe 37. A state of the accumulation layer formed in the CIGSSe 37 by the ohmic electrode 41 when the reverse bias is applied to the n-type layers 36 is illustrated in FIG. 7.

As illustrated in FIG. 7, in a state where the reverse bias is applied to the n-type layers 36, depletion layers 37A are formed in the CIGSSe 37 at parts in contact with the n-type layers 36. Further, an accumulation layer 37B is formed in the CIGSSe 37 at a part below the ohmic electrode 41. The accumulation layer 37B expanded in the CIGSSe 37 functions as a potential barrier, which strengthens electrical separation between the depletion layers 37A of the CIGSSe 37.

Therefore, in the solid-state image pickup unit according to the present embodiment, inside of the CIGSSe 37 is allowed to be electrically separated for each pixel by the n-type layers 36 separated for each pixel without performing device separation processing of the CIGSSe 37. Further, as a potential distribution of the pixel section illustrated in FIG. 7, the accumulation layer formed by the ohmic electrode 41 enhances the pixel separation property of the depletion layers in the CIGSSe 37.

Then, when light is applied to the CIGSSe 37 in a state where the reverse bias is applied to the n-type layer 36, the electrons generated by the photoelectric conversion are transferred for each pixel from the n-type layers 36 to the n-type accumulation sections 33 through the lower electrodes 35 and the wiring section 21. Moreover, positive holes generated in the CIGSSe 37 are discharged to the ohmic electrode 41. Therefore, the positive holes generated by the photoelectric conversion may not be transferred for each pixel.

With the above-described structure of the solid-state image pickup unit according to the second embodiment, the electrical pixel separation of the CIGSSe 37 is allowed to be strengthened by the accumulation layer by the ohmic electrode 41. Therefore, it is possible to suppress color mixing between adjacent pixels and the like. Further, the ohmic electrode 41 formed on the pixel separation functions as a shielding film. Providing the shielding film on the pixel separation makes it possible to suppress oblique incident light entering adjacent pixels. Accordingly, it is possible to suppress color mixing of the solid-state image pickup unit.

Incidentally, in the above-described embodiment, the case where the ohmic electrode is formed on the light incident surface side of the CIGSSe 37; however, the ohmic electrode may be formed on a surface provided with the n-type layers 36, of the CIGSSe 37. In this case, also, it is possible to obtain effects of enhancing pixel separation property of the CIGSSe 37 by the ohmic electrode and discharging the positive holes, and the like.

<5. Method of Manufacturing Solid-State Image Pickup Unit According to Second Embodiment>

Next, a method of manufacturing the above-described solid-state image pickup unit according to the second embodiment is described. Incidentally, the semiconductor substrate 20 and the wiring section 21 are allowed to be manufactured in a similar way to that in the above-described first embodiment. Accordingly, in the following description, a method of manufacturing the photoelectric conversion section 23 is described first.

First, as illustrated in FIG. 8A, the MOS transistors and the like of the semiconductor substrate 20 and the wiring section 21 including the lower electrodes 35 are formed by a similar method to that in the above-described first embodiment.

Then, a not-illustrated insulating layer formed of $SiO_2$ or the like is formed on the wiring section 21 so as to have a thickness of, for example, 100 nm. Then, in the pixel section, holes to connect the lower electrodes 35 and the n-type layers 36 are patterned by lithography and dry etching. Then, the n-type layer 36 may be formed by sputtering or the like so as to have a thickness of, for example, 100 nm. Then, as illustrated in FIG. 8B, the n-type layer 36 is separated for each pixel by performing lithography and dry etching.

Next, an insulating layer formed of $SiO_2$ or the like is formed on the n-type layers 36 so as to have a thickness of, for example, 100 nm, and holes to connect the n-type layers 36 and the CIGSSe 37 are patterned by lithography and dry etching. Then, as illustrated in FIG. 8C, the CIGSSe 37 is formed by the vacuum evaporation method, sputtering, or the like so as to have a thickness of, for example, 1000 nm.

Further, patterning to remove the CIGSSe 37 at the parts other than the pixel section is performed by lithography and wet etching. For example, the CIGSSe 37 at the parts other than the pixel section may be etched by wet etching using Br methanol or the like.

Next, holes to connect the ohmic electrode 41 and the wiring section 21 are formed on not-illustrated parts outside the pixel section by using lithography and dry etching.

Next, as illustrated in FIG. 8D, an ohmic metallic film 41A to form the ohmic electrode is formed so as to have a thickness of, for example, 500 nm. Then, as illustrated in FIG. 8E, lithography and dry etching are performed on the formed ohmic metallic film 41A to allow a pattern of the metallic film to be remained on the pixel separation region except for on the n-type layers 36, to form the ohmic electrode 41.

The photoelectric conversion section 23 of the solid-state image pickup unit according to the second embodiment is formed by the above-described steps.

Further, not-illustrated optical components and the like may be formed on the photoelectric conversion section 23. For example, a passivation film formed of SiN or the like may be formed on the CIGSSe 37, and a color filter and an optical lens may be formed as necessary.

Further, a PAD opening to connect the solid-state image pickup unit and external apparatuses is formed at a part other than the pixel section by lithography and dry etching.

The solid-state image pickup unit according to the second embodiment illustrated in FIG. 5 is allowed to be manufactured by the above-described steps.

By the above-described manufacturing method, it is possible to from the pixel separation of the photoelectric conversion section without performing processing of the pixel separation on the CIGSSe 37. Accordingly, it is possible to suppress occurrence of the dark current in the solid-state image pickup unit without applying charging of dry etching to the photoelectric conversion section 23 and damage such as defect to the n-type layer 36.

Further, electrical pixel separation of the CIGSSe 37 is allowed to be strengthened by formation of the ohmic electrode 41 and color mixing is allowed to be prevented. An existing well-known method of manufacturing a semiconductor apparatus is applied to facilitate the processing of the ohmic electrode 41, which is suitable for mass production of the solid-state image pickup unit.

<6. Third Embodiment of Solid-State Image Pickup Unit>

Next, a third embodiment of the solid-state image pickup unit is described.

A schematic structure of the solid-state image pickup unit according to the third embodiment is illustrated in FIG. 9. The structure illustrated in FIG. 9 is a sectional view of a main part configuring pixels of the solid-state image pickup unit illustrated in FIG. 1. Incidentally, in the third embodiment, like numerals are used to designate substantially like structures of the above-described first embodiment, and detailed description thereof is omitted.

As illustrated in FIG. 9, the solid-state image pickup unit includes the semiconductor substrate 20, the wiring section 21 disposed on the semiconductor substrate 20, and a photoelectric conversion section 24 disposed on the wiring section 21.

The structures other than the photoelectric conversion section 24 are similar to those in the above-described first embodiment.

The photoelectric conversion section 24 includes the n-type layers 36, the CIGSSe 37 that is the p-type compound semiconductor of the chalcopyrite structure, and the ohmic electrode 41 in order from the semiconductor substrate 20 side. The n-type layers 36 are separated for each pixel, the CIGSSe 37 is formed on the entire surface, and the ohmic electrode 41 is formed only on the pixel separation region. The structure is similar to that in the above-described second embodiment.

In addition, the photoelectric conversion section 24 includes an insulating layer 42 that covers the ohmic electrode 41 and is formed on the CIGSSe 37, and a translucent electrode 43 formed on the insulating layer 42.

With this configuration, a metal-insulator-semiconductor (MIS) structure by the CIGSSe 37, the insulating layer 42, and the translucent electrode 43 is formed in the photoelectric conversion section 24.

In the solid-state image pickup unit with the above-described structure, the structure similar to that in the second embodiment is included, and the n-type layers 36 are separated for each pixel, which makes it possible to electrically separate the CIGSSe 37. Further, the electrical separation of the CIGSSe 37 is allowed to be strengthened by the ohmic electrode 41. In addition, the ohmic electrode 41 on the pixel separation functions as a shielding film, which makes it possible to suppress incident of oblique light between adjacent pixels.

Further, since the insulating layer 42 and the translucent electrode 43 are formed over the entire surface on the CIGSSe 37, the MIS structure formed of metal-insulator-p-type semiconductor is formed.

Therefore, bias lower than that of the ohmic electrode 41 is applied to the translucent electrode 43 so that the voltage of the translucent electrode 43 is increased with respect to the CIGSSe 37. At this time, as illustrated in FIG. 10, holes are accumulated on a bonded surface between the CIGSSe 37 and the insulating layer 42, and thus dense p-type layers 44 (accumulation layers) 44 are formed. As a result, dark current generated from an outermost surface of the CIGSSe 37 at the time when light enters the photoelectric conversion section 24 is allowed to be suppressed.

Further, formation of the thick p-type layers 44 makes it possible to provide gradient of potential to an interface of the CIGSSe 37. Accordingly, it is possible to prevent loss of electrons (carriers) by interface level. Therefore, it is possible to avoid loss of the electrons that are carrier read from the photoelectric conversion section 24 to the semiconductor substrate 20.

<7. Method of Manufacturing Solid-State Image Pickup Unit According to Third Embodiment>

Next, a method of manufacturing the above-described solid-state image pickup unit according to the third embodiment is described. Incidentally, the semiconductor substrate 20 and the wiring section 21 are allowed to be manufactured in a similar way to that in the above-described first embodiment. In addition, the n-type layers 36, the CIGSSe 37, and the ohmic electrode 41 of the photoelectric conversion section 24 are allowed to be manufactured in a similar way to that in the above-described second embodiment. Therefore, in the following description, a step of forming the insulating layer 42 in the photoelectric conversion section 24 is described first.

First, as illustrated in FIG. 11A, the MOS transistors and the like of the semiconductor substrate 20 and the wiring section 21 including the lower electrodes 35 are formed by a similar method to that in the above-described first embodiment. Further, the step of forming the ohmic electrode 41 of the photoelectric conversion section 24 is performed by a similar method to that in the second embodiment.

Next, as illustrated in FIG. 11B, an insulating layer formed of $SiO_2$ or the like is formed so as to cover the entire surface of the CIGSSe 37 and to have a thickness of, for example, 5 nm, to form the insulation layer 42. Then, not-illustrated holes to connect the translucent electrode 43 and the wiring section 21 are formed in the insulating layer 42 by using lithography and dry etching.

Next, as illustrated in FIG. 11C, the translucent electrode 43 is formed on the insulating layer 42 so as to have a thickness of, for example, 500 nm. Then, the translucent electrode 43 at parts other than the pixel section is etched by using lithography and dry etching.

Then, not-illustrated optical components and the like may be formed on the photoelectric conversion section 24. For example, a passivation film formed of SiN or the like may be formed on the translucent electrode 43, and a color filter and an optical lens may be formed as necessary.

Further, a PAD opening to connect the solid-state image pickup unit and external apparatuses is formed at parts other than the pixel section by lithography and dry etching.

The solid-state image pickup unit according to the third embodiment illustrated in FIG. 9 is manufactured by the above-described steps.

<8. Fourth Embodiment of Solid-State Image Pickup Unit>

Next, a fourth embodiment of the solid-state image pickup unit is described. A schematic structure of the solid-state image pickup unit according to the fourth embodiment is illustrated in FIG. 12. The structure illustrated in FIG. 12 is a sectional view of a main part forming pixels of the solid-state image pickup unit illustrated in FIG. 1.

FIG. 12 illustrates a case where a photoelectric conversion section formed of a p-type compound semiconductor of a chalcopyrite structure is applied to a so-called backside irradiation type solid-state image pickup unit in which a MOS circuit is formed on a first surface (a front surface) of a semiconductor substrate and a light receiving surface is formed on a second surface (a rear surface).

As illustrated in FIG. 12, the solid-state image pickup unit includes a semiconductor substrate 50, a wiring section 51, and a photoelectric conversion section 52. The wiring section 51 is formed on a first surface (a front surface) of the semiconductor substrate 50. The photoelectric conversion section 52 is disposed on a second surface (a rear surface) of the semiconductor substrate 50, and the rear surface side provided with the photoelectric conversion section 52 is a light incident surface.

The semiconductor substrate 50 includes a p-type well 53, an n-type floating diffusions (FD sections) 54 disposed in the p-type well 53, and n-type accumulation sections 55 also disposed in the p-type well 53. Further, the semiconductor substrate 50 includes thereon gate electrodes 56 of n-channel MOS transistors. A source and a drain of each of the n-channel MOS transistors are formed by the FD section 54 and the n-type accumulation section 55.

In this structure, one n-type accumulation section 55 forms one pixel. In addition, pixels are separated by the p-type well 53. Moreover, electrons transferred to the n-type accumulation sections 55 are transferred to the FD sections 54 through channels that are formed in the p-type well 53 by the gate electrodes 56. Signals transferred to the FD sections 54 are read out as an image.

The wiring section 51 is configured of a wiring connected to various circuits formed in the semiconductor substrate 50, and an interlayer insulating layer. The wiring is formed of Al, TiN, W, TaN, or the like of COMS wiring.

The photoelectric conversion section 52 includes Cu(In, Ga)(S,Se)$_2$ (CIGSSe) 58 that is a p-type compound semiconductor of a chalcopyrite structure and is formed on a second surface (a rear surface) of the semiconductor substrate 50, and an ohmic electrode 59.

The CIGSSe 58 is formed over the entire rear surface of the semiconductor substrate 50. In addition, the CIGSSe 58 is formed at a predetermined ratio, and may be disposed to be lattice matched with the semiconductor substrate 50, for example, silicon.

The ohmic electrode 59 is formed on the CIGSSe 58, and is disposed only on a pixel separation region. Moreover, the ohmic electrode 59 is formed in a lattice shape in the pixel separation region on the CIGSSe 58 similarly to the structure illustrated in FIG. 6 described above.

The ohmic electrode 59 may be formed of, for example, Ni, Au, carbon, Mo, or the like that is easily ohmically contacted with the p-type compound semiconductor of the chalcopyrite structure.

In the solid-state image pickup unit with the above-described structure, p-n junctions are formed by contact of the n-type accumulation sections 55 and the CIGSSe 58.

Then, depletion layers are formed in the CIGSSe 58 by application of reverse bias to the p-n junctions. Further, an accumulation layer is formed in the CIGSSe 58 directly below the ohmic electrode 59 by application of reverse bias to the n-type accumulation sections 55.

Therefore, in the photoelectric conversion section 52 with the above-described structure, it is possible to electrically separate the CIGSSe 58 for each pixel even without performing physical pixel separation on the CIGSSe 58. Moreover, pixel separation property by the depletion layers in the CIGSSe 58 is allowed to be enhanced by the accumulation layer formed by the ohmic electrode 59.

As described above, since the depletion layers are formed in the CIGSSe 58 for each pixel and the lattice matching between the n-type accumulation sections 55 and the CIGSSe 58 is performed, dark current from an interface between the n-type accumulation sections 55 and the CIGSSe 58 is suppressed. Then, when light is applied to the photoelectric conversion section 52 in this state, electrons generated in the CIGSSe 58 are transferred to the n-type accumulation sections 55 for each pixel.

In the above-described solid-state image pickup unit according to the fourth embodiment, even in the case where the n-type layers that form the p-n junctions with the CIGSSe 58 are the n-type accumulation sections 55 such as a single crystal silicon, that are formed on the semiconductor substrate 50, the photoelectric conversion section with the structure electrically separating the CIGSSe 58 is applicable. In other words, forming the n-type accumulation sections 55 on the rear surface of the semiconductor substrate 50 makes it possible to form the CIGSSe 58 directly on the semiconductor substrate 50.

Moreover, forming the CIGSSe 58 directly on the semiconductor substrate 50 through the lattice matching makes is possible to improve crystallinity on the interface between the n-type accumulation sections 55 and the CIGSSe 58.

Accordingly, it is possible to suppress occurrence of dark current from the bonded surface of the p-n junction.

<9. Method of Manufacturing Solid-State Image Pickup Unit According to Fourth Embodiment>

Next, a method of manufacturing the above-described solid-state image pickup unit according to the fourth embodiment is described.

First, as illustrated in FIG. 13A, the n-type floating diffusions (the FD sections) 54 and the n-type accumulation sections 55 are formed in the p-type well 53 of the semiconductor substrate 50. Then, the gate electrodes 56 of the n-channel MOS transistors are formed on the first surface of the semiconductor substrate 50.

Further, the wiring section 51 is formed on the first surface of the semiconductor substrate 50.

The semiconductor substrate 50 and the wiring section 51 are allowed to be formed by process steps of a normal backside irradiation type CMOS image sensor.

Next, after the second surface of the semiconductor substrate 50 is exposed by polishing or wet etching, an insulating layer formed of $SiO_2$ or the like is formed so as to have a thickness of, for example, 100 nm. Then, the insulating layer of the pixel section is patterned by lithography and dry etching.

Next, as illustrated in FIG. 13B, the CIGSSe 58 is formed by vacuum evaporation method, sputtering, or the like so as to have a thickness of, for example, 1000 nm. At this time, the CIGSSe 58 is formed at a predetermined composition ratio so as to be lattice matched with silicon.

Next, patterning to remove the CIGSSe 58 at parts other than the pixel section is performed by lithography. For example, the CIGSSe 37 and the ohmic metallic film 38 may be etched by wet etching. For example, performing wet etching using Br methanol or the like may make it possible to etch the CIGSSe 58 and to allow the insulating layer to be remained.

Next, holes to connect the ohmic electrode 59 and the wiring section 51 are formed on not-illustrated parts outside the pixel section by using lithography and dry etching. Then, as illustrated in FIG. 13C, an ohmic metallic film 59A is formed on the CIGSSe 58 so as to have a thickness of, for example, 500 nm.

Next, as illustrated in FIG. 13D, the ohmic electrode 59 is patterned by using lithography and dry etching. For example, when the ohmic electrode 59 is formed of Ni, wet etching may be performed with use of nitric acid or the like.

Next, not-illustrated optical components and the like may be formed on the photoelectric conversion section 52. For example, a passivation film formed of SiN or the like may be formed on the CIGSSe 58, and a color filter and an optical lens may be formed as necessary.

Further, a PAD opening to connect the solid-state image pickup unit and external apparatuses is formed at a part other than the pixel section by lithography and dry etching.

The solid-state image pickup unit according to the fourth embodiment illustrated in FIG. 12 is allowed to be manufactured by the above-described steps.

<10. Fifth Embodiment of Solid-State Image Pickup Unit>

Next, a fifth embodiment of the solid-state image pickup unit is described.

A schematic structure of the solid-state image pickup unit according to the fifth embodiment is illustrated in FIG. 14. The structure illustrated in FIG. 14 is a sectional view of a main part forming pixels of the solid-state image pickup unit illustrated in FIG. 1. Incidentally, in the fifth embodiment, like numerals are used to designate substantially like structures of the above-described first embodiment, and detailed description thereof is omitted.

As illustrated in FIG. 14, the solid-state image pickup unit includes the semiconductor substrate 20, the wiring section 21 disposed on the semiconductor substrate 20, and a photoelectric conversion section 25 disposed on the wiring section 21. The structures other than the photoelectric conversion section 25 are similar to those in the above-described first embodiment.

The photoelectric conversion section 25 includes the n-type layer 36, a p-type impurity region 45 formed in the n-type layer 36, the CIGSSe 37 that is the p-type compound semiconductor of the chalcopyrite structure, and the ohmic electrode 41 in order from the above-described semiconductor substrate 20 side. Incidentally, the photoelectric conversion section 25 has a similar structure to that in the above-described second embodiment except for the structures of the n-type layer 36 and the p-type impurity region 45, and thus like numerals are used and detailed description thereof is omitted.

The n-type layer 36 is formed of an n-type low-resistance layer and an n-type high-resistance layer disposed on the n-type low-resistance layer. Further, the p-type impurity region 45 is formed in the pixel separation region of the n-type layer 36.

The lower electrodes 35 of the wiring section 21 are connected to the n-type layer 36 at parts other than the p-type impurity region 45.

The p-type impurity region 45 is formed through ion injection of group 15 elements such as nitrogen to the pixel separation region of the n-type layer 36. For example, when the n-type layer 36 is formed of a low-resistance ZnO layer and a high-resistance ZnO layer, the p-type ZnO layer is formed through ion injection of nitrogen to the pixel separation region.

Moreover, the p-type impurity region 45 is continuously formed in a lattice shape in the n-type layer 36 along the separation section of adjacent pixels in the pixel section of the solid-state image pickup unit.

The n-type layer is separated for each pixel by the p-type impurity region 45, which makes it possible to separate the n-type layer 36 for each pixel without performing the pixel separation by etching or the like. Therefore, the n-type layer 36 is allowed to be formed as a single film over the entire surface of the pixel section on the wiring section 21.

In the solid-state image pickup unit with the above-described structure, p-n junctions are formed by contact of the n-type layer 36 and the CIGSSe 37, and reverse bias is applied to form the depletion layers in the CIGSSe 37.

Therefore, even in the n-type layer 36 separated for each pixel by the p-type impurity region 45, the depletion layers are allowed to be formed for each pixel in the CIGSSe 37 without performing device separation processing on the CIGSSe 37.

Moreover, the ohmic electrode 41 is formed on the CIGSSe 37 at a position corresponding to the p-type impurity region. When reverse bias is applied to the n-type layer 36, the ohmic electrode 41 forms the accumulation layer in the CIGSSe 37. Therefore, as the potential distribution of the pixel section illustrated in FIG. 7 described above, the accumulation layer formed in the CIGSSe 37 by the ohmic electrode 41 enhances the separation property of the depletion layers for each pixel in the CIGSSe 37.

When light is applied to the CIGSSe 37 in this state, electrons generated by the photoelectric conversion are transferred for each pixel from the n-type layer 36 to the n-type accumulation sections 33 through the lower electrodes 35 and the wiring section 21. In addition, positive holes generated by application of light to the CIGSSe 37 are discharged to the ohmic electrode 41. Accordingly, the positive holes generated by the photoelectric conversion may not be transferred for each pixel.

Moreover, in the solid-state image pickup unit with the above-described structure, the photoelectric conversion section 25 is allowed to be formed separately for each pixel without performing etching processing on both the CIGSSe 37 and the n-type layer 36. Further, since the processing such as etching is not performed on the n-type layer, interface level is allowed to be reduced. As a result, it is possible to suppress occurrence of dark current caused by interface level by processing.

<11. Method of Manufacturing Solid-State Image Pickup Unit According to Fifth Embodiment>

Next, a method of manufacturing the above-described solid-state image pickup unit according to the fifth embodiment is described. Incidentally, the semiconductor substrate 20 and the wiring section 21 are allowed to be manufactured in a similar way to that in the above-described first embodiment. Accordingly, in the following description, a method of manufacturing the photoelectric conversion section 25 is described first.

First, as illustrate in FIG. 15A, the MOS transistors and the like of the semiconductor substrate 20 and the wiring section 21 including the lower electrodes 35 are formed by a similar method to that in the above-described first embodiment.

Next, a not-illustrated insulating layer formed of $SiO_2$ or the like is formed on the wiring section 21 so as to have a thickness of, for example, 100 nm. Then, in the pixel section, holes to connect the lower electrodes 35 and the n-type layer 36 are patterned by lithography and dry etching. Then, as illustrated in FIG. 15B, the n-type layer 36 is formed by sputtering or the like so as to have a thickness of, for example, 100 nm.

Next, impurity such as group 15 elements is injected into the pixel separation region of the n-type layer 36 by lithography and ion injection. As a result, as illustrated in FIG. 15C, for example, the p-type impurity region 45 such as a p-type ZnO layer may be formed in the pixel separation region of the n-type layer 36.

Next, as illustrated in FIG. 15D, the CIGSSe 37 is formed by vacuum evaporation method, sputtering, or the like so as to have a thickness of, for example, 1000 nm. Further, patterning to remove the CIGSSe 37 at parts other than the pixel section is performed by lithography and wet etching. For example, the CIGSSe 37 at the parts other than the pixel section may be etched by wet etching using Br methanol or the like.

Subsequently, holes to connect the ohmic electrode 41 and the wiring section 21 are formed in not-illustrated parts outside the pixel section by using lithography and dry etching.

Then, as illustrated in FIG. 15E, the ohmic metallic film 41A to form the ohmic electrode 41 is formed so as to have a thickness of, for example, 500 nm. Then, as illustrated in FIG. 15F, lithography and dry etching are performed on the formed ohmic metallic film 41A to allow a pattern of the metallic film to be remained on the pixel separation region except for on the n-type layer 36, to form the ohmic electrode 41.

Next, not-illustrated optical components and the like may be formed on the photoelectric conversion section 25. For example, a passivation film formed of SiN or the like may be formed on the CIGSSe 37, and a color filter and an optical lens may be formed as necessary.

Further, a PAD opening to connect the solid-state image pickup unit and external apparatuses is formed at a part other than the pixel section by lithography and dry etching.

The solid-state image pickup unit according to the fifth embodiment illustrated in FIG. 14 is allowed to be manufactured by the above-described steps.

By the above-described manufacturing method, forming the p-type impurity region 45 makes it possible to form the pixel separation without performing dry etching processing for the pixel separation on the n-type layer 36. Therefore, it is possible to suppress occurrence of dark current in the solid-state image pickup unit without applying charging by dry etching and damage such as defect to the n-type layer 36. Further, it is possible to suppress occurrence of dark current caused by the interface level of the pixel separation region of the n-type layer 36, which is generated by etching.

<12. Sixth Embodiment of Solid-State Image Pickup Unit>

Next, a sixth embodiment of the solid-state image pickup unit is described.

A schematic structure of the solid-state image pickup unit according to the sixth embodiment is illustrated in FIG. 16. The structure illustrated in FIG. 16 is a sectional view of a main part configuring pixels of the solid-state image pickup unit illustrated in FIG. 1. Incidentally, in the sixth embodiment, like numerals are used to designate substantially like structures of the above-described first embodiment, and detailed description thereof is omitted.

As illustrated in FIG. 16, the solid-state image pickup unit includes the semiconductor substrate 20, the wiring section 21 disposed on the semiconductor substrate 20, and a photoelectric conversion section 26 disposed on the wiring section 21. The structures other than the photoelectric conversion section 26 are similar to those in the above-described first embodiment.

The photoelectric conversion section 26 includes the n-type layer 36, the p-type impurity region 45 formed in the n-type layer 36, the CIGSSe 37 that is the p-type compound semiconductor of the chalcopyrite structure, and the ohmic electrode 41 in order from the semiconductor substrate 20 side. Incidentally, the photoelectric conversion section 26 has a structure similar to that in the above-described second embodiment except for the structures of the n-type layer 36 and the p-type impurity region 45, and thus like numerals are used and detailed description thereof is omitted.

The n-type layer 36 is formed of an n-type low-resistance layer and an n-type high-resistance layer disposed on the n-type low-resistance layer. Further, the p-type impurity region 45 and an insulating layer region 46 are formed in the pixel separation region of the n-type layer 36. The insulating layer region 46 is formed in a center part of the pixel separation region.

The lower electrodes 35 of the wiring section 21 are connected to the n-type layer 36 at parts other than the p-type impurity region 45.

The p-type impurity region 45 is formed through ion injection of group 15 elements such as nitrogen to the pixel separation region of the n-type layer 36. For example, when the n-type layer is formed of a low-resistance ZnO layer and a high-resistance ZnO layer, the p-type ZnO layer is formed through ion injection of nitrogen to the pixel separation region.

Further, the center part of the p-type impurity region 45 is etched and an insulating material is formed in an etched region to form the insulating layer region 46. Accordingly, the insulating layer region 46 is continuously formed in a lattice shape along a separation section of the pixels of the n-type layer 36 and the p-type impurity region 45, in the pixel section of the solid-state image pickup unit.

Then, the p-type impurity region 45 is formed to surround periphery of the n-type layer 36 in the pixel region of the solid-state image pickup unit.

In the solid-state image pickup unit with the above-described structure, p-n junctions are formed by contact of the n-type layer 36 and the CIGSSe 37, and reverse bias is applied to form depletion layers in the CIGSSe 37.

Therefore, even in the n-type layer 36 separated for each pixel by the p-type impurity region 45, the depletion layers are formed for each pixel in the CIGSSe 37 without performing the device separation processing on the CIGSSe 37.

When light is applied to the CIGSSe 37 in this state, electrons generated by the photoelectric conversion are transferred for each pixel from the n-type layer 36 to the n-type accumulation sections 33 through the lower electrodes 35 and the wiring section 21. Further, positive holes generated by irradiation of light to the CIGSSe 37 are discharge to the ohmic electrode 41. Therefore, it is unnecessary to transfer the positive holes generated by the photoelectric conversion for each pixel.

Moreover, the ohmic electrode 41 with the above-described structure is formed on the CIGSSe 37 at a position corresponding to the insulating layer region 46. When reverse bias is applied to the n-type layer 36, the ohmic electrode 41 forms the accumulation layer in the CIGSSe 37. Therefore, as the potential distribution of the pixel section illustrated in FIG. 7 described above, the accumulation layer formed in the CIGSSe 37 by the ohmic electrode 41 enhances the separation property of the depletion layers for each pixel in the CIGSSe 37.

Moreover, in the solid-state image pickup unit with the above-described structure, the insulating layer region 46 is formed at the center part of the p-type impurity region 45, and thus the n-type layer 36 is separated for each pixel by the p-type impurity region 45 and the insulating layer region 46. Accordingly, even in the case where a width of the pixel separation region is small, it is possible to separate pixels surely.

Further, since the p-type impurity region 45 is formed at ends of the n-type layer 36, it is possible to suppress occurrence of dark current caused by interface level by etching of the n-type layer 36.

As described above, since the pixels are allowed to be sufficiently separated from one another even in the case where the width of the pixel separation region is small, it is possible to achieve micro-fabrication of the pixels in the solid-state image pickup unit.

In addition, reducing the width of the pixel separation section makes it possible to increase an area of the light receiving surface with the same pixel area. Therefore, it is possible to improve sensitivity characteristics of the solid-state image pickup unit.

<13. Method of Manufacturing Solid-State Image Pickup Unit According to Sixth Embodiment>

Next, a method of manufacturing the above-described solid-state image pickup unit according to the sixth embodiment is described. Incidentally, the semiconductor substrate 20 and the wiring section 21 are allowed to be manufactured in a similar way to that in the above-described first embodiment. Accordingly, in the following description, a method of manufacturing the photoelectric conversion section 26 is described first.

First, as illustrated in FIG. 17A, the MOS transistors and the like of the semiconductor substrate 20 and the wiring section 21 including the lower electrodes 35 are formed by a similar method to that in the above-described first embodiment.

Next, a not-illustrated insulating layer formed of $SiO_2$ or the like is formed on the wiring section 21 so as to have a thickness of, for example, 100 nm. Then, in the pixel section, holes to connect the lower electrodes 35 and the n-type layer 36 are patterned by lithography and dry etching. Then, as illustrated in FIG. 17B, the n-type layer 36 is formed by sputtering or the like so as to have a thickness of, for example, 100 nm.

Next, impurity such as group 15 elements is injected into the pixel separation region of the n-type layer 36 by lithography and ion injection. As a result, the p-type impurity region 45 such as a p-type ZnO layer may be formed in the pixel separation region of the n-type layer 36 as illustrated in FIG. 17C.

Next, as illustrated in FIG. 17D, the center part of the p-type impurity region 45 is removed by lithography and dry etching to form a pixel separation section 46A. As a result, the n-type layer 36 and the p-type impurity region at the ends of the n-type layer 36 are separated for each pixel.

Subsequently, as illustrated in FIG. 17E, after an insulating layer formed of $SiO_2$ or the like is formed so as to have a thickness of, for example, 100 nm, the insulating layer is planarized by using CMP method or the like to form the insulating layer region 46 at the center part of the p-type impurity region 45.

Then, as illustrated in FIG. 17F, the CIGSSe 37 is formed by vacuum evaporation method, sputtering, or the like so as to have a thickness of, for example, 1000 nm. Further, patterning to remove the CIGSSe 37 at parts other than the pixel section is performed by lithography and wet etching.

For example, the CIGSSe 37 at the parts other than the pixel section may be etched by wet etching using Br methanol or the like.

Next, holes to connect the ohmic electrode 41 and the wiring section 21 are formed at not-illustrated parts outside the pixel section by using lithography and dry etching.

Then, as illustrated in FIG. 17G, the ohmic metallic film 41A to form the ohmic electrode 41 is formed so as to have a thickness of, for example, 500 nm. Then, as illustrated in FIG. 17H, lithography and dry etching are performed on the formed ohmic metallic film 41A to allow a pattern of the metallic film to be remained on the pixel separation region except for on the n-type layer 36, to form the ohmic electrode 41.

Subsequently, not-illustrated optical components and the like may be formed on the photoelectric conversion section 26. For example, a passivation film formed of SiN or the like may be formed on the CIGSSe 37, and a color filter and an optical lens may be formed as necessary.

Further, a PAD opening to connect the solid-state image pickup unit and external apparatuses is formed at a part outside the pixel section by lithography and dry etching.

The solid-state image pickup unit according to the sixth embodiment illustrated in FIG. 16 is allowed to be manufactured by the above-described steps.

<14. Seventh Embodiment of Solid-State Image Pickup Unit>

Next, a seventh embodiment of the solid-state image pickup unit is described.

A schematic structure of the solid-state image pickup unit according to the seventh embodiment is illustrated in FIG. 18. The structure illustrated in FIG. 18 is a sectional view of a main part configuring the pixels of the solid-state image pickup unit illustrated in FIG. 1.

FIG. 18 illustrates a case where a photoelectric conversion section configured of a p-type compound semiconductor of a chalcopyrite structure is applied to a so-called backside irradiation type solid-state image pickup unit in which a MOS circuit is formed on a first surface (a front surface) of a semiconductor substrate and a light receiving surface is formed on a second surface (a rear surface).

As illustrated in FIG. 18, the solid-state image pickup unit includes a semiconductor substrate 60, the wiring section 51, and the photoelectric conversion section 52. The wiring section 51 is formed on a first surface (a front surface) of the semiconductor substrate 60. The photoelectric conversion section 52 is disposed on a second surface (a rear surface) side of the semiconductor substrate 60, and the rear surface side provided with the photoelectric conversion section 52 is a light incident surface.

Incidentally, the structures other than the semiconductor substrate 60 are similar to those in the above-described fourth embodiment, and thus like numerals are used and detailed description thereof is omitted.

The semiconductor substrate 60 includes the p-type well 53, the n-type floating diffusions (FD sections) 54 disposed in the p-type well 53, and the n-type accumulation sections 55 also disposed in the p-type well 53. Further, the semiconductor substrate 60 includes thereon the gate electrodes 56 of the n-channel MOS transistors. A source and a drain of each of the n-channel MOS transistors are formed by the FD section 54 and the n-type accumulation section 55.

In this structure, one n-type accumulation section 55 forms one pixel. In addition, pixels are separated by the p-type wells 53. Further, an insulating layer region 61 is formed at a center part of the p-type well 53 in the pixel separation region.

In addition, electrons transferred to the n-type accumulation sections 55 are transferred to the FD sections 54 through channels formed in the p-type well 53 by the gate electrodes 56. Signals transferred to the FD sections 54 are read out as an image.

The insulating layer region 61 is formed continuously in a lattice shape in the p-type well 53 along the separation section of adjacent pixels in the pixel section of the solid-state image pickup unit. Moreover, preferably, a formation depth from a rear surface side of the insulating layer region 61 may be substantially equivalent to a depth at a part where the n-type accumulation sections 55 are close to one another below the gate electrodes 56. Since the n-type accumulation sections 55 are electrically separated by the p-type well 53, the n-type accumulation sections 55 may not be necessarily separated completely by the insulating layer region 61. The depth of the insulating layer region 61 is determined in consideration of accuracy in manufacturing steps, embedding property of the insulating layer, and the like. For example, the insulating layer region 61 may be formed so as to have a depth of about 300 nm.

In the solid-state image pickup unit with the above-described structure, p-n junctions are formed by contact of the CIGSSe 58 of the photoelectric conversion section 52 and the n-type accumulation sections 55 of the semiconductor substrate 60. Then, when reverse bias is applied to the p-n junctions, the depletion layers are formed in the CIGSSe 58. Further, when reverse bias is applied to the n-type accumulation sections 55, the accumulation layer is formed in the CIGSSe 58 directly below the ohmic electrode 59.

Therefore, in the photoelectric conversion section 52 with the above-described structure, it is possible to electrically separate the CIGSSe 58 for each pixel even without performing physical pixel separation of the CIGSSe 58. Moreover, the accumulation layer formed by the ohmic electrode 59 enhances the pixel separation property of the depletion layers in the CIGSSe 58.

When light is applied to the CIGSSe 58 in this state, electrons generated by the photoelectric conversion are transferred to the n-type accumulation sections 55 for each pixel. In addition, positive holes generated by light irradiation to the CIGSSe 58 are discharged to the ohmic electrode 59. Therefore, it is unnecessary to transfer the positive holes generated by the photoelectric conversion, for each pixel.

In addition, in the solid-state image pickup unit with the above-described structure, the insulating layer region 61 is formed at the center part of the p-type well 53, and the n-type accumulation sections 55 are separated for each pixel by the p-type well 53 and the insulating layer region 61. Therefore, even when the width of the pixel separation region is small, it is possible to surely separate pixels.

As described above, since the pixels are allowed to be sufficiently separated even when the width of the pixel separation region is small, it is possible to perform microfabrication of the pixels of the solid-state image pickup unit.

Moreover, reducing the width of the pixel separation region with the same pixel area makes it possible to increase an area of the light receiving surface. Accordingly, it is possible to improve sensitivity characteristics of the solid-state image pickup unit.

<15. Method of Manufacturing Solid-State Image Pickup Unit According to Seventh Embodiment>

Next, a method of manufacturing the above-described solid-state image pickup unit according to the seventh embodiment is described.

First, as illustrated in FIG. 19A, the n-type floating diffusions (the FD sections) 54 and the n-type accumulation sections 55 are formed in the p-type well 53 of the semiconductor substrate 60. Then, the gate electrodes 56 of the n-channel MOS transistors are formed on the first surface of the semiconductor substrate 60.

Further, the wiring section 51 is formed on the first surface of the semiconductor substrate 60.

The semiconductor substrate 60 and the wiring section 51 are allowed to be manufactured by process steps of a normal backside irradiation type CMOS image sensor.

Next, after the second surface of the semiconductor substrate 60 is exposed by polishing and wet etching, for example, SiO$_2$ is formed so as to have a thickness of 10 nm, and then a film of SiN is formed so as to have a thickness of 150 nm. Then, patterning is performed by lithography and dry etching to remove the insulating layer of the pixel section.

Next, as illustrated in FIG. 19B, lithography and dry etching are performed to form STI 61A at the center part of each of the p-type wells 53 so as to have a depth of about 300 nm.

Then, as illustrated in FIG. 19C, after an insulating layer formed of SiO$_2$ or the like is formed so as to have a thickness of, for example, 100 nm, the insulating layer is planarized by CMP method or the like to form the insulating layer region 61 in each of the p-type wells 53.

Further, after SiN is removed by wet etching using phosphoric acid or the like, SiO$_2$ of the pixel section is removed by lithography and wet etching.

Subsequently, as illustrated in FIG. 19D, the CIGSSe 58 is formed on the semiconductor substrate 60 by vacuum evaporation method, sputtering, or the like so as to have a thickness of, for example, 1000 nm. At this time, the CIGSSe 58 is formed at a predetermined ratio so as to be lattice matched with the semiconductor substrate 60.

Next, patterning to remove the CIGSSe 58 at parts other than the pixel section is performed by lithography. For example, the CIGSSe 37 may be etched by wet etching. For example, the wet etching may be performed with use of Br methanol or the like to etch the CIGSSe 58, and thus SiO$_2$ at the parts other than the pixel section is allowed to be remained.

Next, holes to connect the ohmic electrode 59 and the wiring section 51 are formed on not-illustrated parts outside the pixel section by using lithography and dry etching. Then, as illustrated in FIG. 19E, an ohmic metallic film 59A is formed on the CIGSSe 58 so as to have a thickness of, for example, 500 nm.

Then, patterning of the ohmic electrode 59 is performed by using lithography and dry etching as illustrated in FIG. 19F. For example, when the ohmic electrode 59 is formed of Ni, wet etching may be performed with use of nitric acid or the like.

Subsequently, not-illustrated optical components and the like may be formed on the photoelectric conversion section 52. For example, a passivation film formed of SiN or the like may be formed on the CIGSSe 58, and a color filter and an optical lens may be formed as necessary.

Further, a PAD opening to connect the solid-state image pickup unit and external apparatuses is formed at a part other than the pixel section by lithography and dry etching.

The solid-state image pickup unit according to the seventh embodiment illustrated in FIG. 18 is allowed to be manufactured by the above-described steps.

<16. Eighth Embodiment of Solid-State Image Pickup Unit>

Next, an eighth embodiment of the solid-state image pickup unit is described.

A schematic structure of the solid-state image pickup unit according to the eighth embodiment is illustrated in FIG. 20. The structure illustrated in FIG. 20 is a sectional view of a main part forming the pixels of the solid-state image pickup unit illustrated in FIG. 1. Incidentally, in the eighth embodiment, like numerals are used to designate substantially like structures of the above-described first embodiment, and detailed description thereof is omitted.

As illustrated in FIG. 20, the solid-state image pickup unit includes the semiconductor substrate 20, the wiring section 21 disposed on the semiconductor substrate 20, and a photoelectric conversion section 27 disposed on the wiring section 21. The structures other than the photoelectric conversion section 27 are similar to those in the above-described first embodiment.

The photoelectric conversion section 27 includes the n-type layer 36, the CIGSSe 47 that is the p-type compound semiconductor of the chalcopyrite structure, and the ohmic electrode 41 in order from the above-described semiconductor substrate 20 side. Incidentally, the p-type impurity region 45 is formed in the pixel separation region of the n-type layer 36. Further, an insulating layer 48 is formed on the p-type impurity region 45. Incidentally, the photoelectric conversion section 27 has a similar structure to that in the above-described second embodiment or the above-described sixth embodiment except for the structures of the CIGSSe 47 and the insulating layer 48, and thus like numerals are used and detailed description thereof is omitted.

The insulating layer 38 is formed only in the pixel separation region of the solid-state image pickup unit. The insulating layer 48 is formed so as to have a formation width equal to or larger than the formation width of the p-type impurity region 45, and has a structure not allowing the p-type impurity region 45 to be exposed. As a result, the insulating layer 48 is interposed between the CIGSSe 47 and the p-type impurity region 45. Accordingly, the CIGSSe 47 as the p-type semiconductor and the p-type impurity region 45 are not in contact with each other. Moreover, since the insulating layer 48 is formed only in the pixel separation region, contact between the n-type layer 36 and the CIGSSe 47 is not prevented in the pixels.

In the solid-state image pickup unit with the above-described structure, p-n junctions are formed by contact of the n-type layer 36 and the CIGSSe 47, and reverse bias is applied to form the depletion layers in the CIGSSe 37. Moreover, the n-type layer 36 is separated for each pixel by the p-type impurity region 45. The CIGSSe 47 is separated by the depletion layers formed for each pixel and the accumulation layer formed by the ohmic electrode 41.

When light is applied to the CIGSSe 47 in this state, electrons generated by the photoelectric conversion are transferred for each pixel from the n-type layer 36 to the n-type accumulation sections 33 through the lower electrodes 35 and the wiring section 21. Moreover, positive holes generated by light irradiation to the CIGSSe 37 are discharged to the ohmic electrode 41. Therefore, it is unnecessary to transfer the positive holes generated by the photoelectric conversion, for each pixel.

Moreover, since the solid-state image pickup unit with the above-described structure has a structure in which an interface is not formed between the CIGSSe 47 and the p-type impurity region 45, it is possible to suppress occurrence of dark current from an interface between the p-type impurity region 45 and the p-type semiconductor of the chalcopyrite structure.

In addition, since the p-type impurity region 45 is formed at ends of the n-type layer 36, it is possible to suppress occurrence of the dark current caused by interface level by etching of the n-type layer 36.

As described above, in the solid-state image pickup unit with the above-described structure, dark current from the respective structures are allowed to be effectively suppressed.

<17. Method of Manufacturing Solid-State Image Pickup Unit According to Eighth Embodiment>

Next, a method of manufacturing the above-described solid-state image pickup unit according to the eighth embodiment is described. Incidentally, the semiconductor substrate 20 and the wiring section 21 are allowed to be manufactured in a similar way to that in the above-described first embodiment. Accordingly, in the following description, a method of manufacturing the photoelectric conversion section 27 is described first.

First, as illustrate in FIG. 21A, the MOS transistors and the like of the semiconductor substrate 20 and the wiring section 21 including the lower electrodes 35 are formed by a similar method to that in the above-described first embodiment.

Next, a not-illustrated insulating layer formed of $SiO_2$ or the like is formed on the wiring section 21 so as to have a thickness of, for example, 100 nm. Then, in the pixel section, holes to connect the lower electrodes 35 and the n-type layer 36 are patterned by lithography and dry etching. Then, as illustrated in FIG. 21B, the n-type layer 36 is formed by sputtering or the like so as to have a thickness of, for example, 100 nm.

Next, impurity such as group 15 elements is injected into the pixel separation region of the n-type layer 36 by lithography and ion injection. As a result, as illustrated in FIG. 21C, for example, the p-type impurity region 45 such as a p-type ZnO layer may be formed in the pixel separation region of the n-type layer 36.

Next, as illustrated in FIG. 21D, an insulating layer formed of $SiO_2$ or the like is formed on the entire surface of the n-type layer 36 so as to have a thickness of, for example, 100 nm. Further, holes to connect the n-type layer 36 and the CIGSSe 47 are patterned by lithography and dry etching. As a result, the insulating layer 48 covering the p-type impurity region 45 is formed in the pixel section.

Subsequently, as illustrated in FIG. 21E, the CIGSSe 47 covering the n-type layer 36 and the insulating layers 48 is formed by vacuum evaporation method, sputtering, or the like so as to have a thickness of, for example, 1000 nm. Further, patterning to remove the CIGSSe 47 at a part other than the pixel section is performed by lithography and wet etching. For example, the CIGSSe 47 at the part other than the pixel section may be etched by wet etching using Br methanol or the like.

Next, holes to connect the ohmic electrode 41 and the wiring section 21 are formed at not-illustrated parts outside the pixel section by using lithography and dry etching. Then, an ohmic metallic film to form the ohmic electrode is formed so as to have a thickness of, for example, 500 nm. Further, as illustrated in FIG. 21F, lithography and dry etching are performed on the formed ohmic metallic film to allow a pattern of a metallic film to be remained on the pixel separation region other than on the n-type layer 36, to form the ohmic electrode 41.

Next, not-illustrated optical components and the like may be formed on the photoelectric conversion section 27. For example, a passivation film formed of SiN or the like may be formed on the CIGSSe 47, and a color filter and an optical lens may be formed as necessary.

Further, a PAD opening to connect the solid-state image pickup unit and external apparatuses is formed at a part other than the pixel section by lithography and dry etching.

The solid-state image pickup unit according to the eighth embodiment illustrated in FIG. 20 is allowed to be manufactured by the above-described steps.

<18. Ninth Embodiment of Solid-State Image Pickup Unit>

Next, a ninth embodiment of the solid-state image pickup unit is described.

A schematic structure of the solid-state image pickup unit according to the ninth embodiment is illustrated in FIG. 22. The structure illustrated in FIG. 22 is a sectional view of a main part configuring the pixels of the solid-state image pickup unit illustrated in FIG. 1.

FIG. 22 illustrates a case where a photoelectric conversion section configured of a p-type compound semiconductor of a chalcopyrite structure is applied to a so-called backside irradiation type solid-state image pickup unit in which a MOS circuit is formed on a first surface (a front surface) of a semiconductor substrate and a light receiving surface is formed on a second surface (a rear surface).

As illustrated in FIG. 22, the solid-state image pickup unit includes the semiconductor substrate 50, the wiring section 51, and a photoelectric conversion section 62. The wiring section 51 is formed on a first surface (a front surface) of the semiconductor substrate 50. The photoelectric conversion section 62 is disposed on a second surface (a rear surface) side of the semiconductor substrate 50, and the rear surface side provided with the photoelectric conversion section 62 is a light incident surface.

Incidentally, the structures other than the photoelectric conversion section 62 are similar to those in the above-described fourth embodiment or the above-described seventh embodiment, and thus like numerals are used and detailed description thereof is omitted.

The photoelectric conversion section 62 includes an insulating layer 64, CIGSSe 63 that is a p-type compound semiconductor of a chalcopyrite structure, and the ohmic electrode 59.

The insulating layer 64 is formed so as to cover an exposed surface of the p-type well 53 that is formed on the second surface of the semiconductor substrate 50. Moreover, the insulating layer 64 is formed only in the pixel separation region of the solid-state image pickup unit.

The CIGSSe 63 is formed on the second surface (the rear surface) of the second substrate 50 so as to cover the insulating layer 64. The insulating layer 64 formed on the p-type wells 53 prevents the CIGSSe 63 and the p-type well 53 from being directly in contact with each other. Moreover, the CIGSSe 63 is disposed to be lattice matched with the semiconductor substrate 50, for example, silicon.

The ohmic electrode 59 is formed on the CIGSSe 63, and is disposed only on the pixel separation region. In addition, the ohmic electrode 59 is formed in a lattice shape in the pixel separation region on the CIGSSe 58 similarly to the structure illustrated in FIG. 6 described above.

In the solid-state image pickup unit with the above-described structure, p-n junctions are formed by contact of the CIGSSe 63 of the photoelectric conversion section 62 and the n-type accumulation sections 55 of the semiconductor substrate 50. Further, when reverse bias is applied to the p-n junctions, the depletion layers are formed in the CIGSSe 58 and the accumulation layer is formed in the CIGSSe 58 directly below the ohmic electrode 59.

When light is applied to the CIGSSe 63 in this state, electrons generated by the photoelectric conversion are transferred to the n-type accumulation sections 55 for each pixel. Moreover, positive holes generated by light irradiation to the CIGSSe 63 are discharged to the ohmic electrode 59. Accordingly, it is unnecessary to transfer the positive holes generated by the photoelectric conversion, for each pixel.

Further, since the solid-state image pickup unit with the above-described structure has a structure in which an interface is not formed between the CIGSSe 63 and the p-type wells 53, it is possible to suppress occurrence of dark current from the interface between the CIGSSe 63 as the p-type compound semiconductor and the p-type wells 53.

As described above, in the solid-state image pickup unit with the above-described structure, it is possible to effectively suppress occurrence of dark current.

<19. Method of Manufacturing Solid-State Image Pickup Unit According to Ninth Embodiment>

Next, a method of manufacturing the above-described solid-state image pickup unit according to the ninth embodiment is described.

First, as illustrated in FIG. 23A, the n-type floating diffusions (the FD sections) 54 and the n-type accumulation sections 55 are formed in the p-type wells 53 of the semiconductor substrate 50. Then, the gate electrodes 56 of the n-channel MOS transistors are formed on the first surface of the semiconductor substrate 50.

Further, the wiring section 51 is formed on the first surface of the semiconductor substrate 50.

The semiconductor substrate 50 and the wiring section 51 are allowed to be manufactured by process steps of a normal backside irradiation type CMOS image sensor.

Next, after the second surface of the semiconductor substrate 50 is exposed by polishing and wet etching, an insulating layer formed of $SiO_2$ or the like is formed on the entire surface of the semiconductor substrate 50 so as to have a thickness of, for example, 100 nm. Then, holes to connect the n-type accumulation sections 55 and the CIGSSe 63 are patterned by lithography and dry etching. As a result, the insulating layer 64 is formed in a region other than the pixel section and in a region covering the p-type wells 53 of the pixel section.

Subsequently, as illustrated in FIG. 23C, the CIGSSe 63 that covers the semiconductor substrate 50 and the insulating layer 64 is formed by vacuum evaporation method, sputtering, or the like so as to have a thickness of, for example, 1000 nm. At this time, the CIGSSe 63 is formed at a predetermined ratio so as to be lattice matched with the semiconductor substrate 50.

Then, patterning to remove the CIGSSe 63 at parts other than the pixel section is performed by lithography. For example, the CIGSSe 63 may be etched by wet etching. For example, wet etching is performed using Br methanol or the like to etch the CIGSSe 63, and the insulating layer at the parts other than the pixel section is allowed to be remained.

Next, holes to connect the ohmic electrode 59 and the wiring section 51 are formed at a not-illustrated part outside the pixel section by using lithography and dry etching. Then, an ohmic metallic film to form the ohmic electrode 59 is formed so as to have a thickness of, for example, 500 nm.

Further, as illustrated in FIG. 23D, lithography and dry etching are performed on the formed ohmic metallic film to allow a pattern of the metallic film to be remained on the pixel separation section, to form the ohmic electrode 59.

Subsequently, not-illustrated optical components and the like may be formed on the photoelectric conversion section 62. For example, a passivation film formed of SiN or the like may be formed on the CIGSSe 63, and a color filter and an optical lens may be formed as necessary.

Further, a PAD opening to connect the solid-state image pickup unit and external apparatuses is formed in a part other than the pixel section by lithography and dry etching.

The solid-state image pickup unit according to the ninth embodiment illustrated in FIG. 22 is allowed to be manufactured by the above-described steps.

<20. Electronic Apparatus>

Next, an embodiment of an electronic apparatus provided with any of the above-described solid-state image pickup units is described.

Any of the above-described solid-state image pickup units may be applied to an electronic apparatus, for example, a camera system such as a digital camera and a video camera, a mobile phone having an image pickup function, or other apparatuses having an image pickup function. FIG. 24 illustrates a schematic configuration in a case where any of the solid-state image pickup units is applied to a camera capable of shooting a still image or a moving picture, as an example of the electronic apparatus.

A camera 70 in this example includes a solid-state image pickup unit 71, an optical system 72 guiding incident light to a light receiving sensor section of the solid-state image pickup unit, a shutter device 73 provided between the solid-state image pickup unit 71 and the optical system 72, and a drive circuit 74 driving the solid-state image pickup unit 71. Further, the camera 70 includes a signal processing circuit 57 processing an output signal of the solid-state image pickup unit 71.

The solid-state image pickup unit according to any of the above-described embodiments is applicable to the solid state image pickup unit 71. The optical system (an optical lens) 72 allows image light (incident light) from an object to be imaged on an imaging surface (not illustrated) of the solid-state image pickup unit 71. As a result, signal charges are accumulated in the solid state image pickup unit 71 for a certain period. Note that the optical system 72 may be configured of an optical lens group including a plurality of optical lenses. Further, the shutter device 73 controls a light irradiation period and a light shielding period of the incident light to the solid-state image pickup unit 71.

The drive circuit 74 supplies drive signals to the solid-state image pickup unit 71 and the shutter device 73. Further, the drive circuit 74 uses the supplied drive signals to control signal output operation of the solid-state image pickup unit to the signal processing circuit 75 and to control shutter operation of the shutter device 73. In other words, in this example, signal transfer operation from the solid-state image pickup unit 71 to the signal processing circuit 75 is performed with use of the drive signal (a timing signal) supplied from the drive circuit 74.

The signal processing circuit 75 performs various kinds of signal processing on the signal transferred from the solid-state image pickup unit 71. Then, the signal (a picture signal) subjected to the various kinds of signal processing is stored in a storage medium (not illustrated) such as a memory or output to a monitor (not illustrated).

As for the solid-state image pickup units according to the above-described respective embodiments, a case where any of the solid-state image pickup units is applied to an image sensor in which unit pixels detecting signal charges according to a light amount of visible light as a physical amount are arranged in a matrix has been described as an example. However, the above-described solid state image pickup units are not limited to application of the image sensor, and may be applied to solid-state image pickup units of column system in which column circuits are arranged for each pixel column of a pixel array section.

Further, any of the above-described solid-state image pickup units is not limited to application of the solid-state image pickup unit that detects distribution of incident light amount of visible light and picks up an image, and may be applied to a solid-state image pickup unit that picks up distribution of incident amount of infrared rays, X-rays, particles, or the like, as an image. Moreover, any of the solid-state image pickup units may be applied to general solid-state image pickup units (a physical quantity distribution detector) that detect and pick up, as an image, distribution of other physical quantities such as pressure and electrostatic capacitance, for example, a fingerprint detecting sensor, as a broad sense.

Further, any of the above-described image pickup units is not limited to a solid-state image pickup unit that sequentially scans unit pixels in a pixel array section on a row basis and reads out a pixel signal from the unit pixels. For example, any of the above-described solid-state image pickup units may be applied to an X-Y address type solid-state image pickup unit that selects arbitrary pixels by pixel unit to read out signals from the selected pixel by pixel unit.

Incidentally, the solid-state image pickup unit may be formed as one chip, or may be formed as a module that is configured by packaging an image pickup section, a signal processing section or an optical system, and has an image pickup function.

Note that, in the above-described respective embodiments, description is given with use of the CIGSSe as the p-type compound semiconductor of chalcopyrite structure; however, the above-described solid-state image pickup units may be configured with use of other materials. For example, $CuAlS_2$, $CuAlSe_2$, $CuAlTe_2$, $CuGaS_2$, $CuGaSe_2$, $CuGaTe_2$, $CuInS_2$, $CuInSe_2$, $CuInTe_2$, $AgAlS_2$, $AgAlSe_2$, $AgAlTe_2$, $AgGaS_2$, $AgGaSe_2$, $AgGaTe_2$, $AgInS_2$, $AgInSe_2$, $AgInTe_2$, or the like may be applied to the p-type compound semiconductor of the chalcopyrite structure in any of the above-described solid-state image pickup units.

Note that the present disclosure may be configured as follows.

(1) A solid-state image pickup unit including:
a p-type compound semiconductor layer of a chalcopyrite structure;
an electrode formed on the p-type compound semiconductor layer; and
an n-type layer formed separately for each pixel, on a surface opposite to a light incident side of the p-type compound semiconductor layer.

(2) The solid-state image pickup unit according to (1), wherein the electrode is formed on a light incident surface side of the p-type compound semiconductor layer.

(3) The solid-state image pickup unit according to (1) or (2), wherein the electrode is formed of a metal that is ohmically contacted with the p-type compound semiconductor layer.

(4) The solid-state image pickup unit according to any one of (1) to (3), wherein the electrode is formed only in a pixel separation region of the n-type layer.

(5) The solid-state image pickup unit according to any one of (1) to (4), wherein a pixel separation section of the n-type layer is provided with a p-type layer.

(6) The solid-state image pickup unit according to any one of (1) to (5), wherein the n-type layer configures a source and a drain of a MOS transistor formed on a semiconductor substrate.

(7) The solid-state image pickup unit according to any one of (1), (2), (5), and (6), further including:
an insulating layer formed on the p-type compound semiconductor layer; and
a translucent electrode formed on the insulating layer.

(8) The solid-state image pickup unit according to claim 1, wherein the electrode is formed of a metallic film and a translucent electrode, the metallic film being formed on a light incident surface of the p-type compound semiconductor layer, and the translucent electrode being formed on the metallic film.

(9) A method of manufacturing a solid-state image pickup unit, the method including:
forming an n-type layer separated for each pixel;
forming a p-type compound semiconductor layer of a chalcopyrite structure on the n-type layer; and
forming an electrode on the p-type compound semiconductor layer.

(10) The method of manufacturing the solid-state image pickup unit according to (9), further including
forming a wiring layer on a semiconductor substrate, wherein
the n-type layer is formed on the wiring layer.

(11) The method of manufacturing the solid-state image pickup unit according to (9), further including
preparing a semiconductor substrate provided with an n-channel MOS transistor, wherein
the p-type compound semiconductor layer is formed on the n-type layer of the MOS transistor.

(12) An electronic apparatus provided with the solid-state image pickup unit according to any one of (1) to (8) and a signal processing circuit processing a signal output from the solid-state image pickup unit.

This application is based upon and claims the benefit of priority of the Japanese Patent Application No. 2012-011404 filed in the Japan Patent Office on Jan. 23, 2012, the entire contents of this application are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A solid-state image pickup unit, comprising:
a p-type compound semiconductor layer of a chalcopyrite structure;
an electrode on the p-type compound semiconductor layer; and
an n-type layer separated for each pixel,
wherein the n-type layer is on a surface of the p-type compound semiconductor layer opposite to a light incident surface side of the p-type compound semiconductor layer,
wherein the electrode is only on a portion of the p-type compound semiconductor layer, the portion corresponds to a pixel separation region of the n-type layer, and
wherein the p-type compound semiconductor layer is in between the n-type layer and the electrode.

2. The solid-state image pickup unit according to claim 1, wherein the electrode is on the light incident surface side of the p-type compound semiconductor layer.

3. The solid-state image pickup unit according to claim 1, wherein the electrode is of a metal that is ohmically contacted with the p-type compound semiconductor layer.

4. The solid-state image pickup unit according to claim 2, wherein a pixel separation section of the n-type layer is provided with a p-type layer.

5. The solid-state image pickup unit according to claim 1, wherein the n-type layer configures a source and a drain of a MOS transistor on a semiconductor substrate.

6. The solid-state image pickup unit according to claim 1, further comprising:
an insulating layer on the p-type compound semiconductor layer; and
a translucent electrode on the insulating layer.

7. The solid-state image pickup unit according to claim 1, wherein the electrode is of a metallic film and a translucent electrode, the metallic film is on the light incident surface side of the p-type compound semiconductor layer, and the translucent electrode is on the metallic film.

8. A method of manufacturing a solid-state image pickup unit, comprising:
forming an n-type layer separated for each pixel;
forming a p-type compound semiconductor layer of a chalcopyrite structure on the n-type layer; and
forming an electrode on the p-type compound semiconductor layer,
wherein the n-type layer is formed on a surface of the p-type compound semiconductor layer opposite to a light incident side of the p-type compound semiconductor layer,
wherein the electrode is formed only on a portion of the p-type compound semiconductor layer, the portion corresponds to a pixel separation region of the n-type layer, and
wherein the p-type compound semiconductor layer is in between the n-type layer and the electrode.

9. The method of manufacturing the solid-state image pickup unit according to claim 8, further comprising
forming a wiring layer on a semiconductor substrate,
wherein the n-type layer is formed on the wiring layer.

10. The method of manufacturing the solid-state image pickup unit according to claim 8, further comprising
preparing a semiconductor substrate provided with an n-channel MOS transistor,
wherein the p-type compound semiconductor layer is formed on the n-type layer of the n-channel MOS transistor.

11. An electronic apparatus, comprising:
a solid-state image pickup unit; and
a signal processing circuit configured to process a signal output from the solid-state image pickup unit,
wherein the solid-state image pickup unit comprises:
a p-type compound semiconductor layer of a chalcopyrite structure;
an electrode on the p-type compound semiconductor layer; and
an n-type layer separated for each pixel, wherein the n-type layer is on a surface of the p-type compound semiconductor layer opposite to a light incident side of the p-type compound semiconductor layer,
wherein the electrode is only on a portion of the p-type compound semiconductor layer, the portion corresponds to a pixel separation region of the n-type layer, and
wherein the p-type compound semiconductor layer is in between the n-type layer and the electrode.

* * * * *